(12) United States Patent
Arakawa

(10) Patent No.: US 11,997,863 B2
(45) Date of Patent: May 28, 2024

(54) DISPLAY DEVICE, METHOD FOR MANUFACTURING DISPLAY DEVICE, AND ELECTRONIC DEVICE

(71) Applicant: Sony Semiconductor Solutions Corporation, Kanagawa (JP)

(72) Inventor: Shinichi Arakawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 145 days.

(21) Appl. No.: 17/285,754

(22) PCT Filed: Nov. 6, 2019

(86) PCT No.: PCT/JP2019/043462
§ 371 (c)(1),
(2) Date: Apr. 15, 2021

(87) PCT Pub. No.: WO2020/105433
PCT Pub. Date: May 28, 2020

(65) Prior Publication Data
US 2022/0006040 A1  Jan. 6, 2022

(30) Foreign Application Priority Data

Nov. 20, 2018 (JP) ................................. 2018-217335

(51) Int. Cl.
*H10K 50/818* (2023.01)
*H10K 50/828* (2023.01)
(Continued)

(52) U.S. Cl.
CPC ......... *H10K 50/818* (2023.02); *H10K 50/828* (2023.02); *H10K 50/856* (2023.02); *H10K 71/00* (2023.02)

(58) Field of Classification Search
CPC ......... H01L 21/76852; H01L 21/76843; H01L 21/7685; H01L 21/76849; H01L 51/5218;
(Continued)

(56) References Cited

U.S. PATENT DOCUMENTS 5,170,243 A * 12/1992 Dhong ................... H10B 12/37
257/E27.092
6,188,114 B1 * 2/2001 Gardner ............ H01L 29/41775
257/408
(Continued)

FOREIGN PATENT DOCUMENTS

JP   2004-265853 A   9/2004
JP   2005-292420 A   10/2005
(Continued)

OTHER PUBLICATIONS

International Search Report (PCT/ISA/210), International Application No. PCT/JP2019/043462, dated Dec. 6, 2019.
(Continued)

*Primary Examiner* — Sophia T Nguyen
(74) *Attorney, Agent, or Firm* — Michael Best & Friedrich LLP

(57) ABSTRACT

Provided is a display device in which pixels each configured by layering a first electrode, an organic layer, and a second electrode are formed in a two-dimensional matrix arrangement on a substrate; the first electrode is arranged for each pixel and includes a conductive light reflecting film formed on an insulating layer provided on the substrate, and a transparent electrode formed on the light reflecting film; vias conductive with the light reflecting films are formed in portions of the insulating layer positioned under the light reflecting films; and a voltage is applied to the first electrodes through the vias.

8 Claims, 58 Drawing Sheets

(51) Int. Cl.
*H10K 50/856* (2023.01)
*H10K 71/00* (2023.01)

(58) Field of Classification Search
CPC ............. H01L 51/5271; H01L 51/5212; H01L 27/3248; H01L 27/3276; H01L 27/3244; H10K 59/123; H10K 59/131; H10K 59/1315; H10K 59/12; H10K 59/121; H10K 59/878; H10K 59/80518; H10K 59/80516; H10K 50/818; H10K 50/856; H10K 50/814

See application file for complete search history.

(56) References Cited

U.S. PATENT DOCUMENTS

| | | | | |
|---|---|---|---|---|
| 6,246,120 B1 * | 6/2001 | Brennan | H01L 21/31116 | 257/E21.252 |
| 6,531,713 B1 * | 3/2003 | Yamazaki | H01L 29/66757 | 257/E29.279 |
| 6,617,689 B1 * | 9/2003 | Honeycutt | H01L 21/7685 | 257/E21.589 |
| 6,815,337 B1 * | 11/2004 | Hsiao | H01L 21/76897 | 257/E21.507 |
| 6,960,529 B1 * | 11/2005 | Nelson | H01L 21/76852 | 438/743 |
| 7,166,959 B2 * | 1/2007 | Suzuki | H10K 50/852 | 313/506 |
| 9,960,388 B2 * | 5/2018 | Sasaki | H01L 51/5218 | |
| 9,978,824 B2 * | 5/2018 | Park | H10K 59/131 | |
| 10,033,016 B2 * | 7/2018 | Seo | H10K 50/82 | |
| 10,109,683 B2 * | 10/2018 | Seo | H10K 50/852 | |
| 10,170,525 B2 * | 1/2019 | Lee | H10K 50/844 | |
| 10,454,239 B2 * | 10/2019 | Leobandung | H01S 5/021 | |
| 10,566,377 B2 * | 2/2020 | Wang | H01L 27/14621 | |
| 10,916,589 B2 * | 2/2021 | Bang | G02F 1/133526 | |
| 11,309,512 B2 * | 4/2022 | Tanaka | H05B 33/28 | |
| 11,502,147 B2 * | 11/2022 | Shin | H10K 50/858 | |
| 2001/0011868 A1 * | 8/2001 | Fukunaga | H10K 59/12 | 313/506 |
| 2001/0043046 A1 * | 11/2001 | Fukunaga | H10K 50/81 | 315/169.3 |
| 2003/0038371 A1 * | 2/2003 | Hsue | H01L 23/5226 | 257/E21.507 |
| 2003/0156239 A1 * | 8/2003 | Inoue | H01L 27/3244 | 349/113 |
| 2003/0157788 A1 * | 8/2003 | Honeycutt | H01L 21/76852 | 257/E21.589 |
| 2004/0004287 A1 * | 1/2004 | Shimizu | H01L 23/5329 | 257/E23.161 |
| 2004/0048460 A1 * | 3/2004 | Asahina | H01L 23/53223 | 257/E21.585 |
| 2004/0132293 A1 * | 7/2004 | Takayama | H01L 21/02691 | 438/689 |
| 2004/0178725 A1 * | 9/2004 | Karasawa | H10K 50/865 | 313/506 |
| 2004/0239238 A1 * | 12/2004 | Lee | H10K 59/124 | 313/506 |
| 2005/0001546 A1 * | 1/2005 | Yamaguchi | H10K 50/85 | 313/506 |
| 2005/0020059 A1 * | 1/2005 | Chen | H01L 21/76852 | 438/648 |
| 2005/0156515 A1 * | 7/2005 | Fukase | H01L 27/326 | 313/504 |
| 2005/0212412 A1 * | 9/2005 | Kurosawa | H10K 50/818 | 313/504 |
| 2005/0218794 A1 * | 10/2005 | Seo | H10K 50/856 | 257/E29.147 |
| 2005/0230684 A1 * | 10/2005 | Seo | H10K 50/818 | 257/83 |
| 2005/0264183 A1 * | 12/2005 | Seo | H10K 59/128 | 313/504 |
| 2006/0038488 A1 * | 2/2006 | Fukunaga | H01L 27/15 | 257/E29.291 |
| 2006/0066229 A1 * | 3/2006 | Nimura | H10K 59/128 | 313/506 |
| 2007/0052352 A1 * | 3/2007 | Im | H10K 59/805 | 313/506 |
| 2007/0111369 A1 * | 5/2007 | Chun | H10K 59/122 | 438/42 |
| 2007/0114526 A1 * | 5/2007 | Yokoyama | H10K 50/824 | 257/40 |
| 2007/0126966 A1 | 6/2007 | Takahashi | | |
| 2008/0036366 A1 * | 2/2008 | Yaegashi | H05B 33/28 | 445/35 |
| 2008/0142864 A1 * | 6/2008 | Takahashi | H10B 53/00 | 257/E29.345 |
| 2008/0180024 A1 * | 7/2008 | Kwon | H10K 59/12 | 445/24 |
| 2008/0218058 A1 * | 9/2008 | Son | H10K 50/818 | 313/500 |
| 2008/0258609 A1 * | 10/2008 | Nakamura | H10K 50/852 | 445/24 |
| 2008/0284326 A1 * | 11/2008 | Choi | H10K 50/818 | 313/504 |
| 2008/0309233 A1 * | 12/2008 | Hasegawa | H01L 27/3248 | 313/505 |
| 2009/0078945 A1 * | 3/2009 | Koo | H10K 50/16 | 257/89 |
| 2009/0159906 A1 * | 6/2009 | Ishiguro | H10K 50/856 | 257/E33.072 |
| 2010/0230688 A1 * | 9/2010 | Mitsuya | H10K 50/125 | 257/89 |
| 2011/0215330 A1 * | 9/2011 | Shin | H10K 50/818 | 257/59 |
| 2011/0241000 A1 * | 10/2011 | Choi | H10K 50/818 | 257/59 |
| 2011/0248272 A1 | 10/2011 | Ochi et al. | | |
| 2011/0275214 A1 * | 11/2011 | Ryan | H01L 21/76886 | 438/643 |
| 2012/0241725 A1 * | 9/2012 | Sawabe | H10K 50/131 | 257/40 |
| 2014/0093983 A1 * | 4/2014 | Cronin | H10B 61/22 | 438/3 |
| 2014/0239272 A1 * | 8/2014 | Kim | H10K 50/818 | 257/40 |
| 2014/0284575 A1 * | 9/2014 | Sugisawa | H10K 59/122 | 257/40 |
| 2014/0284576 A1 * | 9/2014 | Sugisawa | H10K 50/852 | 257/40 |
| 2016/0087023 A1 | 3/2016 | Maeda | | |
| 2016/0190508 A1 * | 6/2016 | Nakamura | H10K 50/824 | 257/40 |
| 2016/0197304 A1 * | 7/2016 | Kang | H10K 59/123 | 438/23 |
| 2016/0211480 A1 * | 7/2016 | Hanari | H10K 59/131 | |
| 2017/0025482 A1 * | 1/2017 | Choi | H10K 59/122 | |
| 2017/0125739 A1 * | 5/2017 | Sasaki | H01L 27/32 | |
| 2017/0229676 A1 * | 8/2017 | Shiratori | H10K 59/35 | |
| 2017/0263895 A1 * | 9/2017 | Lee | H10K 59/35 | |
| 2017/0317149 A1 * | 11/2017 | Seo | H10K 59/828 | |
| 2018/0053917 A1 * | 2/2018 | Isaka | G02F 1/133555 | |
| 2018/0090538 A1 * | 3/2018 | Wang | H01L 27/14621 | |
| 2018/0102498 A1 * | 4/2018 | Shin | H10K 59/131 | |
| 2019/0172874 A1 * | 6/2019 | Lim | H10K 59/35 | |
| 2019/0189701 A1 * | 6/2019 | Bang | H10K 50/84 | |
| 2019/0198816 A1 * | 6/2019 | Park | H10K 59/123 | |
| 2019/0371871 A1 * | 12/2019 | He | H01L 27/1214 | |
| 2019/0386067 A1 * | 12/2019 | Wei | H10K 59/124 | |
| 2020/0020876 A1 * | 1/2020 | Shin | H10K 59/123 | |
| 2020/0066808 A1 * | 2/2020 | Mollard | H10K 50/814 | |
| 2020/0273932 A1 * | 8/2020 | Liu | H10K 59/124 | |
| 2021/0036081 A1 * | 2/2021 | Song | H10K 59/131 | |
| 2021/0104586 A1 * | 4/2021 | Baek | H10K 71/00 | |
| 2021/0104589 A1 * | 4/2021 | Shin | H10K 50/858 | |
| 2021/0193954 A1 * | 6/2021 | Shin | H10K 50/816 | |
| 2022/0069038 A1 * | 3/2022 | Choi | H10K 59/124 | |
| 2022/0209170 A1 * | 6/2022 | Kang | H10K 71/00 | |
| 2022/0336778 A1 * | 10/2022 | Kim | H01L 51/56 | |
| 2022/0384547 A1 * | 12/2022 | Lee | H04M 1/0266 | |

(56) References Cited

U.S. PATENT DOCUMENTS

| | | | | |
|---|---|---|---|---|
| 2023/0157050 A1* | 5/2023 | Kaneko | ................ | H10K 50/818 |
| | | | | 257/40 |
| 2023/0157126 A1* | 5/2023 | Jinta | ........................ | G09F 9/00 |
| | | | | 257/40 |
| 2023/0161170 A1* | 5/2023 | Ye | ........................ | G02B 5/3058 |
| | | | | 359/485.05 |
| 2023/0309359 A1* | 9/2023 | Ohchi | .................. | H10K 50/816 |

FOREIGN PATENT DOCUMENTS

| JP | 2007-317606 A | 12/2007 |
|---|---|---|
| JP | 2010-135300 A | 6/2010 |
| JP | 2010198754 A | 9/2010 |
| JP | 2013-127884 A | 6/2013 |
| JP | 2016-62874 A | 4/2016 |

OTHER PUBLICATIONS

Notification of Transmittal of the International Search Report and the Written Opinion of the International Searching Authority, or the Declaration (PCT/ISA/220), International Application No. PCT/JP2019/043462, dated Dec. 17, 2019.

Written Opinion of the International Search Authority (PCT/ISA/237), International Application No. PCT/JP2019/043462, dated Dec. 17, 2019.

\* cited by examiner

Fig. 4
A
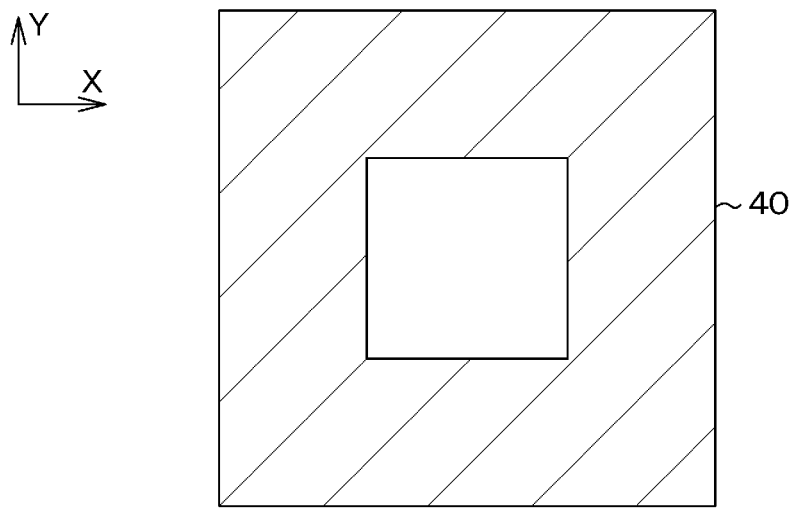
B
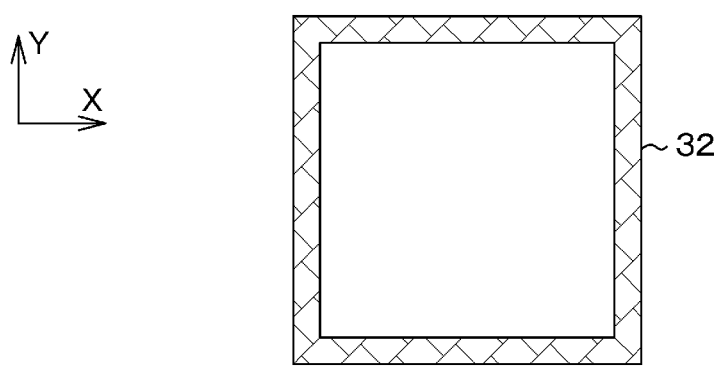
C
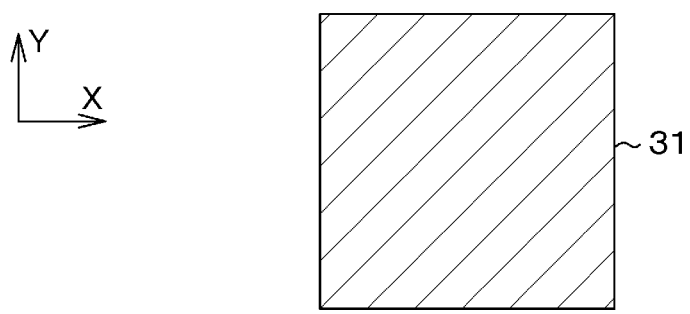

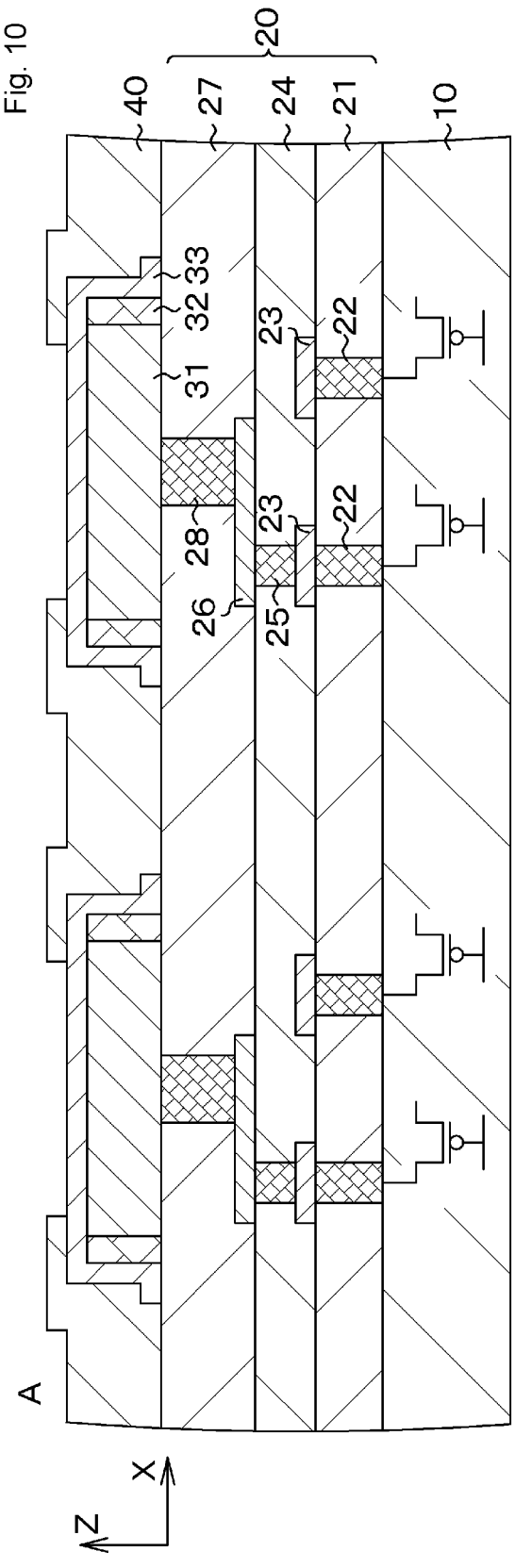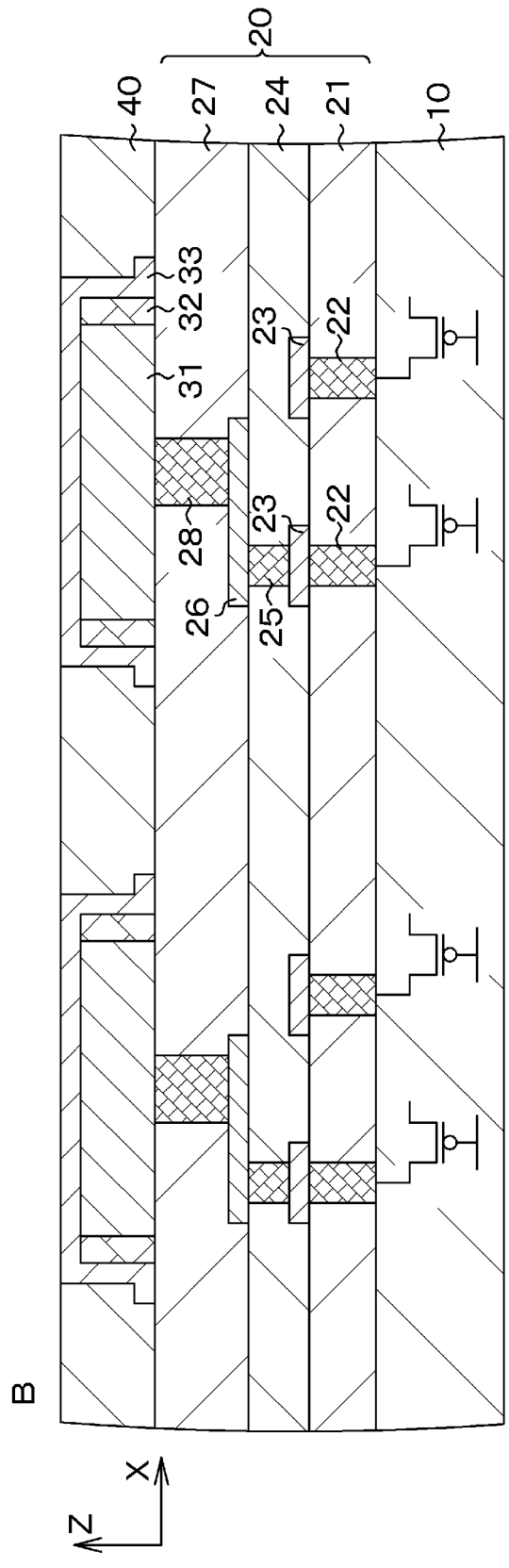
Fig. 10

Fig. 40
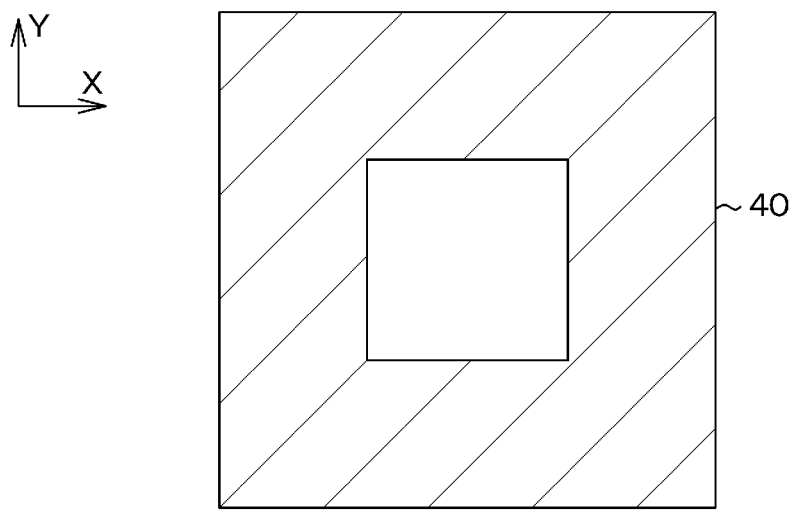
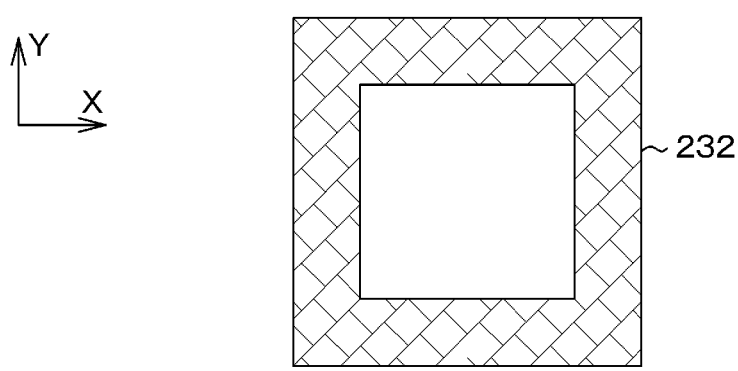
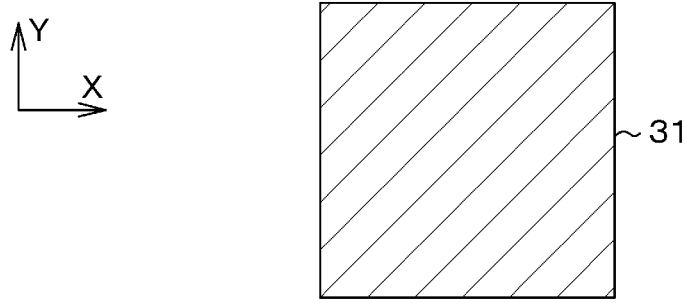

Fig. 43
A
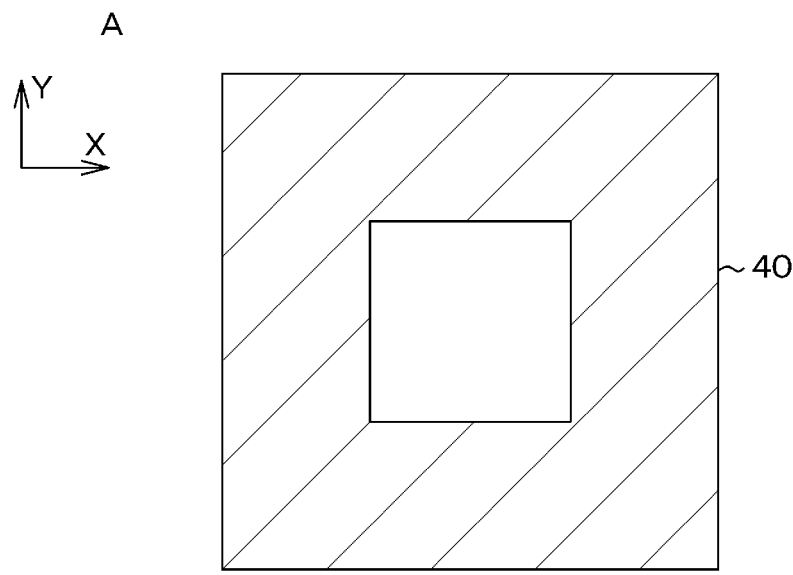
B
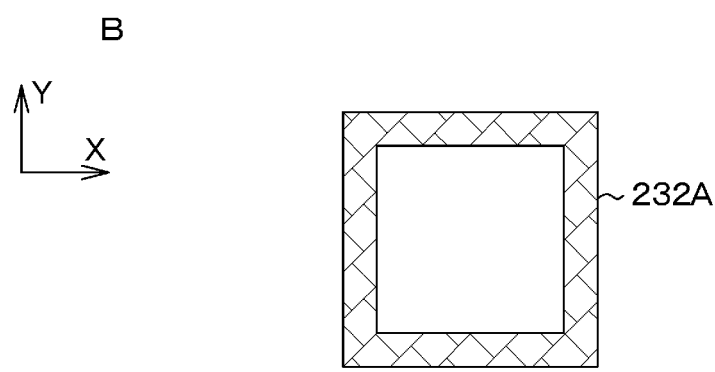
C
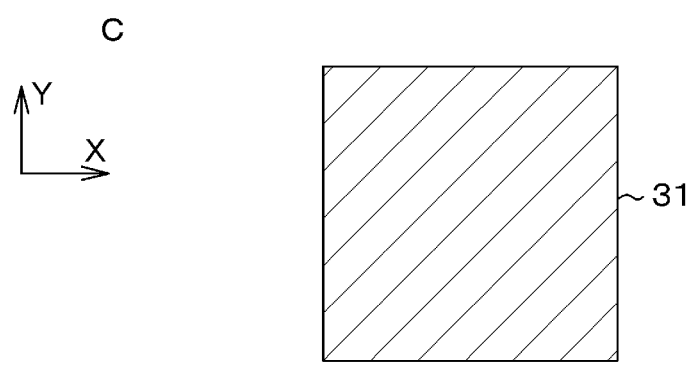

Fig. 44
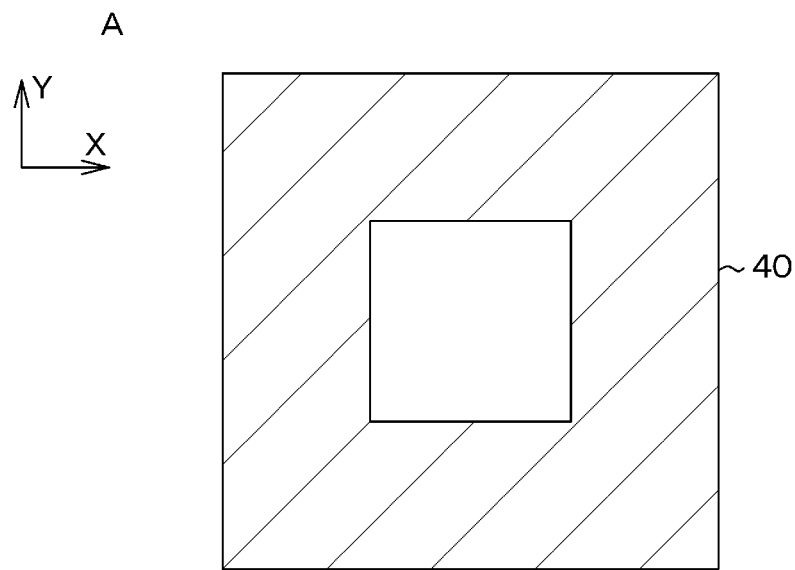
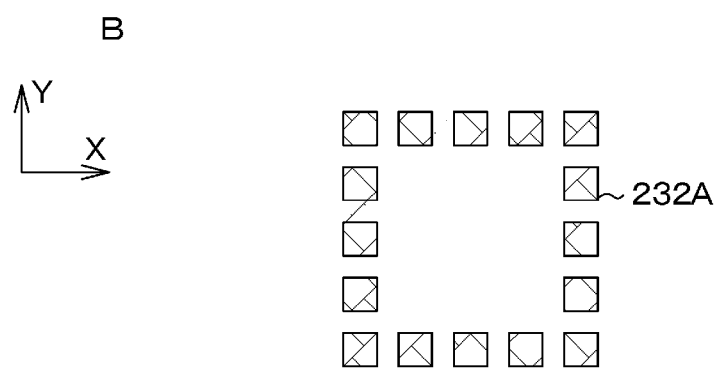
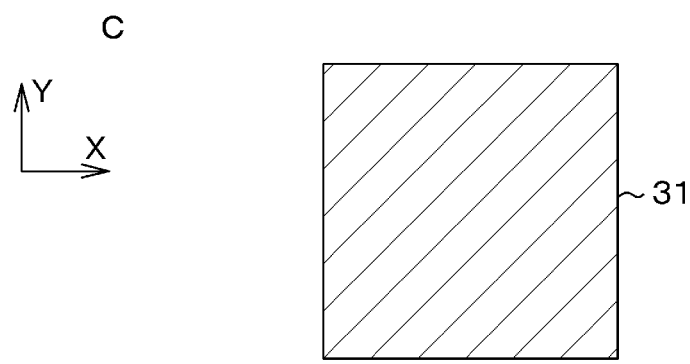

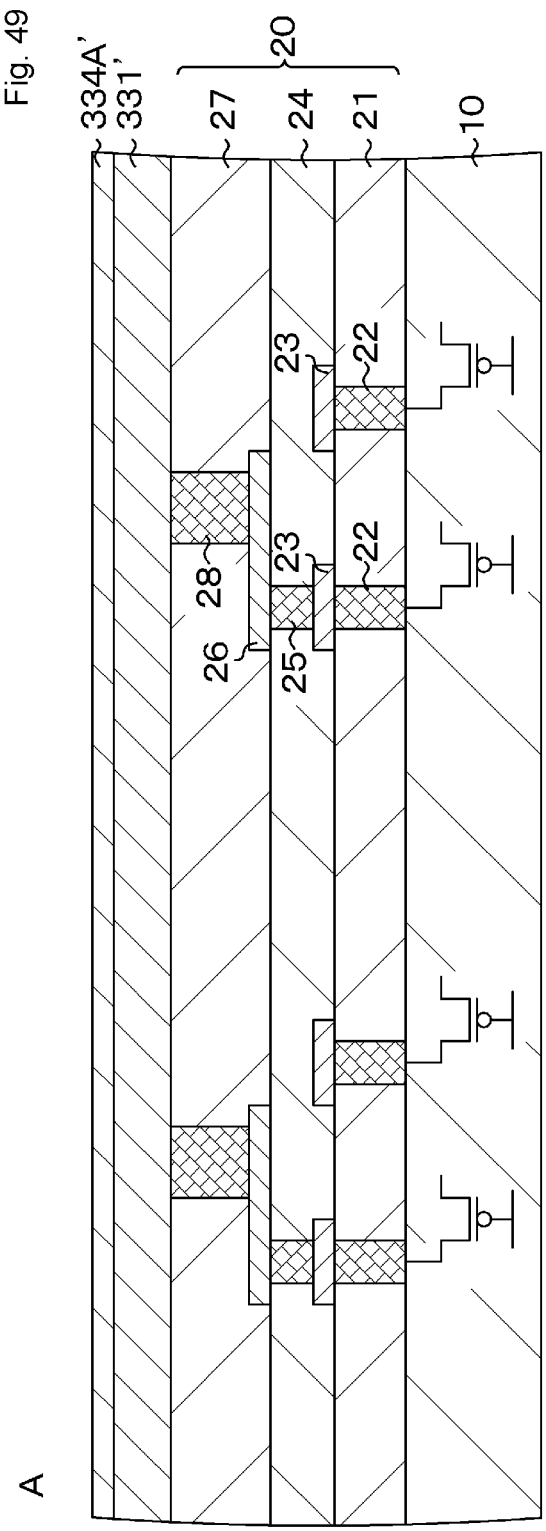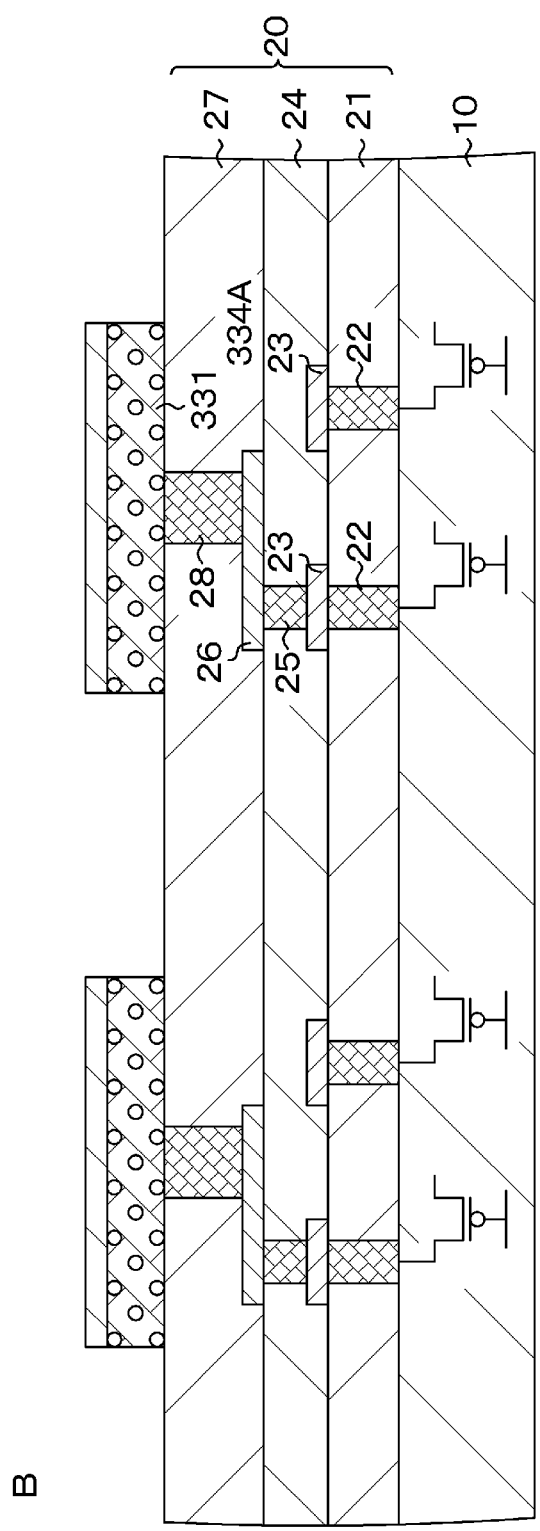
Fig. 49

Fig.56
A
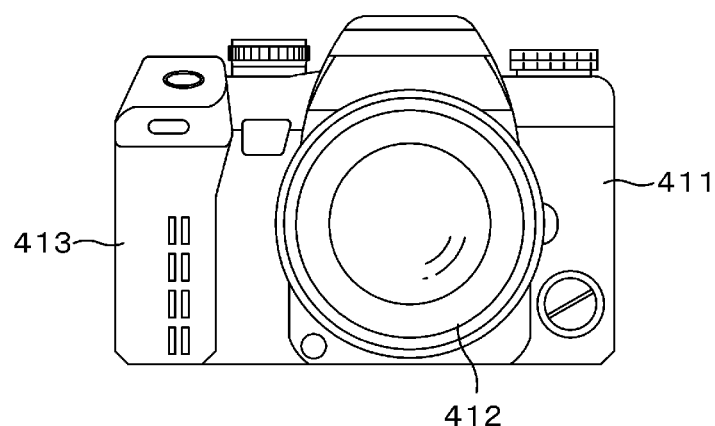
B
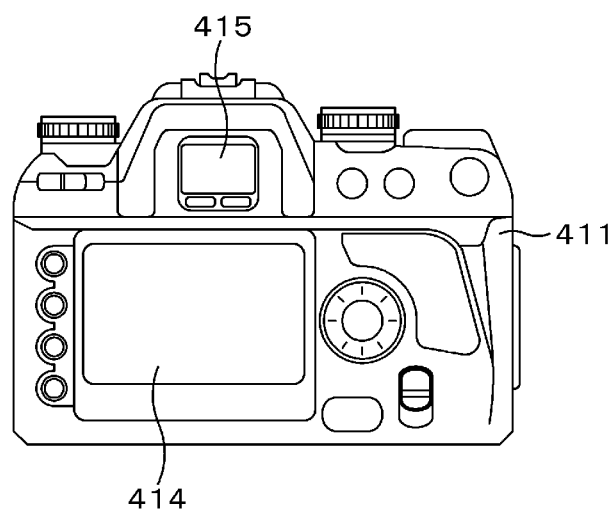

DISPLAY DEVICE, METHOD FOR MANUFACTURING DISPLAY DEVICE, AND ELECTRONIC DEVICE

TECHNICAL FIELD

The present disclosure relates to a display device, a method for manufacturing a display device, and an electronic device.

BACKGROUND ART

A display element using organic electroluminescence and a display device including pixels composed of such a display element are well known. Such a display device is attracting attention as a display device capable of high-brightness light emission by low-voltage direct current drive.

The display device using organic electroluminescence is a self-luminous type, and further has sufficient responsiveness to a high-definition high-speed video signal. Display devices for wearing on eyewear such as eyeglasses and goggles are also required to have a pixel size of, for example, several micrometers to 10 micrometers.

A display element using organic electroluminescence is usually composed of an organic layer including a light emitting layer and a first electrode and a second electrode arranged so as to sandwich the organic layer. For example, the first electrode is an anode electrode for injecting holes into the organic layer, and the second electrode is a cathode electrode for injecting electrons into the organic layer. In the case of the so-called top emission type in which the light generated in the organic layer is emitted to the cathode electrode side, the first electrode is configured to have light reflectivity.

In the case of a common cathode structure, the first electrode is provided so as to correspond to each pixel of the display device and is connected to a wiring to which a signal voltage is supplied. For example, PTL 1 indicates that an anode electrode and a wiring are connected in a region different from that of the anode electrode.

CITATION LIST

Patent Literature

[PTL 1]

SUMMARY

Technical Problem

When a first electrode and a wiring are connected in a region different from that of the first electrode, a pixel pitch inevitably increases. In addition, since the proportion occupied by a light emitting region in a pixel is also relatively low, there is a problem that it is difficult to meet the demands for further miniaturization of the pixel and increase in brightness.

Therefore, an object of the present disclosure is to provide a display device in which the first electrode and the wiring can be connected without expanding the pixel pitch, and it is possible to meet the demands such as further miniaturization of the pixel and increase in brightness, and also to provide a method for manufacturing such a display device, and an electronic device provided with the display device.

Solution to Problem

In order to attain the abovementioned object, in a display device according to the present disclosure, pixels each configured by layering a first electrode, an organic layer, and a second electrode are formed in a two-dimensional matrix arrangement on a substrate; the first electrode is arranged for each pixel and includes a conductive light reflecting film formed on an insulating layer provided on the substrate, and a transparent electrode formed on the light reflecting film; vias conductive with the light reflecting films are formed in portions of the insulating layer positioned under the light reflecting films; and
a voltage is applied to the first electrodes through the vias.

In order to attain the abovementioned object, a method according to the present disclosure is for manufacturing a display device in which pixels each configured by layering a first electrode, an organic layer, and a second electrode are formed in a two-dimensional matrix arrangement on a substrate; the first electrode is arranged for each pixel and includes a conductive light reflecting film formed on an insulating layer provided on the substrate, and a transparent electrode formed on the light reflecting film,
the method comprising:
a step of forming vias in portions of the insulating layer where the pixels are to be arranged;
a step of forming the conductive light reflecting films on the insulating layer including the vias; and
a step of forming the transparent electrodes on the light reflecting films.

In order to attain the abovementioned object, an electronic device according to the present disclosure comprises a display device in which pixels each configured by layering a first electrode, an organic layer, and a second electrode are formed in a two-dimensional matrix arrangement on a substrate; the first electrode is arranged for each pixel and includes a conductive light reflecting film formed on an insulating layer provided on the substrate, and a transparent electrode formed on the light reflecting film; vias conductive with the light reflecting films are formed in portions of the insulating layer positioned under the light reflecting films; and
a voltage is applied to the first electrodes through the vias.

BRIEF DESCRIPTION OF DRAWINGS

FIGS. 4A, 4B, and 4C are schematic plan views for explaining the arrangement relationship of a partition wall portion arranged between adjacent first electrodes, a light reflecting film included in the first electrode, and a conductive portion.

FIGS. 10A and 10B are schematic partial end views for explaining a method for manufacturing the display device according to the first embodiment, following FIG. 9B.

FIGS. 40A, 40B, and 40C are schematic plan views for explaining the arrangement relationship of a partition wall portion arranged between adjacent first electrodes, a light reflecting film included in the first electrode, and a conductive portion.

FIGS. 43A, 43B, and 43C are schematic plan views for explaining the arrangement relationship of a partition wall portion arranged between adjacent first electrodes, a light reflecting film included in the first electrode, and a conductive portion.

FIGS. 44A, 44B, and 44C are schematic plan views for explaining the arrangement relationship of a partition wall portion arranged between adjacent first electrodes, a light reflecting film included in the first electrode, and a conductive portion.

FIGS. 49A and 49B are schematic partial end views for explaining a method for manufacturing the display device according to the first modification example of the third embodiment.

FIG. 56 is an external view of an interchangeable lens type single-lens reflex type digital still camera, FIG. 56A shows a front view thereof, and FIG. 56B shows a rear view thereof.

DESCRIPTION OF EMBODIMENTS

Figure 1:
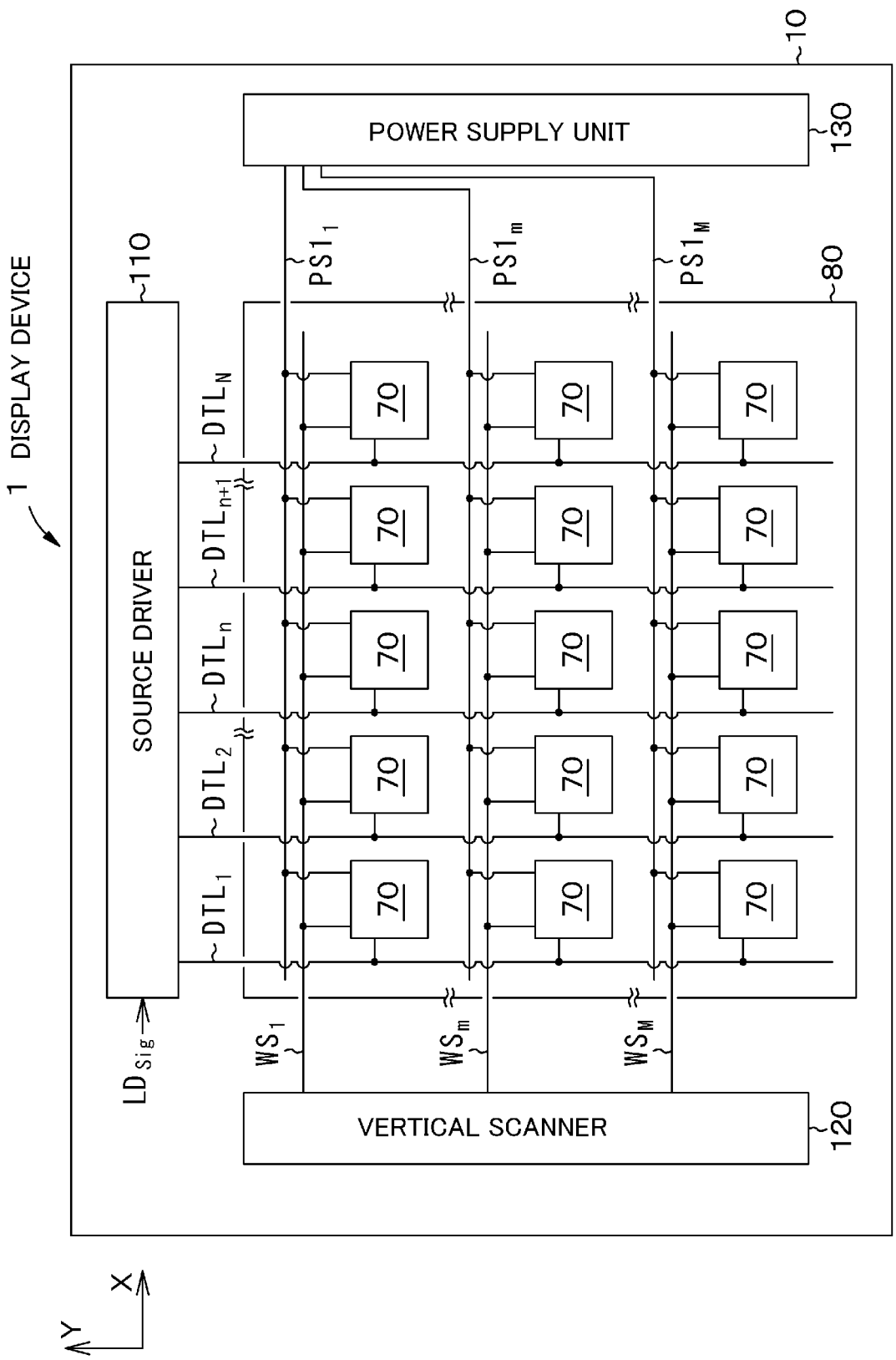
FIG. 1 is a conceptual diagram of a display device according to the first embodiment.

Hereinafter, the present disclosure will be described based on embodiments with reference to the figures. The present disclosure is not limited to the embodiments, and various numerical values and materials in the embodiments are exemplary. In the following description, the same reference numerals will be used for the same elements or elements having the same function, and duplicate description will be omitted. The explanation will be given in the following order.
1. Description of Display Device, Method for Manufacturing Display Device, Electronic Device and General Information Related to Present Disclosure
2. First Embodiment
3. Second Embodiment
4. Third Embodiment
5. Explanation of Electronic Device and Others
Description of Display Device, Method for Manufacturing Display Device, Electronic Device and General Information Related to Present Disclosure In the display device according to the present disclosure, the display device obtained by the method for manufacturing a display device of the present disclosure, and the display device used in the electronic device according to the present disclosure (hereinafter, these may be simply referred to as the display device according to the present disclosure), as described above, pixels each configured by layering a first electrode, an organic layer, and a second electrode are formed in a two-dimensional matrix arrangement on a substrate; the first electrode is arranged for each pixel and includes a conductive light reflecting film formed on an insulating layer provided on the substrate, and a transparent electrode formed on the light reflecting film; vias conductive with the light reflecting films are formed in portions of the insulating layer positioned under the light reflecting films; and a voltage is applied to the first electrodes through the vias.

The display device according to the present disclosure can be configured to be provided with a conductive portion that is conductive with the transparent electrode on the side wall surface side of the light reflecting film. In this case, a configuration is possible in which the conductive portion is provided so as to cover at least a part of the side wall surface of the light reflecting film. For example, a configuration is possible in which the conductive portion is formed so as to cover the entire circumference or a part of the side wall surface, and a form is possible in which the conductive portion is configured at a height that is the same as or lower than the height of the side wall surface along the thickness direction of the light reflecting film.

Alternatively, in the display device according to the present disclosure including the preferable configurations described above, a configuration is possible in which the conductive portion is composed of a conductive material provided between the light reflecting film and the insulating layer. In this case, it is preferable that the planar shape on the outer periphery of the conductive portion be the same as or include the planar shape of the outer periphery of the light reflecting film.

In the display device according to the present disclosure including various preferable configurations described above, a configuration is possible in which the transparent electrode is formed on the insulating film provided on the light reflecting film. Although it depends on the type of conductive material that constitutes the light reflecting film, the surface of the insulating film is usually excellent in flatness with respect to the surface of the conductive material. Therefore, the unevenness can be reduced also on the surface of the transparent electrode, and as a result, the transmittance can be improved.

Alternatively, in the display device according to the present disclosure, a configuration is possible in which the conductive portion that is conductive with the transparent electrode is provided on the upper surface of the light reflecting film located on the transparent electrode side.

In this case, a configuration is possible in which a partition wall portion is formed between the adjacent first electrodes, a part of the upper surface of the transparent electrode constituting the first electrode is covered with the partition wall portion, and the conductive portion is arranged to overlap a region where the transparent electrode is covered by the partition wall portion.

In this case, a configuration is possible in which a peripheral portion of the upper surface of the transparent electrode is annularly covered by the partition wall portion, and the conductive portion is arranged so as to surround the peripheral portion of the upper surface of the transparent electrode. The conductive portion may be formed annularly as a continuous region, or may be formed so that discrete regions are arranged annularly.

In the display device according to the present disclosure including various preferable configurations described above, a configuration is possible in which the conductive portion is composed of a conductive material different from the material constituting the light reflecting film. The light reflecting film preferably exhibits high reflectance with respect to the emission wavelength of the organic layer, and for example, aluminum (Al), aluminum-copper (AlCu), gold (Au), and silver (Ag) can be used therefor. The light reflecting layer may have a single-layer structure or a layered structure. For example, titanium (Ti), titanium nitride, or the like may be formed on the lower layer side. When the light reflecting film is configured of a conductive material such as aluminum (Al) mentioned above, the conductive portion is preferably configured of titanium, titanium nitride, or tungsten.

Alternatively, in the display device according to the present disclosure, the light reflecting film can be configured of an aluminum-based metal material doped with at least nickel, and can be exemplified by a metal material obtained by doping aluminum (Al), aluminum-copper (AlCu), aluminum-silicon (AlSi), aluminum-silicon-copper (AlSiCu), and the like with nickel (Ni). In this case, the light reflecting film can be configured of an aluminum-based metal material doped with nickel and boron. It is preferable that the light reflecting film be subjected to annealing treatment.

Aluminum itself is easily oxidized. For example, insulating aluminum oxide ($Al_2O_3$) is formed on the surface in the atmosphere. For this reason, in a configuration in which a light reflecting film made of aluminum and a transparent electrode are layered, the contact resistance between them is usually on the order of kΩ.

By contrast, for example, in the case of a light reflecting film formed from an aluminum-based metal material doped with nickel, $Al_3Ni$ is formed by heat treatment. As a result, the surface is less likely to be oxidized, so that the contact resistance can be kept low even in a configuration in which the light reflecting film and the transparent electrode are layered. The light reflecting film preferably has a thermal history of, for example, about 200° C. A configuration is possible in which the transparent electrode is formed on the insulating film provided on the light reflecting film.

In the display device according to the present disclosure including various preferable configurations described above, a mode can be used in which the first electrodes are formed on a flat insulating layer. Alternatively, a mode can be used in which the first electrodes have a damascene structure selectively embedded in the insulating layer in a predetermined pattern.

As described above, a method according to the present disclosure is for manufacturing a display device in which pixels each configured by layering a first electrode, an organic layer, and a second electrode are formed in a two-dimensional matrix arrangement on a substrate; the first electrode is arranged for each pixel and includes a conductive light reflecting film formed on an insulating layer provided on the substrate, and a transparent electrode formed on the light reflecting film, the method comprising:
a step of forming vias in portions of the insulating layer where the pixels are to be arranged;
a step of forming the conductive light reflecting films on the insulating layer including the vias; and
a step of forming the transparent electrodes on the light reflecting films.

In this case, a configuration can be used that further includes a step of providing a conductive portion that is conductive with the transparent electrode on the side wall surface side of the light reflecting film. Alternatively, a configuration can be used that further includes a step of providing a conductive portion that is conductive with the transparent electrode on the surface of the light reflecting film on the transparent electrode side. Further, a configuration can be used in which the light reflecting film is formed using an aluminum-based metal material doped with at least nickel.

In the display device according to the present disclosure, or in the method for manufacturing a display device according to the present disclosure (hereinafter, these may be simply referred to as the present disclosure), a substrate composed of a transparent material such as glass, or a substrate composed of a semiconductor material such as silicon can be used as a substrate on which pixels are to be formed. When the pixel has a drive circuit that drives an organic layer, the drive circuit can be configured by forming and processing a semiconductor material layer or the like on a glass substrate, or by forming, as appropriate, a transistor or the like in a well provided in a substrate made of a semiconductor material such as silicon.

Examples of the transparent conductive material used in the present disclosure include transparent conductive materials such as indium-tin oxide (including ITO, Indium Tin Oxide, Sn-doped $In_2O_3$, crystalline ITO and amorphous ITO), and indium-zinc oxide (IZO, Indium Zinc Oxide). In some cases, a metal film thinned to have light transmittance can be used.

Various wirings and the like to be used in the display device can be formed by, for example, a combination of a well-known film forming method such as a physical vapor deposition method (PVD method) exemplified by a vacuum deposition method and a sputtering method, and various chemical vapor deposition methods (CVD methods), and a well-known patterning method such as an etching method or a lift-off method.

The insulating layer or the like used in the display device can be formed using a well-known insulating material such as an inorganic material such as silicon oxide, silicon nitride, and silicon oxynitride, or an organic material such as a polyimide.

The display device may be configured to display a monochrome image or may be configured to display a color image. As the resolution value of the display device, some of the image resolutions such as U-XGA (1600, 1200), HD-TV (1920, 1080), Q-XGA (2048, 1536), (3840, 2160), (7680, 4320), and the like, can be exemplified, but these values are not limiting.

The organic layer can be configured of, for example, a structure in which a hole injection layer, a hole transport layer, a light emitting layer, an electron transport layer, and an electron injection layer are layered in this order. The hole transport material, the hole transport material, the electron transport material, and the organic light emitting material constituting the organic layer are not particularly limited, and well-known materials can be used.

When the display device is configured to display in color, a configuration can be used in which an organic layer that emits white light is combined with a color filter. In this configuration, the organic layer including the hole transport layer, the light emitting layer, the electron transport layer, and the like can be shared among a plurality of pixels. Therefore, it is not necessary to individually coat the organic layer for each pixel. Alternatively, a red light emitting organic layer, a green light emitting organic layer, and a blue light emitting organic layer can be individually coated according to the pixels. In this configuration, the finer the pixel pitch, the more difficult it is to coat the layers individually. Therefore, in a display device having an element pitch in the order of micrometers, a configuration is preferable in which an organic layer that emits white light and a color filter are combined.

A form can be used in which an organic layer that emits white light has a layered structure including a red light emitting layer, a green light emitting layer, and a blue light emitting layer. Alternatively, a form can be used in which the organic layer has a layered structure including a blue light emitting layer that emits blue light and a yellow light emitting layer that emits yellow light, or a layered structure that includes a blue light emitting layer that emits blue light and an orange light emitting layer that emits orange light. These layers emit white light as a whole.

Examples of the material constituting the conductive light reflecting film contained in the first electrode include aluminum (Al), aluminum-copper, an aluminum-based metal material doped with at least nickel, silver (Ag), and the like. Metallic materials can be mentioned. Further, as the material constituting the transparent electrode formed on the light reflecting film, the above-mentioned ITO, IZO and the like can be exemplified.

As the material constituting the second electrode, a conductive material is preferable so that emitted light can be transmitted and electrons can be efficiently injected into the organic layer. For example, metals and alloys such as aluminum (Al), silver (Ag), magnesium (Mg), calcium (Ca), sodium (Na), strontium (Sr), Mg—Ag alloy, Mg—Ca alloy, Al—Li alloy, and the like can be mentioned.

The source driver or the like that drives the display device may be configured to be integrated on a semiconductor substrate or the like on which pixels are arranged, or may be configured, as appropriate, as a separate body. These can be configured using well-known circuit elements. For example, a vertical scanner and a power supply unit shown in FIG. 1 can also be configured by using well-known circuit elements. In applications that require miniaturization, such as display devices for head-mounted displays and viewfinders, a configuration is preferable in which the pixels and the driver be formed on the same semiconductor substrate or the like.

Further, in addition to direct-view type and projection type display devices, various electronic devices having an image display function can be exemplified as electronic devices provided with the display device of the present disclosure.

Various conditions in the present specification are satisfied not only when they are strictly satisfied, but also when they are substantially satisfied. The existence of various designs or manufacturing variations is acceptable. In addition, each figure used in the following description is a schematic one and does not show the actual dimensions or a ratio thereof.

First Embodiment

The first embodiment relates to a display device, a method for manufacturing the display device, and an electronic device according to the present disclosure.

FIG. 1 is a conceptual diagram of a display device according to the first embodiment.

In a display device 1 according to the first embodiment, pixels 70 each configured by layering a first electrode, an organic layer, and a second electrode are formed in a two-dimensional matrix arrangement on a substrate 10. As will be described in detail hereinbelow with reference to FIG. 3, the first electrode is arranged for each pixel 70 and includes a conductive light reflecting film formed on an insulating layer provided on the substrate 10 and a transparent electrode formed on the light reflecting film. Vias that are conductive with the light reflecting films are formed in portions of the insulating layer located under the light reflecting films, and a voltage is applied to the first electrodes via the vias.

The display device 1 includes a scanning line WS and a power supply line PS1 provided for each pixel row arranged along a row direction (X direction in FIG. 1), and a data line DTL provided for each pixel column arranged along the column direction (Y direction in FIG. 1). The pixels 70 are arranged in a two-dimensional matrix of N in the row direction and M in the column direction, for a total of N×M, in a state of being connected to the scanning line WS, the power supply line PS1, and the data line DTL.

The pixels 70 arranged in a two-dimensional matrix form a pixel array section 80 that displays an image. The number of rows of pixels 70 in the pixel array section 80 is M, and the number of pixels 70 constituting each row is N.

The number of scanning lines WS and power supply lines PS1 is M, respectively. The pixels 70 of the m-th line (here, m=1, 2, . . . , M) are connected to the m-th scanning line $WS_m$ and the m-th power supply line $PS1_m$ and constitute one pixel line. Moreover, the number of data lines DTL is N. The pixels 70 of the n-th column (here, n=1, 2, . . . , N) are connected to the n-th data line $DTL_n$.

Although not shown in FIG. 1, the display device 1 includes a common power supply line that is commonly connected to all the pixels 70. For example, a ground potential is constantly supplied as a common voltage to the common power supply line.

The display device 1 further includes various circuits such as a source driver 110, a vertical scanner 120, and a power supply unit 130 for driving the pixel array section 80. In the example shown in FIG. 1, the vertical scanner 120 and the power supply unit 130 are arranged on respective end sides of the pixel array section 80, but this is only an example.

The pixel array section 80 is formed on a substrate 10 made of a semiconductor material such as silicon. The source driver 110, the vertical scanner 120, and the power supply unit 130 are also formed on the substrate 10. That is, the display device 1 is integrated with a driver circuit. In some cases, various circuits for driving the pixel array section 80 may be configured as separate bodies.

In the source driver 110, for example, a signal $LD_{Sig}$ representing gradation according to an image to be displayed is inputted from a device (not shown). The signal $LD_{Sig}$ is, for example, a low-voltage digital signal. The source driver 110 is used to generate an analog signal corresponding to the gradation value of the video signal $LD_{Sig}$ and supply the generated signal as a video signal to the data line DTL. The maximum value of the generated analog signal is approximately the same as the power supply voltage supplied to the source driver 110, and the swing width is about several volts.

The vertical scanner 120 supplies a scanning signal to the scanning line WS. With this scanning signal, the pixels 70 are sequentially scanned, for example, row by row. The power supply unit 130 will be described as continuously supplying a predetermined power supply voltage $V_{CC}$ (for example, about 10 volts) to the power supply line PS1 regardless of the scanning of the scanning line WS. In some cases, the voltage supplied to the power supply line PS1 may be switched according to scanning of the scanning line WS.

The display device 1 is, for example, a color display device in which a group composed of three pixels 70 arranged in a row direction constitutes one color pixel. Therefore, where N'=N/3, a total of N'×M color pixels (N' in the row direction and M in the column direction) are arranged in the pixel array section 80.

As described above, the pixels 70 are line-sequentially scanned row by row by the scanning signal of the vertical scanner 120. The pixel 70 located in the m-th row and the n-th column is hereinafter referred to as a (n,m)-th pixel 70.

In the display device 1, the N pixels 70 arranged in the m-th row are simultaneously driven. In other words, for the N pixels 70 arranged along the row direction, the light emission/non-emission timing is controlled for each row to which the pixels belong. Where a display frame rate of the display device 1 is expressed as FR (times/second), the scanning period per row (so-called horizontal scanning period) when the display device 1 is sequentially scanned row by row is (1/FR)×(1/M) seconds.

The outline of the display device 1 has been described hereinabove. Next, the details of the pixel 70 will be described.

Figure 2:
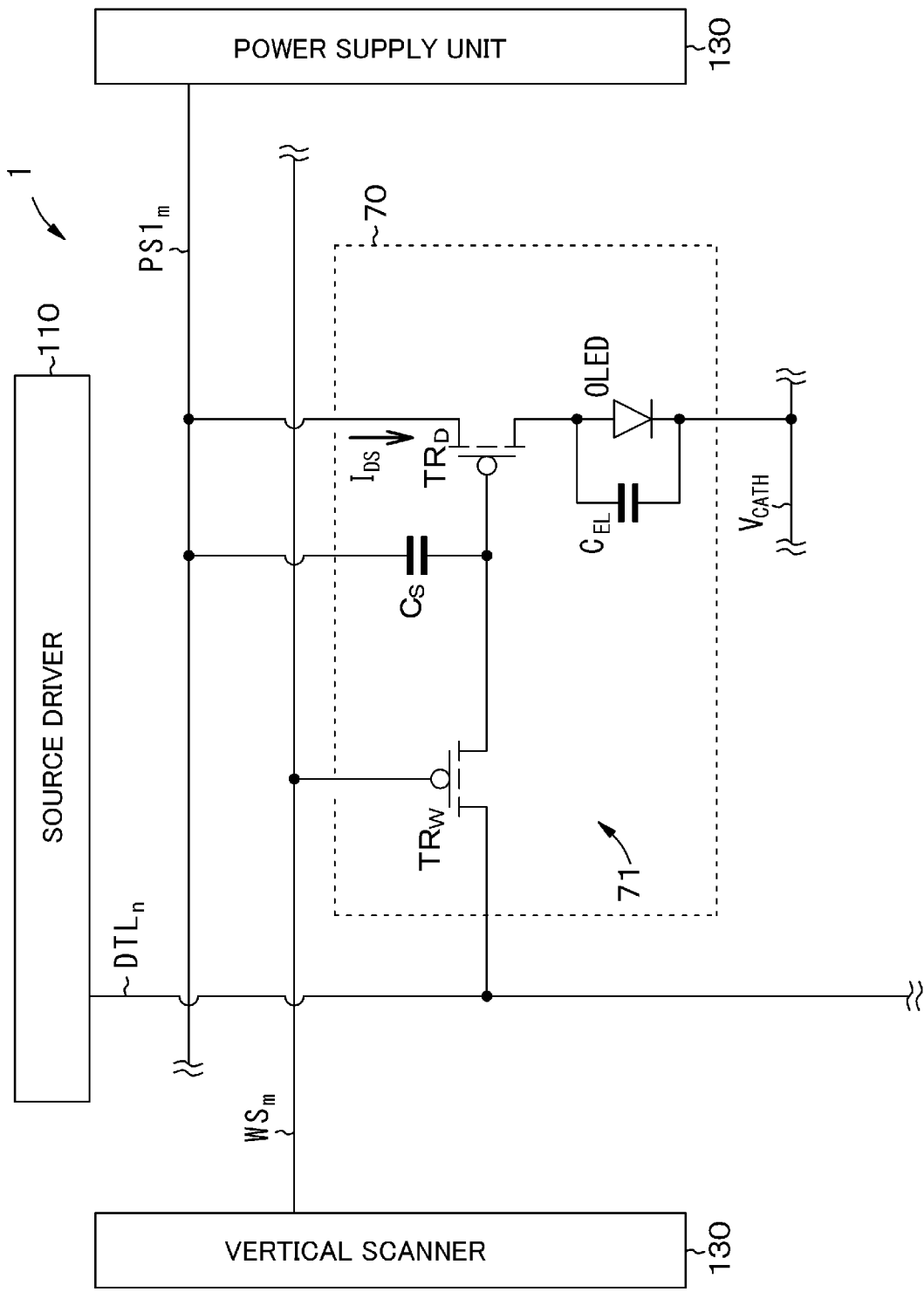
FIG. 2 is a schematic circuit diagram of pixels.

First, the circuit configuration of a pixel will be described. FIG. 2 is a schematic circuit diagram of a pixel. For convenience of illustration, FIG. 2 shows the wiring relationship for one pixel 70, more specifically, the (n,m)-th pixel 70.

As shown in FIG. 2, the pixel (display element) 70 includes a current-driven light emitting unit ELP and a drive circuit 71 for driving the light emitting unit ELP. The drive circuit 71 includes at least a write transistor $TR_W$ for writing a video signal and a drive transistor $TR_D$ for passing a current through the light emitting unit ELP. These are composed of p-channel transistors.

The drive circuit 71 further includes a capacitance unit $C_S$. The capacitance unit $C_S$ is used to hold the voltage of the gate electrode (so-called gate-source voltage) with respect to a source region of the drive transistor $TR_D$. When the pixel 70 emits light, one source/drain region of the drive transistor $TR_D$ (the side connected to the power supply line PS1 in FIG. 2) serves as a source region, and the other source/drain region serves as a drain region.

One electrode and the other electrode constituting the capacitance unit $C_S$ are connected to one source/drain region and a gate electrode of the drive transistor $TR_D$, respectively. The other source/drain region of the drive transistor $TR_D$ is connected to an anode electrode of the light emitting unit ELP.

The light emitting unit ELP is a current-driven light emitting unit with emission brightness changing according to the flowing current value, and is specifically composed of an organic electroluminescence light emitting unit. The light emitting unit ELP has well-known configuration and structure including a first electrode (anode electrode), a hole transport layer, a light emitting layer, an electron transport layer, a second electrode (cathode electrode), and the like.

The other end (specifically, the second electrode) of the light emitting unit ELP is connected to a common power supply line. A predetermined voltage $V_{CATH}$ (for example, ground potential) is supplied to the common power supply line. The capacitance of the light emitting unit ELP is represented by the symbol $C_{EL}$. Where the capacitance $C_{EL}$ of the light emitting unit ELP is small and causes a failure in driving the pixel 70, an auxiliary capacity connected in parallel to the light emitting unit ELP may be provided as necessary.

The write transistor $TR_W$ includes a gate electrode connected to the scanning line WS, one source/drain region connected to the data line DTL, and the other source/drain region connected to the gate electrode of the drive transistor $TR_D$. As a result, the signal voltage from the data line DTL is written to the capacitance unit $C_S$ via the write transistor $TR_W$.

As described above, the capacitance unit $C_S$ is connected between one source/drain region and the gate electrode of the drive transistor $TR_D$. A power supply voltage $V_{CC}$ is applied from the power supply unit 130 to one of the source/drain regions of the drive transistor $TR_D$ via the power supply line $PS1_m$. When the video signal voltage $V_{Sig}$ from the data line DTL is written to the capacitance unit $C_S$ via the write transistor $TR_W$, the capacitance unit $C_S$ maintains a voltage of $(V_{CC}-V_{Sig})$ as a gate-source voltage of the drive transistor $TR_D$. A drain current $I_{ds}$ represented by the following formula (1) flows through the drive transistor $TR_D$, and the light emitting unit ELP emits light with a brightness corresponding to the current value.

$$I_{ds}=k\cdot\mu\cdot((V_{CC}-V_{Sig})-|V_{th}|)^2 \quad (1)$$

Here,
$\mu$: Effective mobility
L: Channel length
W: Channel width
$V_{th}$: Threshold voltage
$C_{ox}$: (Relative permittivity of gate insulating layer)×(dielectric constant of vacuum)/(thickness of gate insulating layer)

$$k\equiv(\frac{1}{2})\cdot(W/L)\cdot C_{ox}.$$

The configuration of the drive circuit 71 described above is only an example. In practice, the drive circuit can have various configurations.

Figure 3:
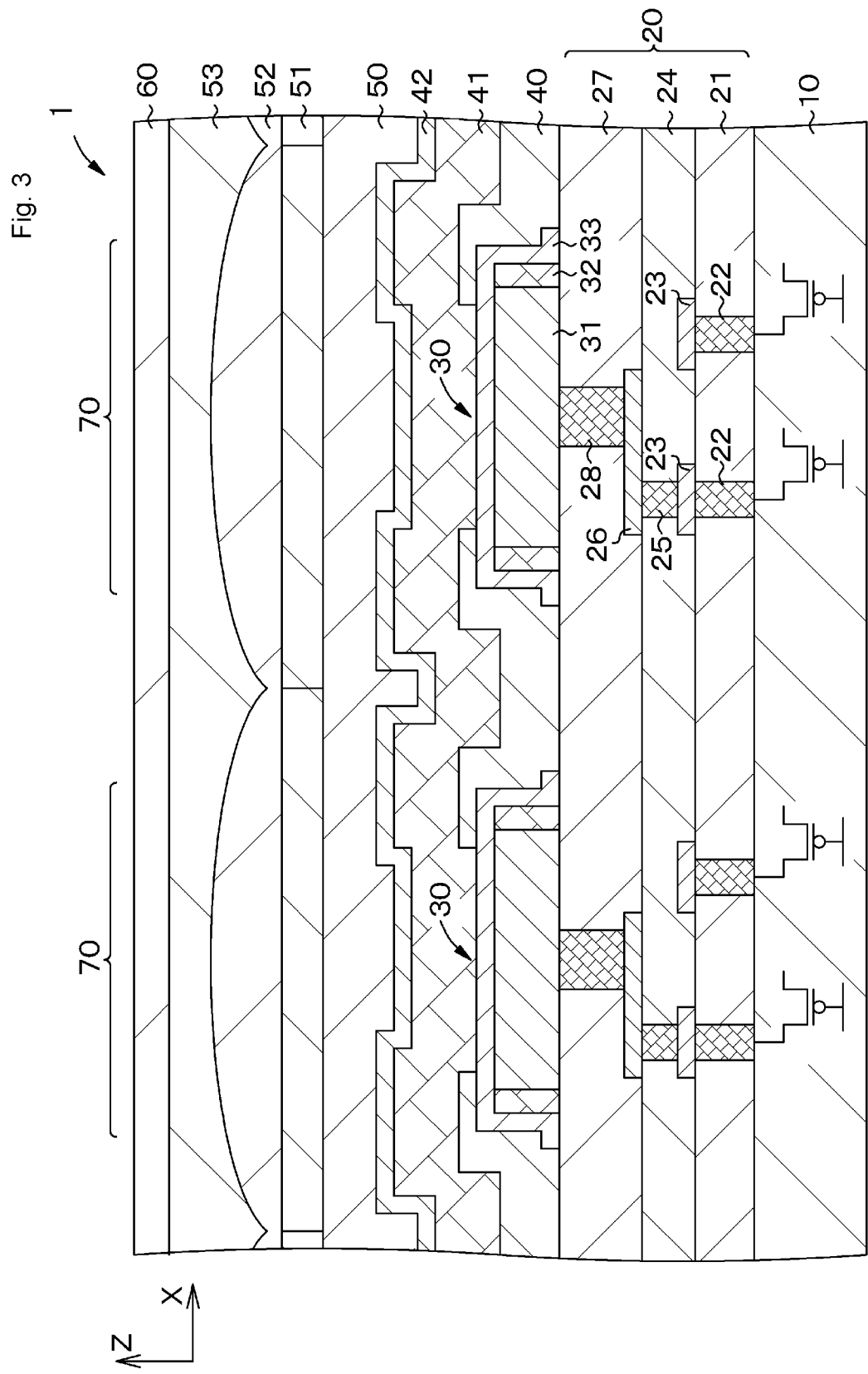
FIG. 3 is a schematic partial cross-sectional view of a portion including pixels in a pixel array section.

The pixel circuit configuration has been described above. Next, the three-dimensional arrangement relationship of various components constituting the pixel will be described. FIG. 3 is a schematic partial cross-sectional view of a portion including pixels in the pixel array section.

Pixels 70 are formed on the substrate 10. The transistor constituting the drive circuit 71 described above is provided in an n-channel type well provided on the substrate 10. For convenience of illustration, in FIG. 3, a transistor provided on the substrate 10 is schematically shown. The same applies to other figures.

A wiring layer 20 composed of a plurality of insulating layers, various wirings, and vias connecting between wirings and electrodes arranged with the insulating layers interposed therebetween are formed on the substrate 10. Reference numeral 21, reference numeral 24, and reference numeral 27 denote insulating layers, reference numeral 23 and reference numeral 26 denote wirings and electrodes, and reference numeral 22, reference numeral 25, and reference numeral 28 denote vias.

The pixel 70 is formed by layering a first electrode 30, an organic layer 41, and a second electrode 42. The organic layer 41 is formed by layering, for example, a hole transport layer, a light emitting layer, an electron transport layer, and the like. For convenience of illustration, the organic layer 41 is represented by one layer in the figures.

The first electrode 30 is arranged for each pixel 70 and includes a conductive light reflecting film 31 formed on the insulating layer 27 provided on the substrate 10, and a transparent electrode 33 formed on the light reflecting film 31. The light reflecting film 31 is composed of aluminum, and the transparent electrode 33 is composed of ITO.

When the light reflecting film 31 is configured of aluminum, there is a problem that the conductivity is deteriorated by insulating aluminum oxide ($Al_2O_3$) formed on the surface thereof. In a configuration in which the light reflecting film 31 and the transparent electrode 33 are layered, the contact resistance therebetween is usually on the order of k$\Omega$. Therefore, in the display device 1, a conductive portion 32 that is conductive with the transparent electrode 33 is provided on the side wall surface side of the light reflecting film 31.

The conductive portion 32 is provided so as to cover at least a part of the side wall surface of the light reflecting film 31. In the display device 1, the conductive portion 32 is provided on the entire circumference of the side wall surface of the light reflecting film 31, and is formed at the same height as the side wall surface of the light reflecting film 31.

A partition wall portion 40 is formed between the adjacent first electrodes 30. The partition wall portion 40 is configured of a single film such as an oxide film, an oxide nitride film, and an insulating polyimide film, or a layered film thereof.

A part of the upper surface of the transparent electrode 33 constituting the first electrode 30 is covered with the partition wall portion 40. Specifically, the peripheral portion of the upper surface of the transparent electrode 33 is annularly covered by the partition wall portion 40. The arrangement relationship of the partition wall portion arranged between the adjacent first electrodes, the light reflecting film included in the first electrode, and the conductive portion is shown in FIGS. 4A, 4B, and 4C.

The conductive portion 32 is composed of a conductive material different from the material constituting the light reflecting film 31. The conductive portion 32 is preferably formed of a conductive material exhibiting reducing property, and can be formed using titanium, titanium nitride, tungsten, or the like.

As shown in FIG. 3, the vias 28 conductive with the light reflecting films 31 are formed in the portion of the insulating layer 27 located under the light reflecting films 31, and a voltage is applied to the first electrode 30 through the via 28. More specifically, the voltage from the via 28 is supplied to the transparent electrode 33 through the light reflecting film 31 and the conductive portion 32.

The organic layer 41 is formed on the entire surface including the top of the first electrode 30 and the top of the partition wall portion 40, and the second electrode 42 is formed as a common electrode on the organic layer 41. A protective film 50, a color filter 51, and a lens 52 are arranged on the second electrode 42. Further, an opposing substrate 60 composed of, for example, glass or the like is arranged thereabove with a sealing resin 53 interposed therebetween.

The light emission by the organic layer 41 includes a component toward the opposing substrate 60 side and a component toward the first electrode 30 side. In the display device 1, the light directed toward the first electrode 30 side is reflected by the light reflecting film 31 and directed toward the substrate 60 side. Therefore, the light directed from the organic layer 41 toward the first electrode 30 also contributes to the display of an image, so that the brightness can be increased.

In the display device 1, the via 28 is formed in a portion of the insulating layer 27 located under the light reflecting film 31, and a voltage is applied to the first electrode through the via. Therefore, the pixel pitch does not increase as compared with the configuration in which the first electrode and the wiring are connected in a region different from that of the first electrode. In addition, since the proportion occupied by the light emitting region in the pixel does not decrease, it is possible to meet the demands for further miniaturization and higher brightness of the pixel.

The three-dimensional arrangement relationship of various components constituting the pixel has been described above. Subsequently, a method for manufacturing the display device 1 will be described with reference to FIGS. 5A, 5B, 6A, 6B, 7A, 7B, 8A, 8B, 9A, 9B, 10A, 10B, 11A, 11B, and 12 which are schematic partial end views of the substrate and the like.

The method for manufacturing the display device 1 includes
a step of forming vias in portions of an insulating layer where pixels are arranged;
a step of forming conductive light reflecting films on the insulating layer including vias; and
a step of forming a transparent electrode on the light reflecting film, and further includes
a step of providing a conductive portion that is conductive with the transparent electrode on the side wall surface side of the light reflecting film. The details will be described hereinbelow.

[Step-100]

Figure 5:
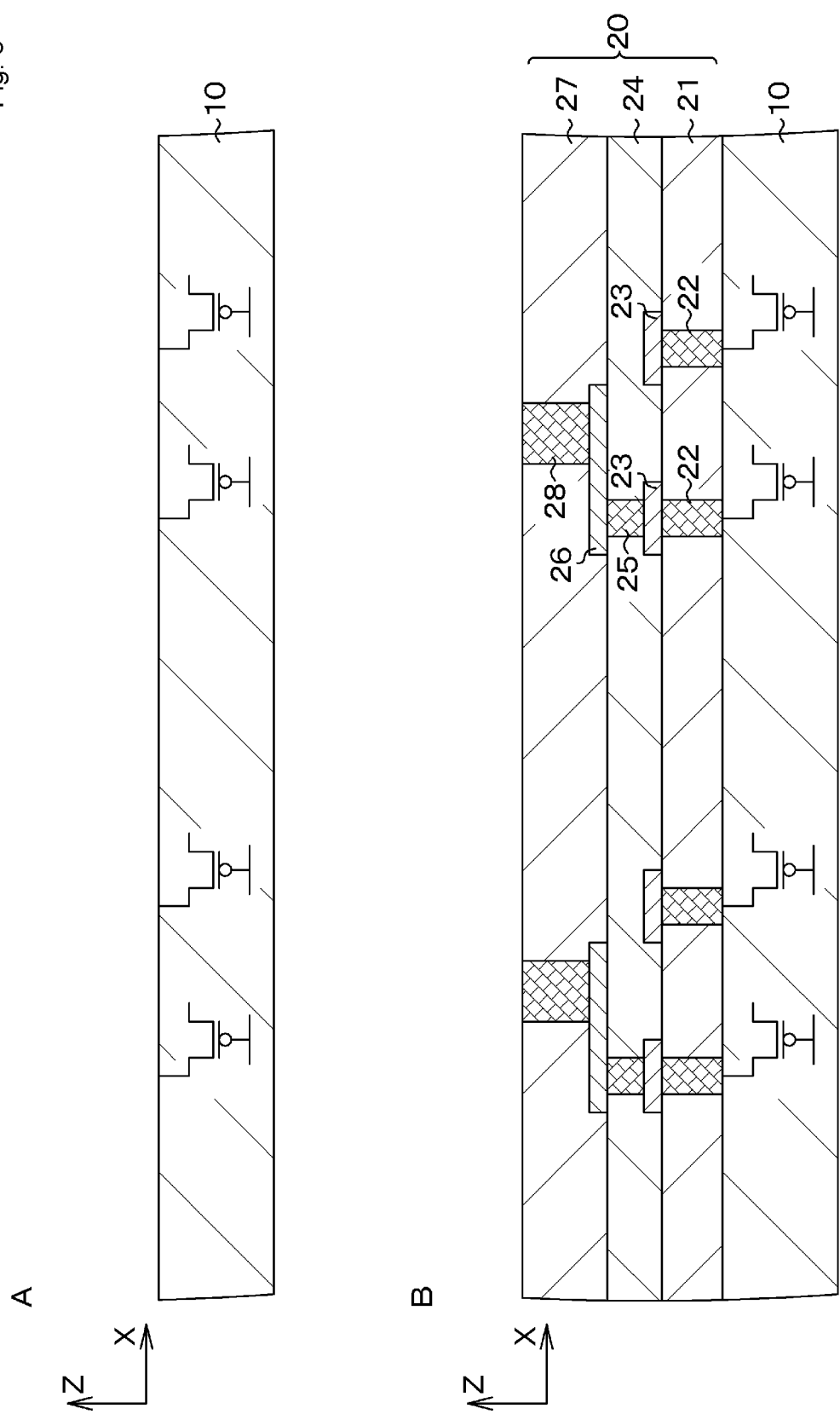
FIGS. 5A and 5B are schematic partial end views for explaining a method for manufacturing a display device according to a first embodiment.

First, transistors to be used for the pixels 70 are formed on the substrate 10 (see FIG. 5A). For example, a transistor or the like is formed, as appropriate, in a well provided on a substrate 10 composed of a semiconductor material such as silicon. Next, the wiring layer 20 necessary for driving the pixels is formed (see FIG. 5B). The various wirings shown by reference numerals 23, 26, and the like can be formed by lithography using a material such as aluminum (Al), and the vias shown by reference numerals 22, 25, 28, and the like can be formed using a material such as tungsten (W). The vias 28 are formed in portions of the insulating layer 27 on which the pixels are to be arranged.

[Step-110]

Next, the light reflecting films 31 are formed on the insulating layer 27 including the vias 28. First, the metal material layer 31' constituting the light reflecting films 31 is formed on the entire surface of the insulating layer 27 including the vias 28. Here, an aluminum layer having a film thickness of 100 nanometers was formed as the metal material layer 31' (see FIG. 6A). Then, using a well-known patterning technique such as lithography and etching, the metal material layer 31' is patterned to form light reflecting films 31 at portions where pixels should be arranged (see FIG. 6B).

[Step-120]

Next, conductive portions that are conductive with the transparent electrodes are provided on the side wall surface sides of the light reflecting films 31. First, a conductive material layer 32' constituting the conductive portions 32 is formed on the entire surface including the light reflecting films 31 (see FIG. 7A). Here, titanium nitride having a film thickness of 50 nanometers was formed as the conductive material layer 32'. Although it depends on the specifications of the display device, it is preferable that the film thickness of the conductive material layer 32' be about 30 nanometers to 200 nanometers. Subsequently, the entire surface is subjected to an etch back treatment using dry etching to form conductive portions 32 on the side wall portions of the light reflecting films 31 (see FIG. 7B). By forming a conductive material having a reducing property, the contact resistance with the transparent electrode 33 forming the first electrode 30 can be reduced.

[Step-130]

After that, the transparent electrodes 33 are formed on the light reflecting films 31. First, a transparent conductive material layer 33' constituting the transparent electrodes 33 is formed on the entire surface including the light reflecting films 31 (see FIG. 8A). Here, an ITO film having a film thickness of 20 nanometers was formed as the transparent conductive material layer 33'. Although it depends on the specifications of the display device, the film thickness of the transparent conductive material layer 33' is preferably about 5 nanometers to 50 nanometers from the viewpoint of transmittance and the like. Subsequently, the transparent conductive material layer 33' is patterned using a well-known patterning technique such as lithography and etching to form transparent electrodes 33 that cover the light reflecting films 31 and the conductive portions 32 (see FIG. 8B). The first electrodes 30 can be formed by the above steps.

[Step-140]

Next, partition wall portions 40 are formed between the adjacent first electrodes 30. First, an insulating material layer 40' constituting the partition wall portions 40 is formed on the entire surface including the first electrodes 30 (see FIG. 9A). Here, a $SiN_x$ film having a film thickness of 100 nanometers was formed as the insulating material layer 40'. Subsequently, the partition wall portions 40 can be formed by patterning the insulating material layer 40' using a well-known patterning technique such as lithography and etching to expose the upper surface of the first electrodes 30 (see FIG. 9B). By forming the partition wall portions 40, the insulating property between the adjacent first electrodes 30 can be improved.

In the example shown in the figure, the partition wall portions 40 are formed to be thinner than the first electrodes 30. Further, it is assumed that the peripheral portion of the upper surface of the transparent electrode 33 is annularly covered by the partition wall portion 40. By using a configuration in which the peripheral portion of the upper surface of the transparent electrode 33 is covered, the processing tolerance can be expanded.

This structure of the partition wall portion 40 is not limiting. For example, the partition wall portion 40 can be configured to have the same thickness as that of the first electrode 30 (see FIGS. 10A and 10B), the partition wall portion 40 can be configured to be thinner than the first electrode 30 (see FIG. 11A), and the partition wall portion 40 can be configured to be thicker than the first electrode 30 (see FIG. 11B).

[Step-150]

Figure 12:
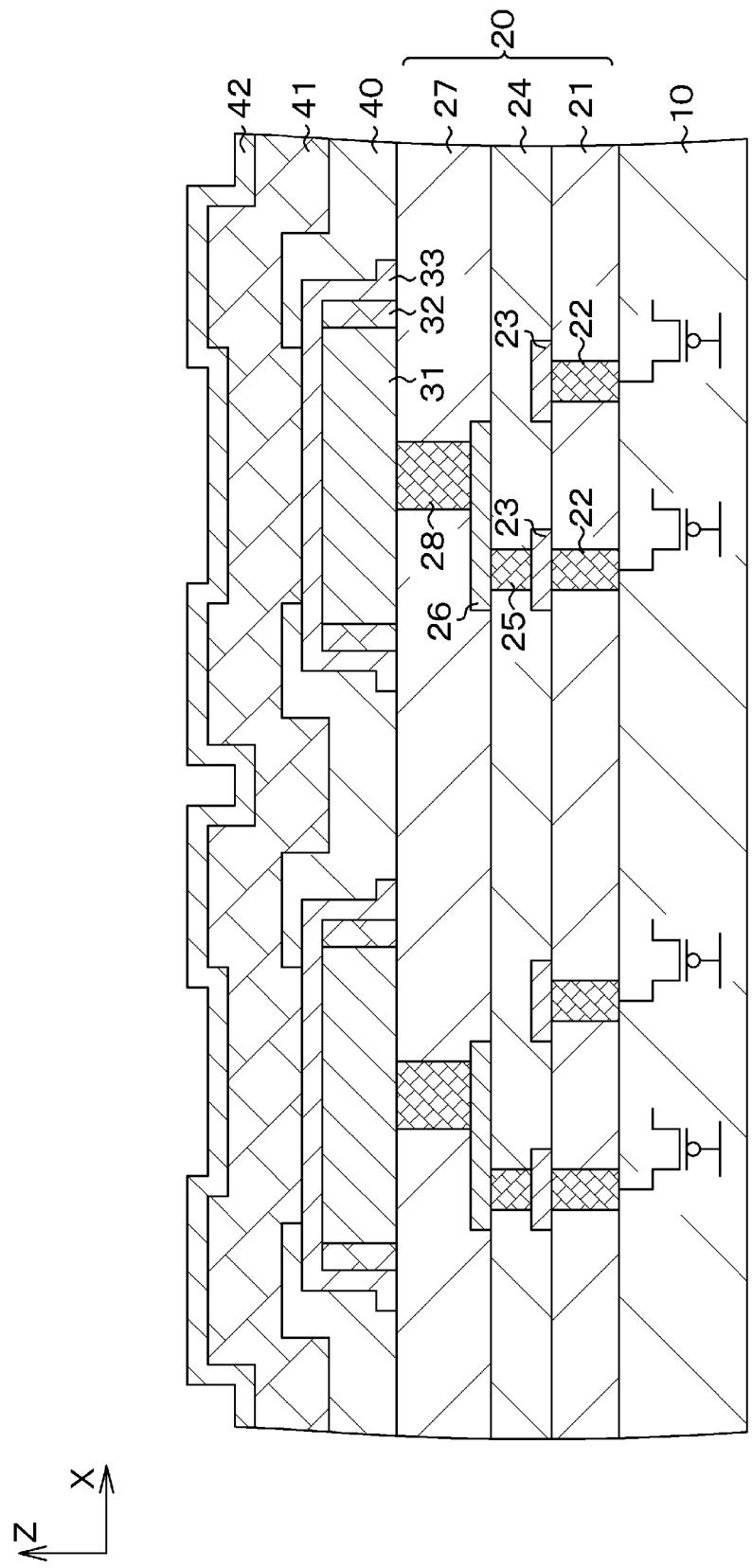
FIGS. 12A and 12B are schematic partial end views for explaining a method for manufacturing the display device according to the first embodiment, following FIG. 11B.

After that, an organic layer 41 including a light emitting layer is formed on the entire surface including on the first electrodes 30 and on the partition wall portions 40, and then the second electrode 42 is formed on the organic layer 41 (see FIG. 12). The organic layer 41 can be formed, for example, by sequentially layering a hole injection layer, a hole transport layer, a light emitting layer, an electron transport layer, and an electron injection layer from the first electrode 30 side.

The light emitting layer of the organic layer 41 can be formed as, for example, a light emitting layer for white light emission. In this case, color display can be performed by a combination with a color filter. The white light emitting layer can be formed, for example, by sequentially layering a red light emitting layer, a light emitting separation layer, a blue light emitting layer, and a green light emitting layer. Alternatively, a form can also be used that has a layered structure including a blue light emitting layer and a yellow light emitting layer, or a layered structure including a blue light emitting layer and an orange light emitting layer. These structures emit white light as a whole. The material constituting the organic layer is not particularly limited, and a well-known material can be used.

[Step-160]

Next, the protective film 50, the color filters 51, and the lenses 52 are sequentially formed on the second electrode 42. After that, the opposing substrate 60 is bonded to the lenses with the sealing resin 53 interposed therebetween (see FIG. 3). The display device 1 can be obtained by the above steps.

Various modifications are possible for the first embodiment. Hereinafter, modification examples of the first embodiment will be described.

Figure 13:
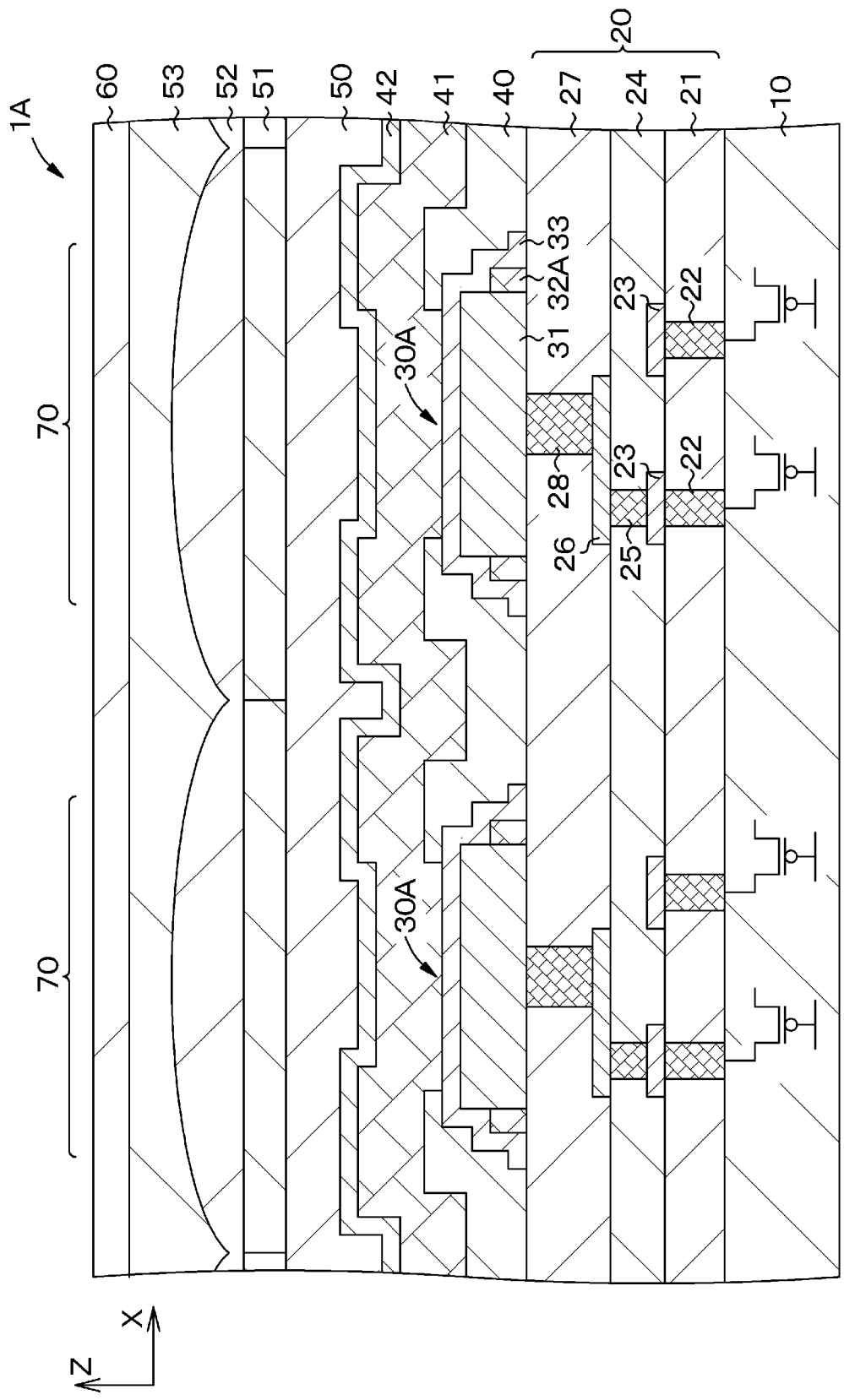
FIG. 13 is a schematic partial cross-sectional view of a portion including pixels in the pixel array section of the display device according to a first modification example.

FIG. 13 is a schematic partial cross-sectional view of a portion including pixels in the pixel array section of the display device according to the first modification example. In the conceptual diagram of the display device according to the first modification example, the display device 1 in FIG. 1 may be read as the display device 1A. Reading in the same manner is also possible, as appropriate, in other modification examples and other embodiments described hereinbelow.

In the display device 1, the conductive portion 32 is provided on the entire circumference of the side wall surface of the light reflecting film 31, and is formed at the same height as the side wall surface of the light reflecting film 31 (see FIG. 3). From the viewpoint of ensuring conductivity, it is sufficient that the conductive portion be provided so as to cover at least a part of the side wall surface of the light reflecting film 31. The display device 1A according to the first modification has a configuration in which a conductive portion 32A is provided only in the lower portion of the side wall of the light reflecting film 31 in a first electrode 30A (see FIG. 13).

Hereinafter, a method for manufacturing the display device 1A will be described with reference to the figures.

[Step-100A]

Figure 6:
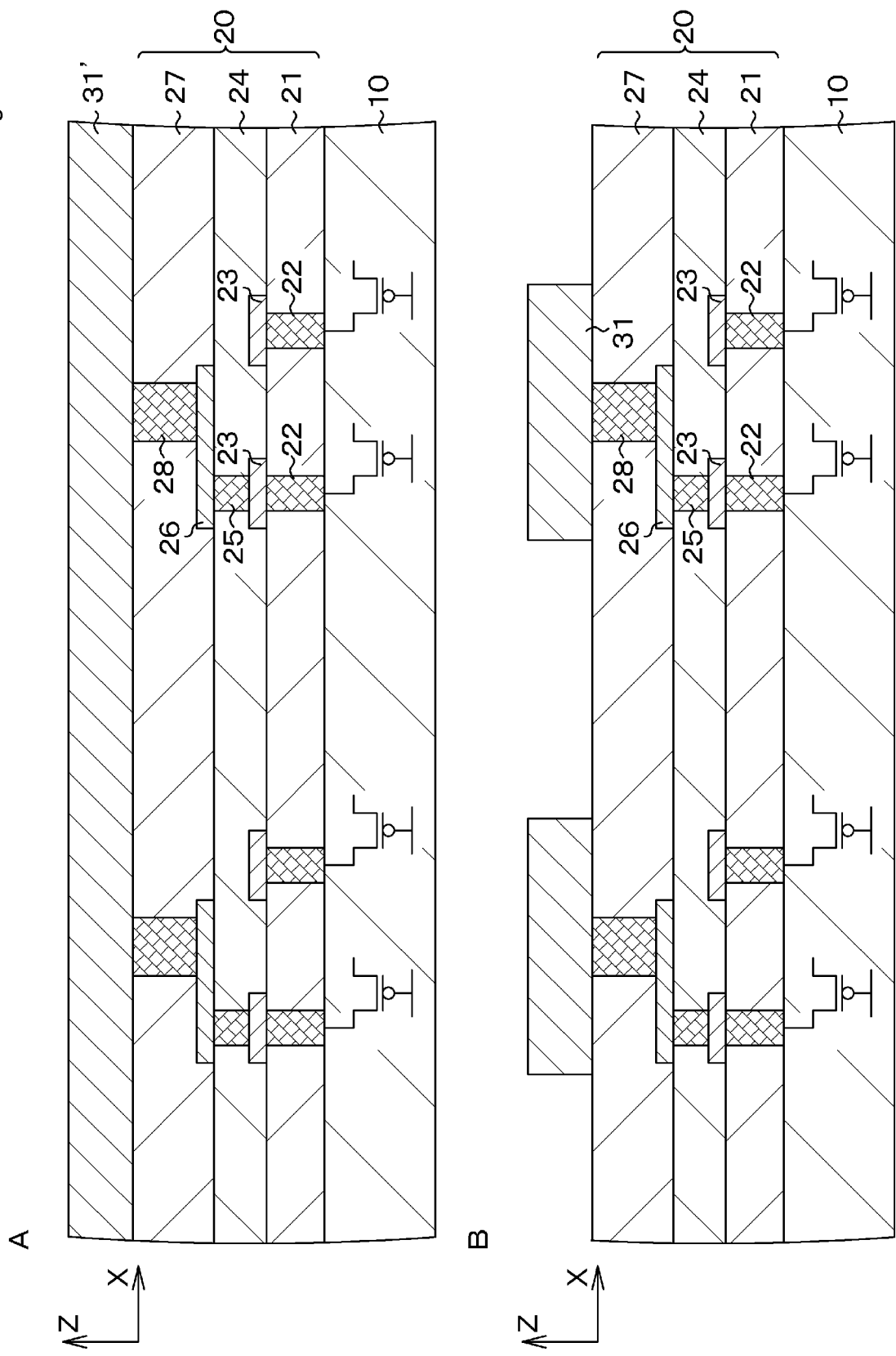
FIGS. 6A and 6B are schematic partial end views for explaining a method for manufacturing the display device according to the first embodiment, following FIG. 5B.
Figure 7:
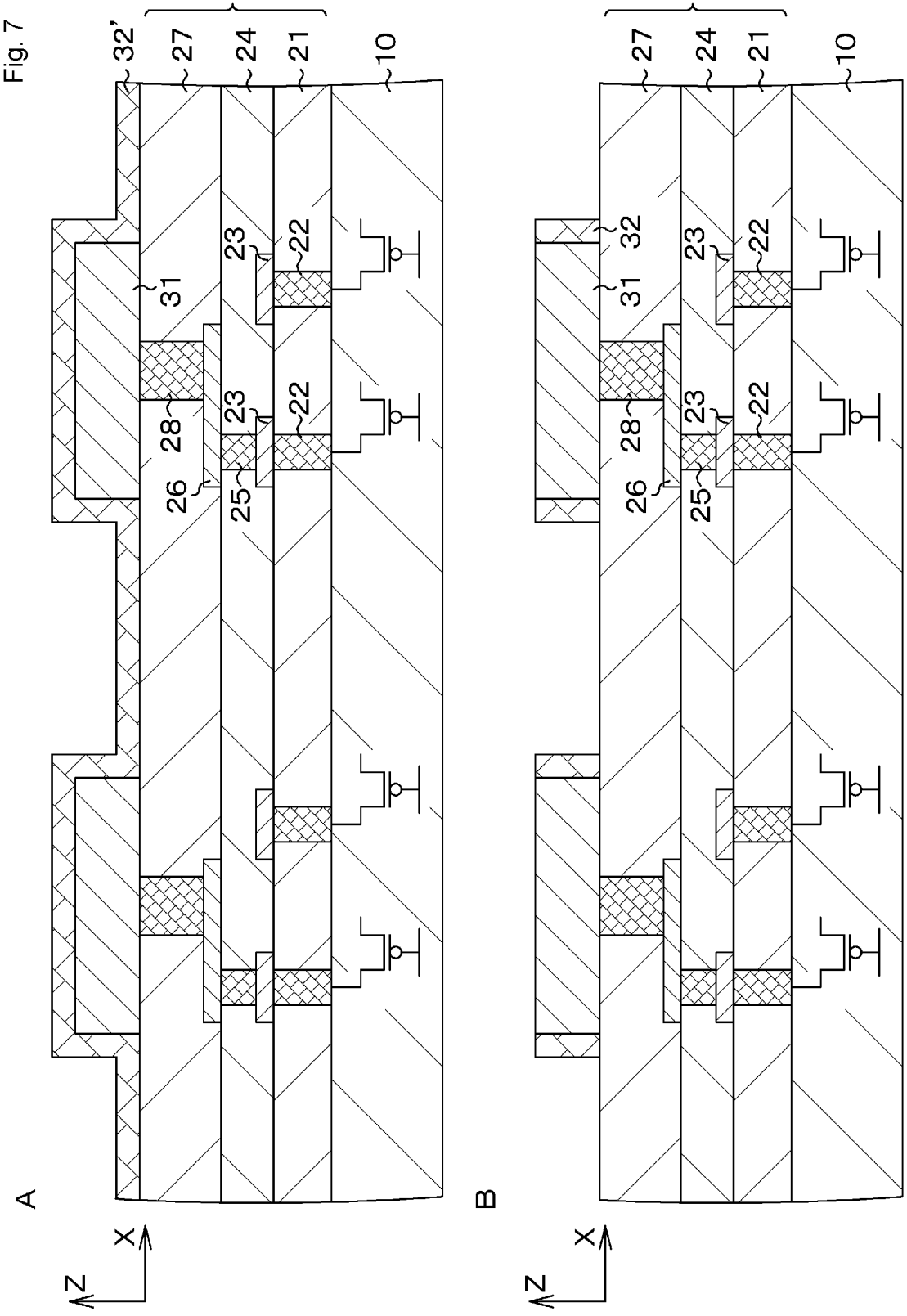
FIGS. 7A and 7B are schematic partial end views for explaining a method for manufacturing the display device according to the first embodiment, following FIG. 6B.
Figure 8:
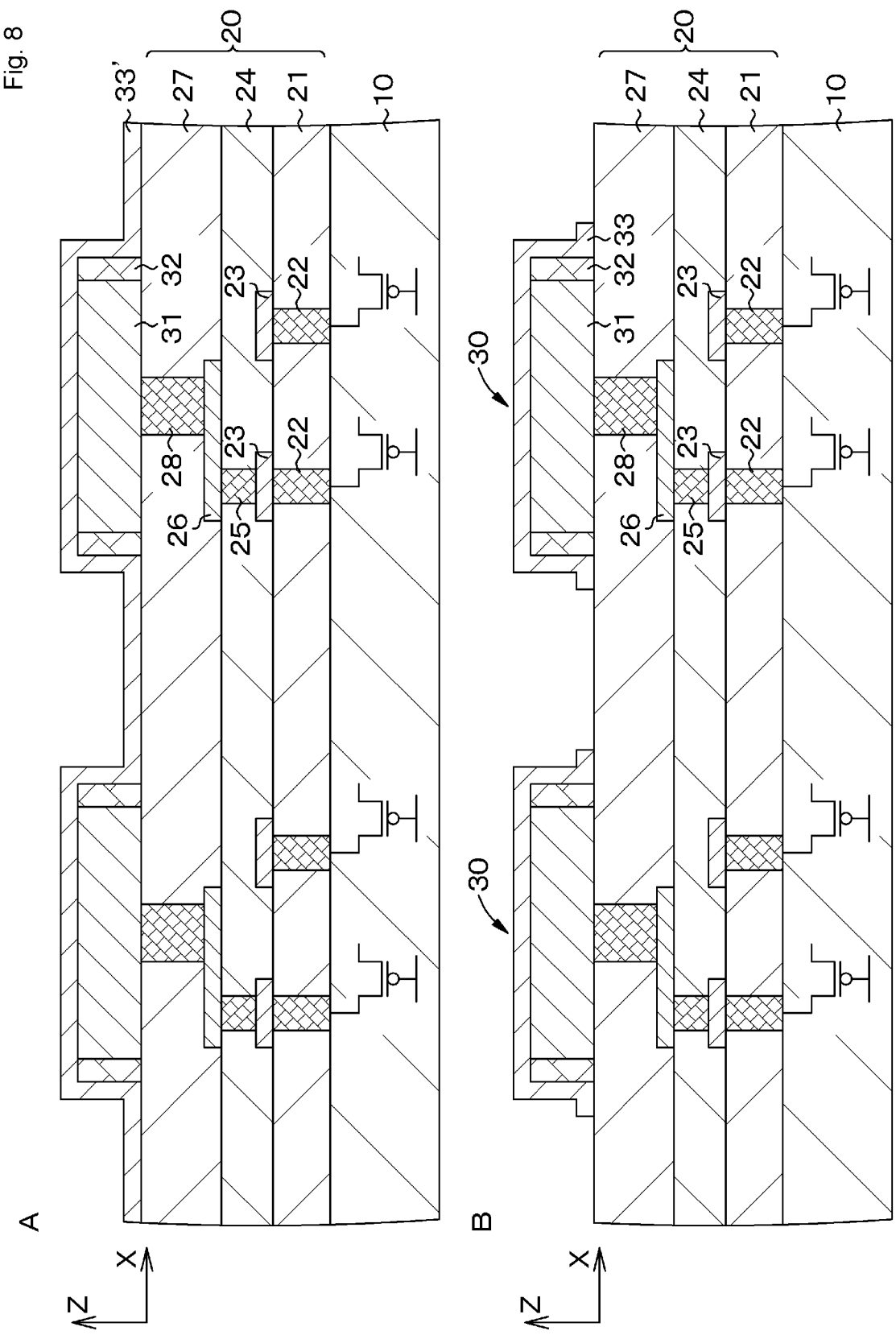
FIGS. 8A and 8B are schematic partial end views for explaining a method for manufacturing the display device according to the first embodiment, following FIG. 7B.
Figure 9:
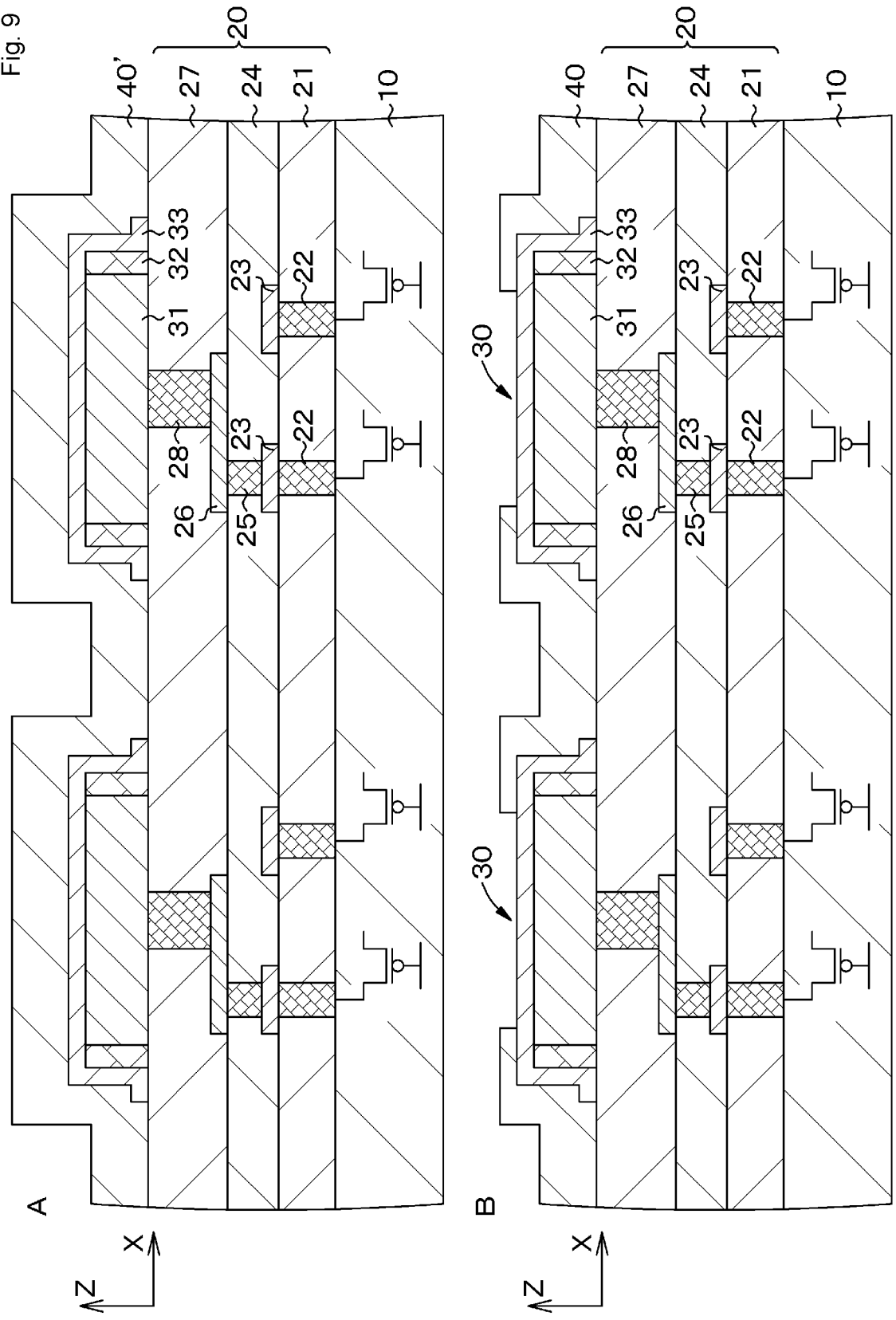
FIGS. 9A and 9B are schematic partial end views for explaining a method for manufacturing the display device according to the first embodiment, following FIG. 8B.
Figure 11:
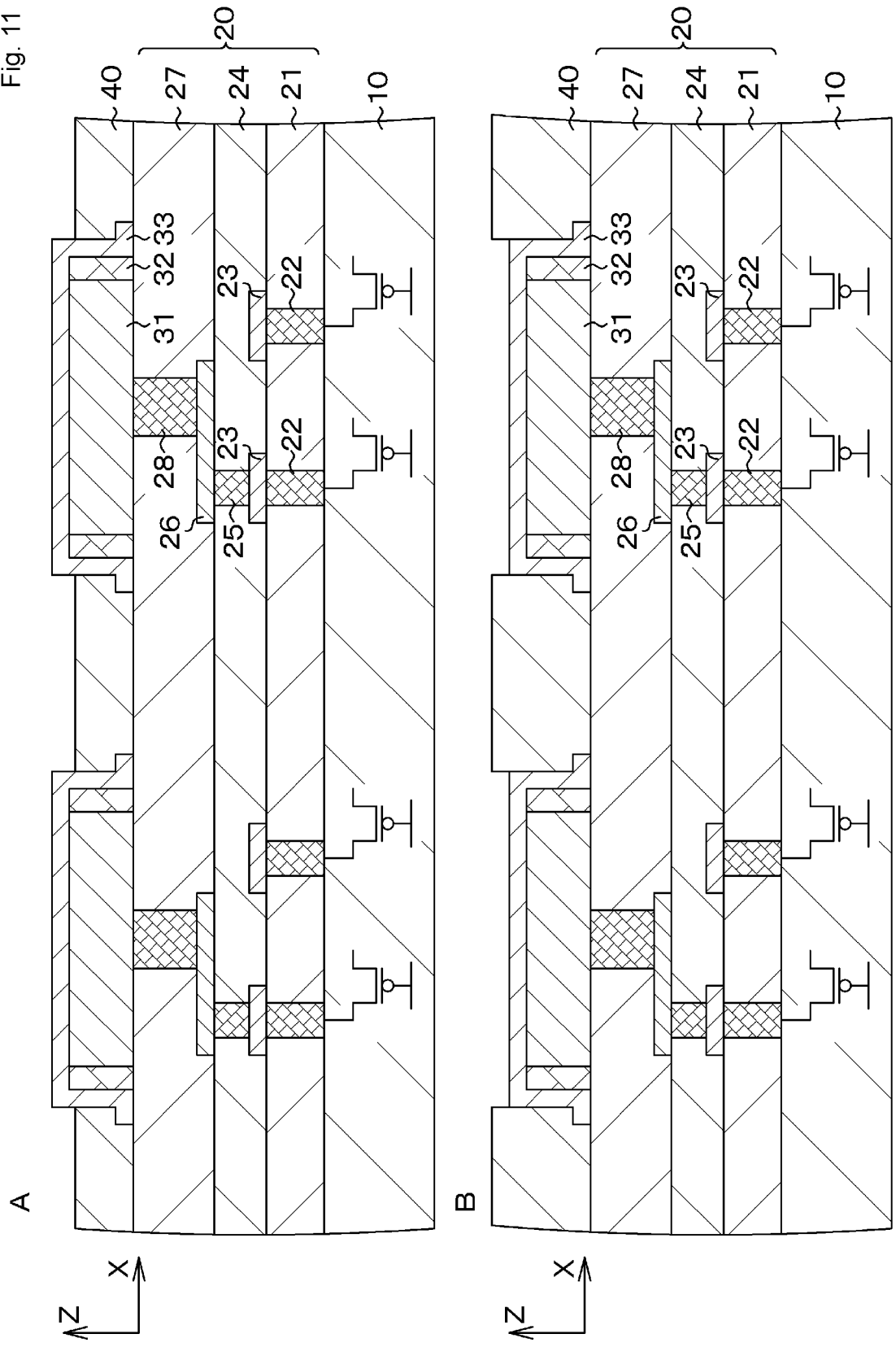
FIGS. 11A and 11B are schematic partial end views for explaining a method for manufacturing the display device according to the first embodiment, following FIG. 10B.

The above-mentioned [Step-100] and [Step-110] are performed to form light reflecting films 31 at portions where pixels should be arranged (see FIG. 6B).

[Step-110A]

Figure 14:
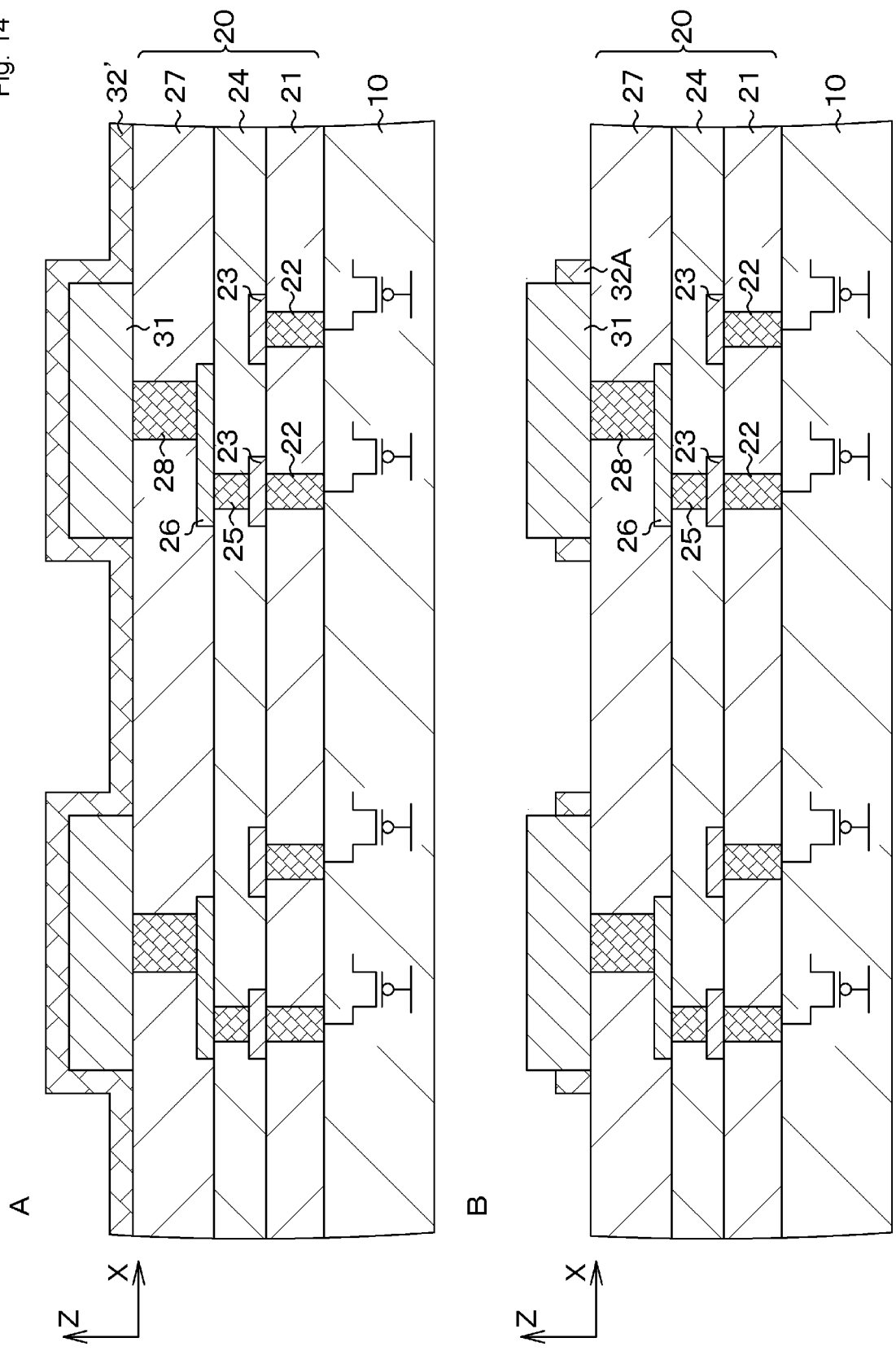
FIGS. 14A and 14B are schematic partial end views for explaining a method for manufacturing the display device according to the first modification example of the first embodiment.

Next, conductive portions that are conductive with the transparent electrodes are provided on the side wall surface side of the light reflecting films 31. First, the conductive material layer 32' constituting the conductive portions 32 is formed on the entire surface including the light reflecting films 31 (see FIG. 14A). Here, titanium nitride having a film thickness of 50 nanometers was formed as the conductive material layer 32'. Subsequently, the entire surface is subjected to an etch back treatment using dry etching to form conductive portions 32A on the side wall portion of the light reflecting films 31. At this time, the etch-back amount is adjusted so that the conductive portions 32A are provided only in the lower portion of the side wall of the light reflecting films 31.

[Step-120A]

After that, the display device 1A can be obtained by performing the above-mentioned [Step-130] to [Step-160].

The first modification example has been described above. Next, the second modification example will be described.

Figure 15:
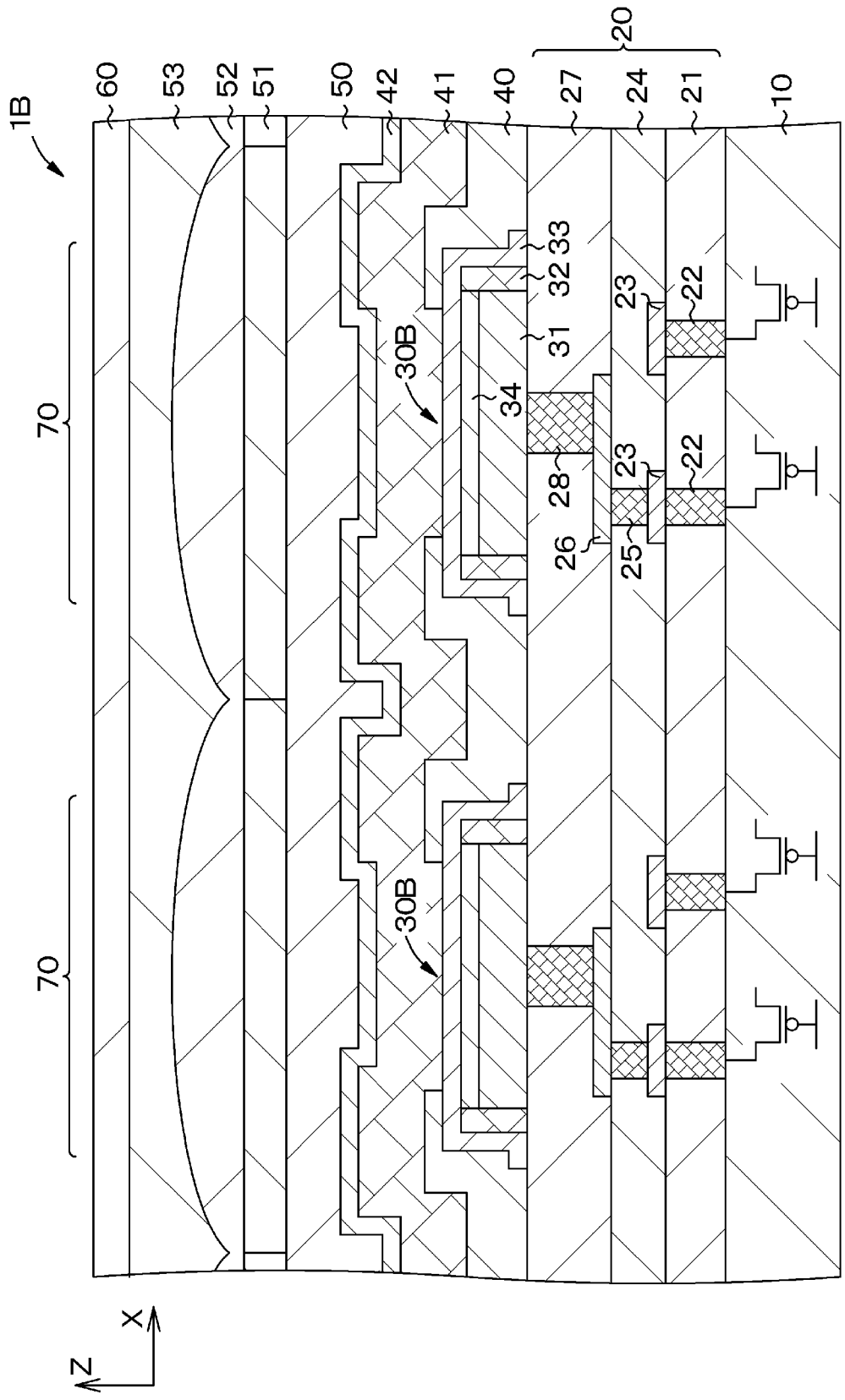
FIG. 15 is a schematic partial cross-sectional view of a portion including pixels in the pixel array section of the display device according to a second modification example.

FIG. 15 is a schematic partial cross-sectional view of a portion including pixels in the pixel array section of the display device according to the second modification example.

In the display device 1, the transparent electrode was formed directly on the light reflecting film. Although it depends on the type of conductive material that constitutes the light reflecting film, the surface of the insulating film is usually excellent in flatness with respect to the surface of the conductive material. In a display device 1B according to the second modification example, in a first electrode 30B, the transparent electrode 33 is formed on the insulating film 34 provided on the light reflecting film 31. As a result, the transmittance of the pixels can be further improved.

Hereinafter, a method for manufacturing the display device 1B will be described with reference to the figures.

[Step-100B]

The above-mentioned [Step-100] is performed to form transistors to be used for the pixels 70 on the substrate 10 and to form a wiring layer 20 necessary for driving the pixels (see FIG. 5B).

[Step-110B]

Figure 16:
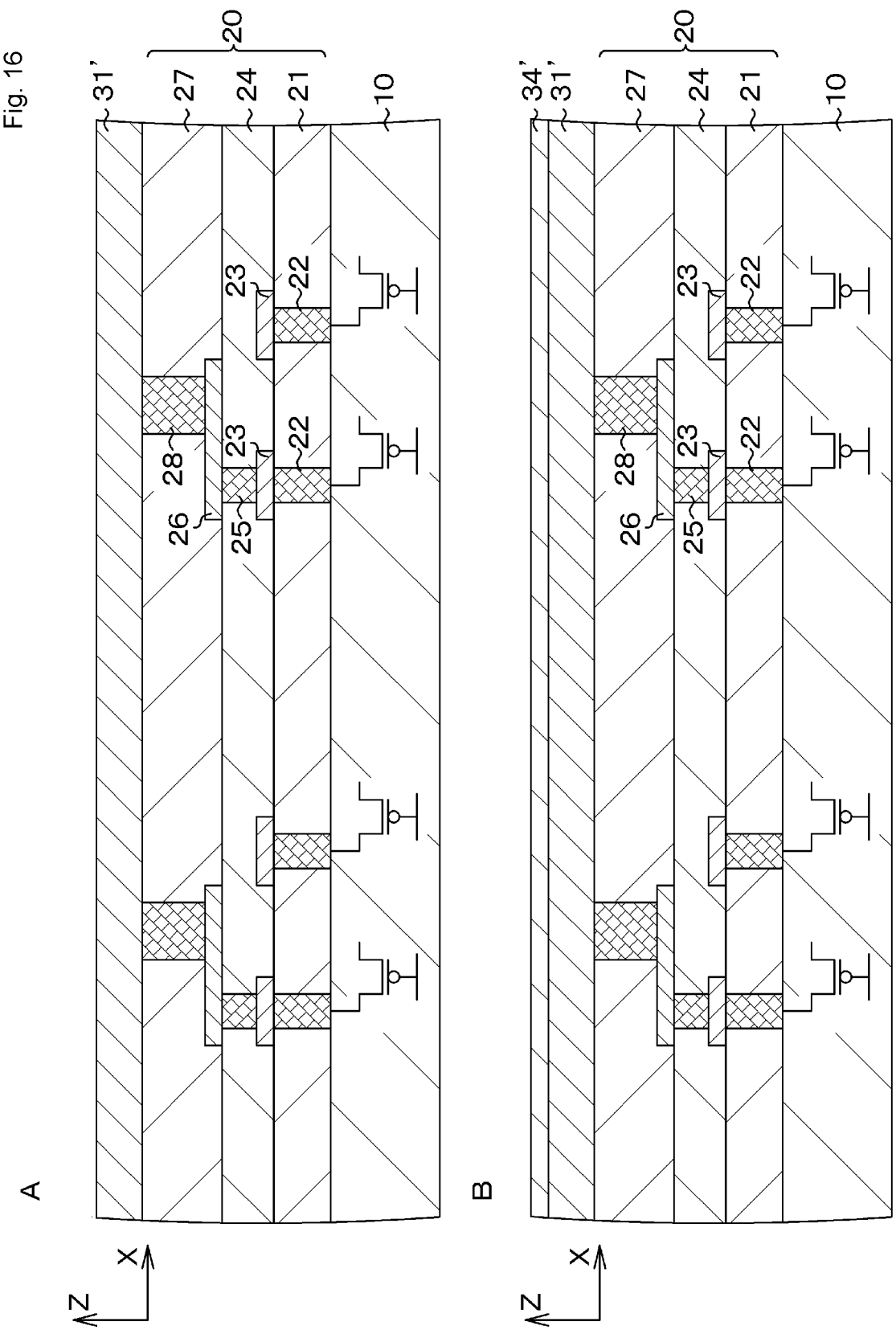
FIGS. 16A and 16B are schematic partial end views for explaining a method for manufacturing the display device according to the second modification example of the first embodiment.

Next, the light reflecting films 31 are formed on the insulating layer 27 including the vias 28. First, the metal material layer 31' constituting the light reflecting films 31 is formed on the entire surface of the insulating layer 27 including the vias 28. Here, an aluminum layer having a film thickness of 100 nanometers was formed as the metal material layer 31' (see FIG. 16A). Subsequently, an insulating material layer 34' is formed on the entire surface of the metal material layer 31'. Here, a silicon oxide layer having a film thickness of 20 nanometers was formed as the insulating material layer 34' (see FIG. 16B). Then, the metal material layer 31' and the insulating material layer 34' are patterned using a well-known patterning technique such as lithography and etching (the figure is omitted).

[Step-120B]

After that, the display device 1B can be obtained by performing the above-mentioned [Step-120] to [Step-160].

The second modification example has been described above. Next, a third modification example will be described.

Figure 17:
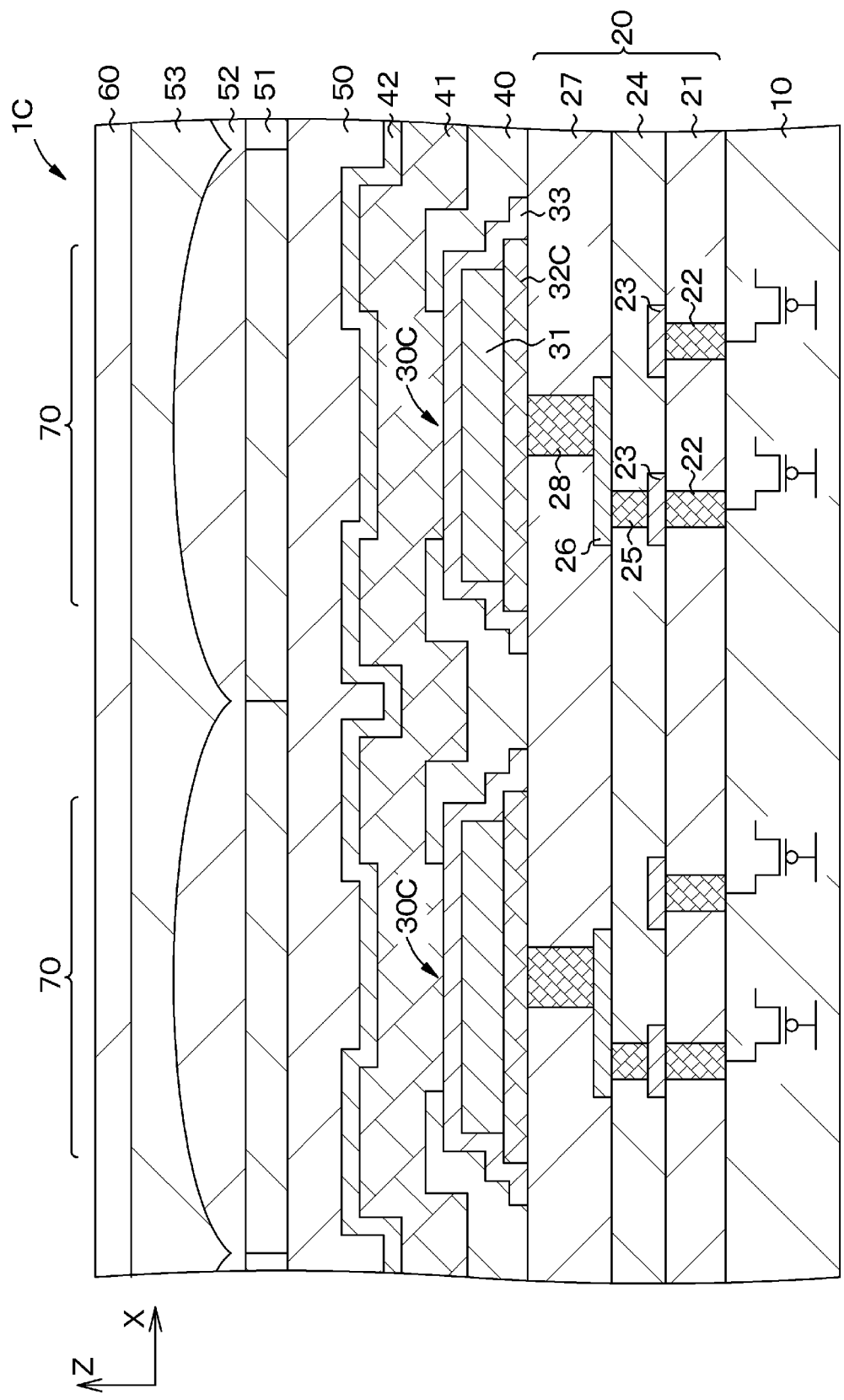
FIG. 17 is a schematic partial cross-sectional view of a portion including pixels in the pixel array section of the display device according to a third modification example.

FIG. 17 is a schematic partial cross-sectional view of a portion including pixels in the pixel array section of the display device according to the third modification example.

In the display device 1, the conductive portion was provided so as to cover the side wall surface of the light reflecting film. By contrast, in a display device 1C of the third modification example, a conductive portion 32C is composed of a conductive material layer provided between the light reflecting film 31 and the insulating layer 27.

Hereinafter, a method for manufacturing the display device 1C will be described with reference to the figures.

[Step-100C]

The above-mentioned [Step-100] is performed to form the transistors to be used for the pixels 70 on the substrate 10 and the wiring layer 20 necessary for driving the pixels (see FIG. 5B).

[Step-110C]

Next, a conductive material layer 32C' constituting the conductive portions 32C is formed on the insulating layer 27 including the vias 28. Here, the conductive material layer 32C was formed as a layered structure of titanium nitride (upper layer side: 20 nanometers)/titanium (lower layer side: 10 nanometers). Subsequently, an aluminum layer having a film thickness of 70 nanometers was formed on the front surface as a metal material layer 31' (see FIG. 18A). Since aluminum is formed on the conductive material layer 32C?, the orientation of Al crystals is improved, and the unevenness of the surface shape of the metal material layer 31' is reduced.

Figure 18:
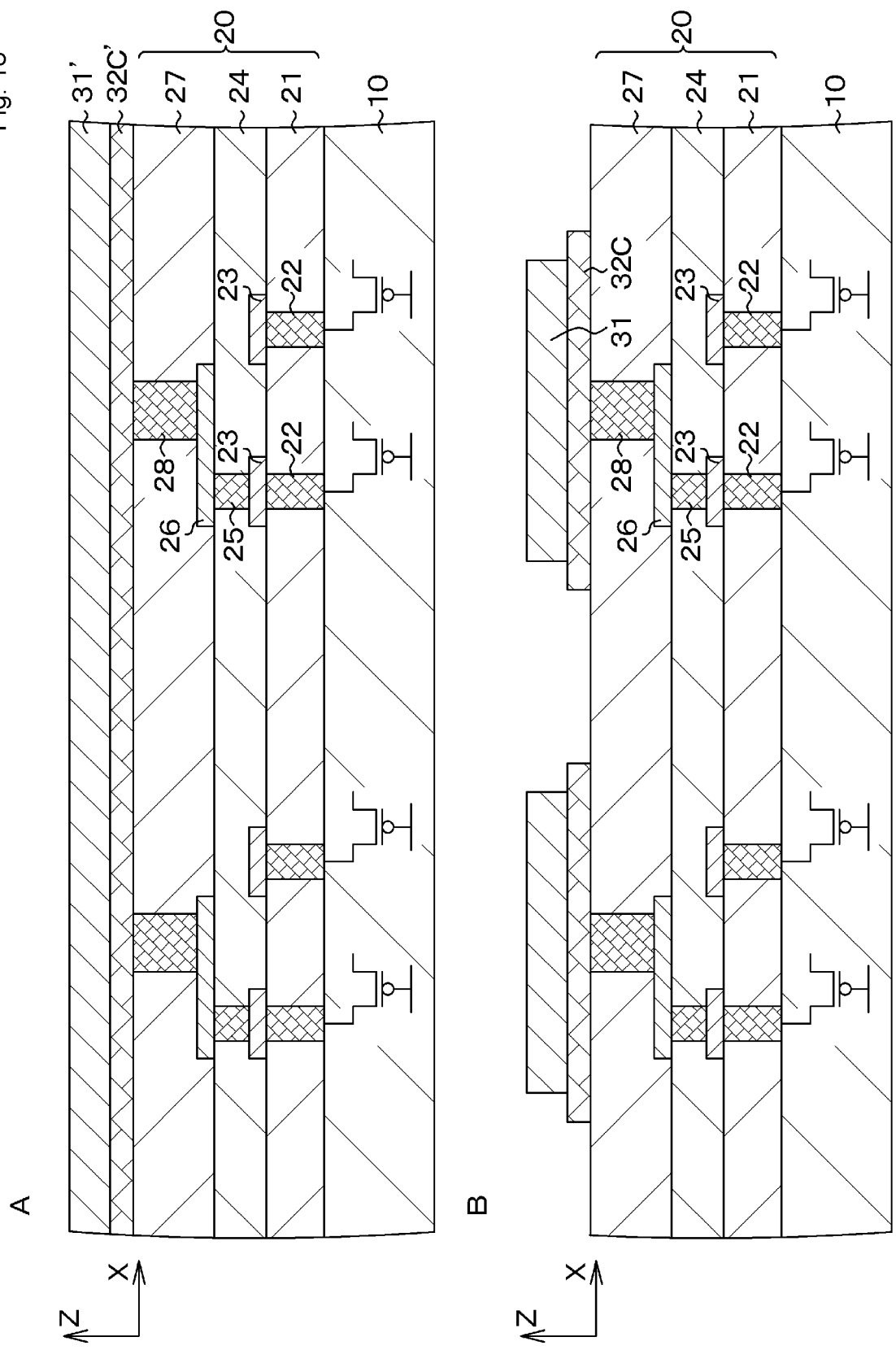
FIGS. 18A and 18B are schematic partial end views for explaining a method for manufacturing the display device according to the third modification example of the first embodiment.

After that, the conductive material layer 32C' and the metal material layer 31' are patterned by using a well-known patterning technique such as lithography and etching to form light reflecting films 31 at portions where pixels should be arranged (see FIG. 18B). During the patterning process, the conductive portions 32C are processed so as to project laterally from the light reflecting films 31. Although it depends on the setting of the pixel pitch and the like, the protrusion amount is preferably 100 nanometers or less.

[Step-120C]

Figure 19:
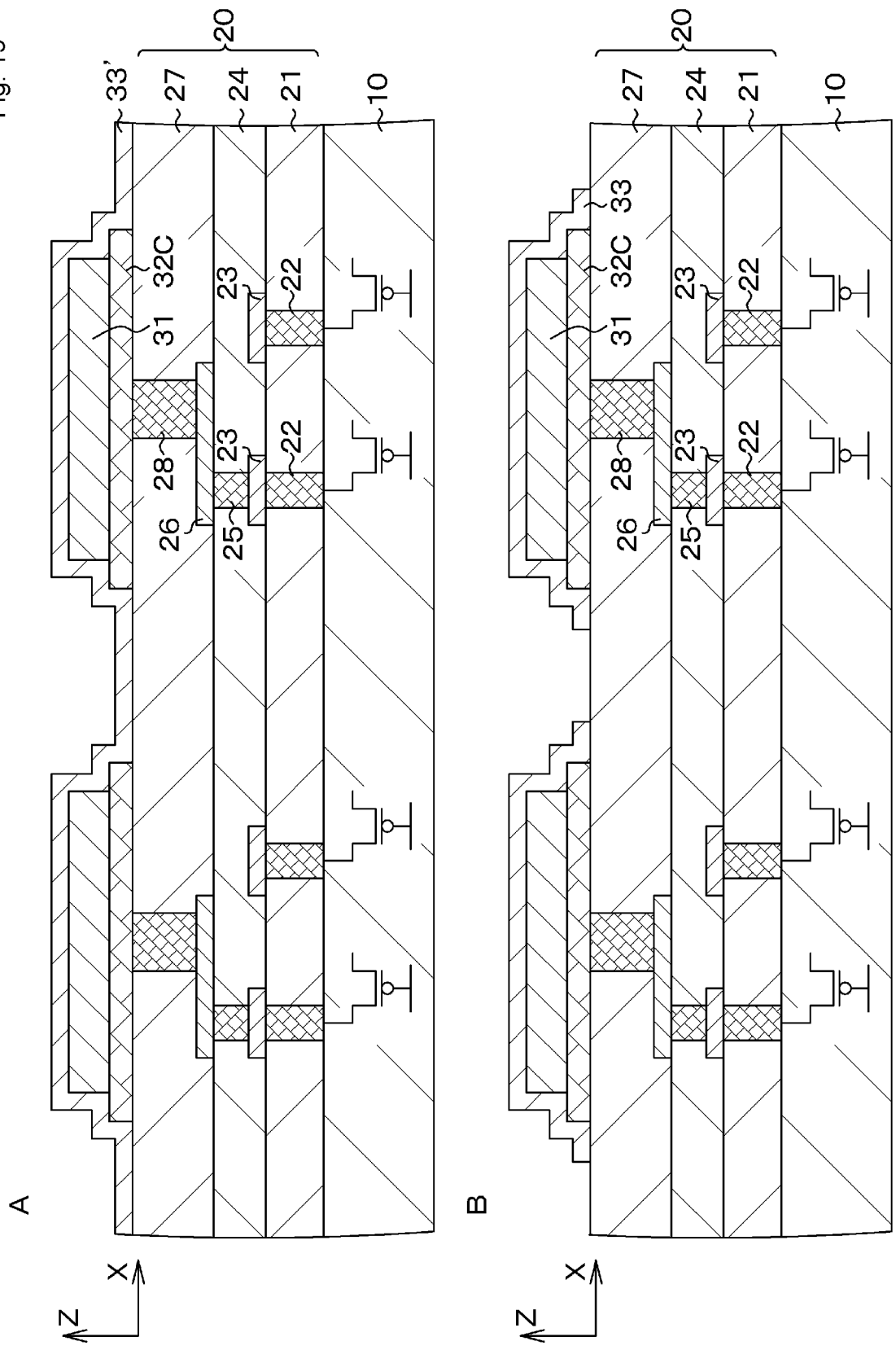
FIGS. 19A and 19B are schematic partial end views for explaining a method for manufacturing the display device according to the third modification example of the first embodiment, following FIG. 18B.

Next, the above-mentioned [Step-130] is performed to form the transparent electrodes 33 on the light reflecting films 31 (see FIGS. 19A and 19B). By forming the transparent electrodes 33 so as to cover the conductive portions 32C and the light reflecting films 31, the light reflecting films 31 and the transparent electrodes 33 are advantageously electrically connected through the conductive portions 32C.

[Step-130C]

After that, the display device 1C can be obtained by performing the above-mentioned [Step-140] to [Step-160].

The third modification example has been described above. Subsequently, the fourth modification example will be described.

Figure 20:
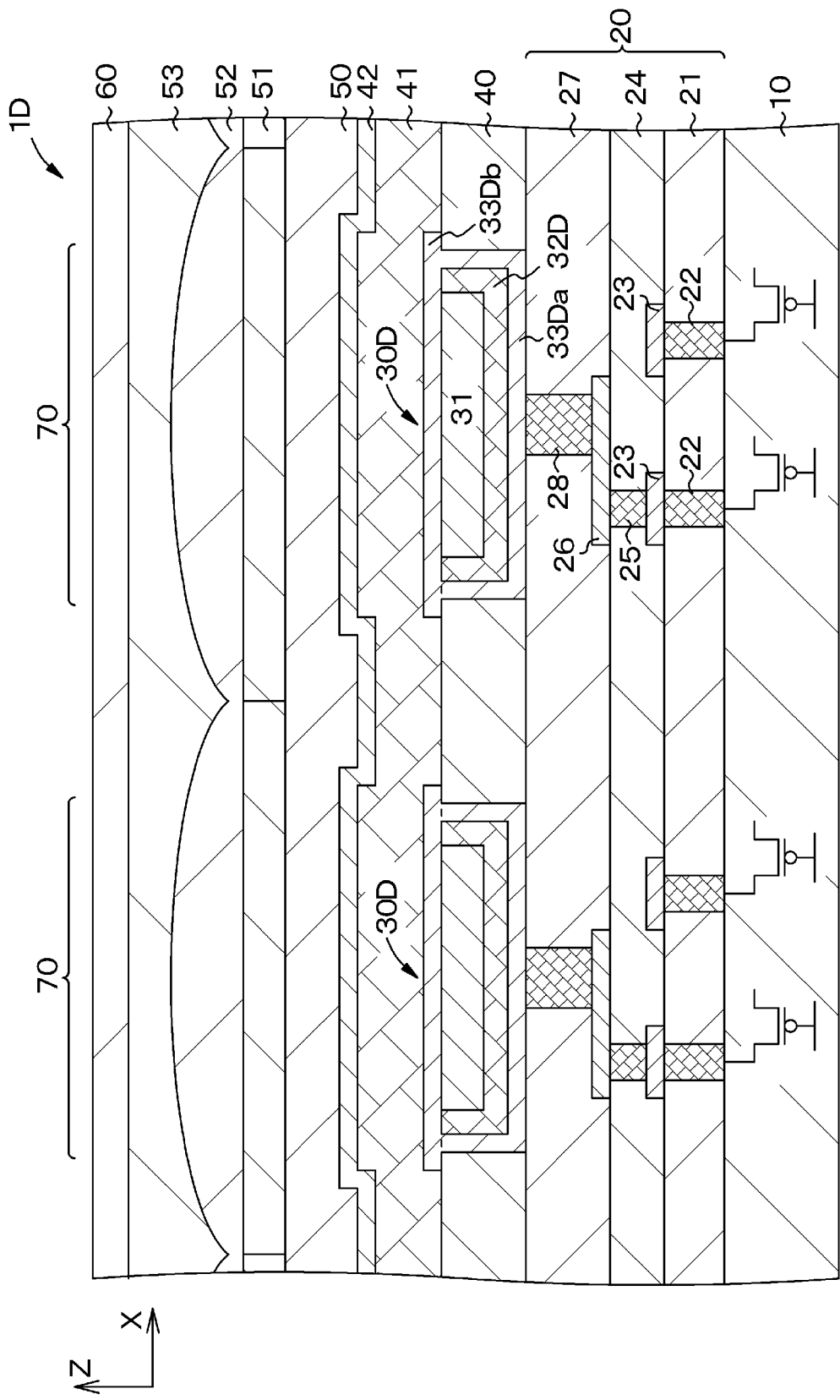
FIG. 20 is a schematic partial cross-sectional view of a portion including pixels in the pixel array section of the display device according to a fourth modification example.

FIG. 20 is a schematic partial cross-sectional view of a portion including pixels in the pixel array section of the display device according to the fourth modification example.

In the display device 1, the first electrodes are formed on the flat insulating layer 27. By contrast, in a display device 1D of the fourth modification example, the first electrodes 30D have a damascene structure selectively embedded in the insulating layer 40 in a predetermined pattern.

Hereinafter, a method for manufacturing the display device 1D will be described with reference to the figures.

[Step-100D]

The above-mentioned [Step-100] is performed to form transistors to be used for the pixels 70 on the substrate 10 and a wiring layer 20 necessary for driving the pixels (see FIG. 5B).

[Step-110D]

Next, the insulating layer 40 is formed on the entire surface of the insulating layer 27 including the vias 28. The thickness of the insulating layer 40 was 120 nanometers. Subsequently, a well-known patterning technique such as lithography and etching is used to form openings OP so that the vias 28 be exposed at the bottom (see FIG. 21).

[Step-120D]

Figure 22:
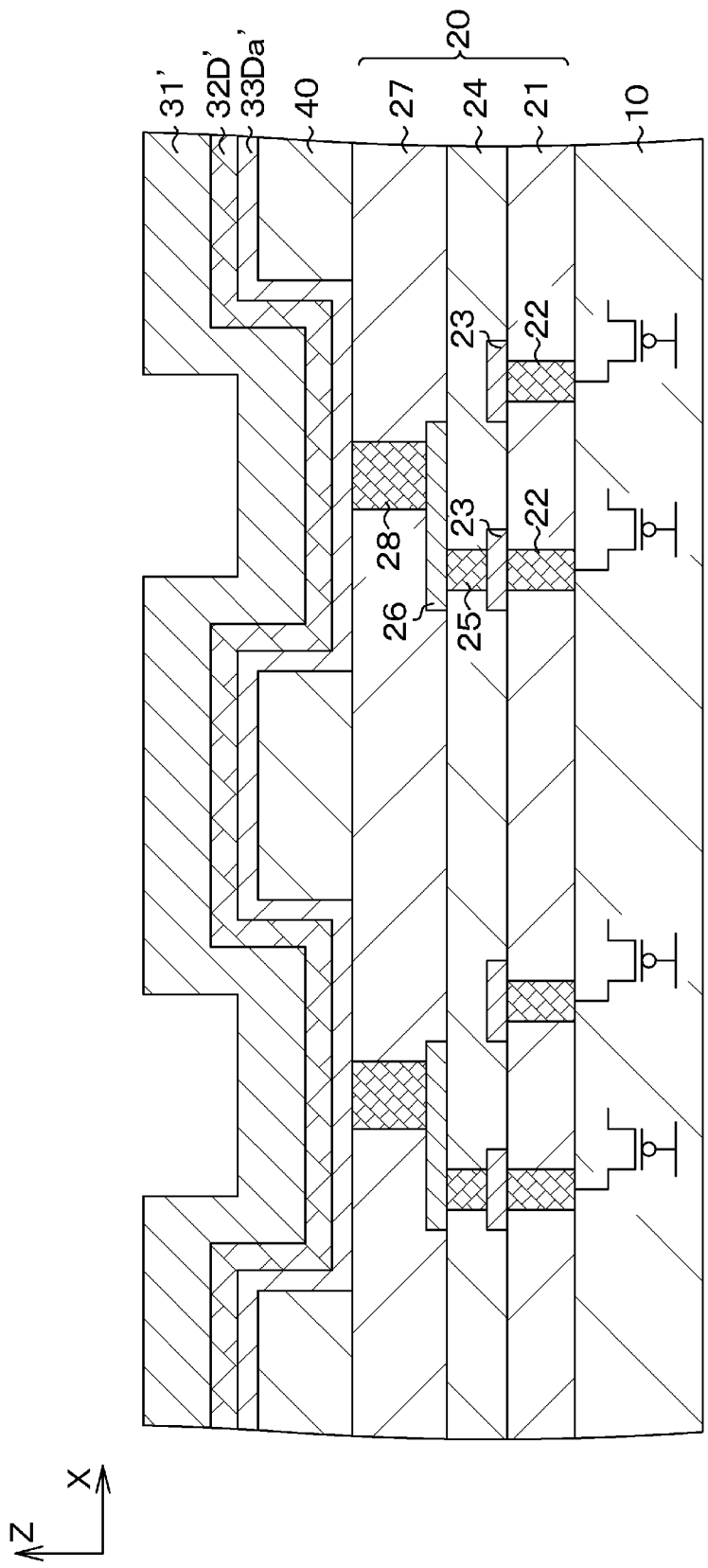
FIG. 22 is a schematic partial end view for explaining a method for manufacturing the display device according to the fourth modification example of the first embodiment, following FIG. 21.
Figure 23:
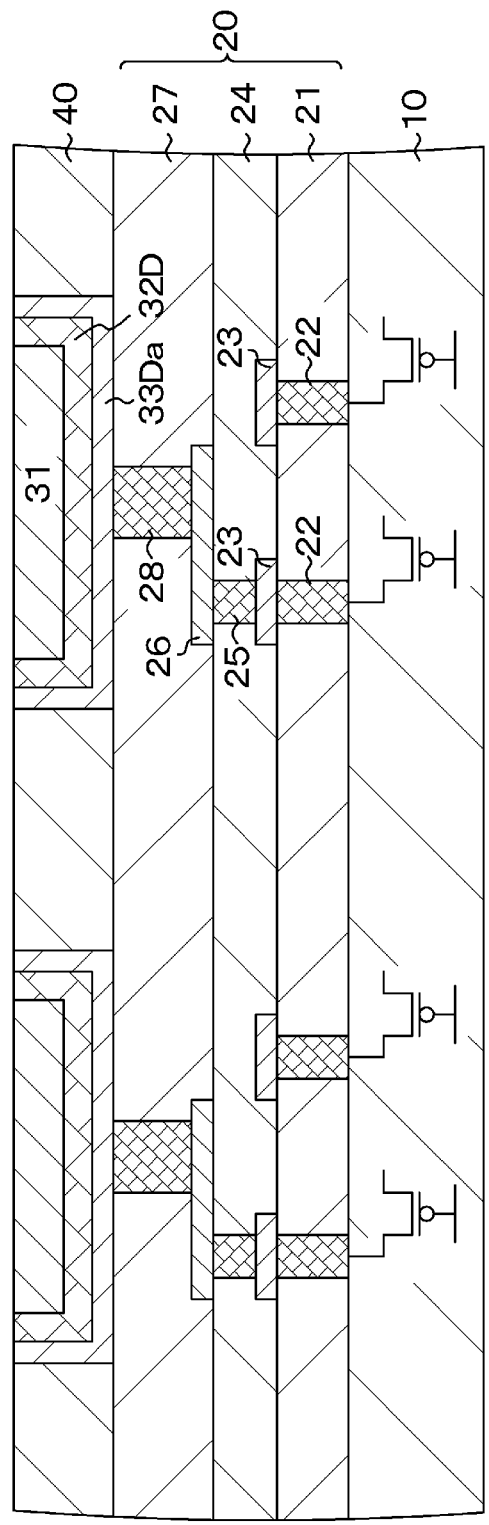
FIG. 23 is a schematic partial end view for explaining a method for manufacturing the display device according to the fourth modification example of the first embodiment, following FIG. 22.

After that, a transparent conductive material layer 33Da' composed of, for example, ITO, a conductive material layer 32D' composed of titanium nitride, and a metal material layer 31' composed of aluminum are sequentially layered (see FIG. 22). Then, unnecessary transparent conductive material layer 33Da', conductive material layer 32D', and metal material layer 31' on the insulating layer 40 are removed using, for example, CMP (Chemical Mechanical Polish) (see FIG. 23).

[Step-130D]

Figure 24:
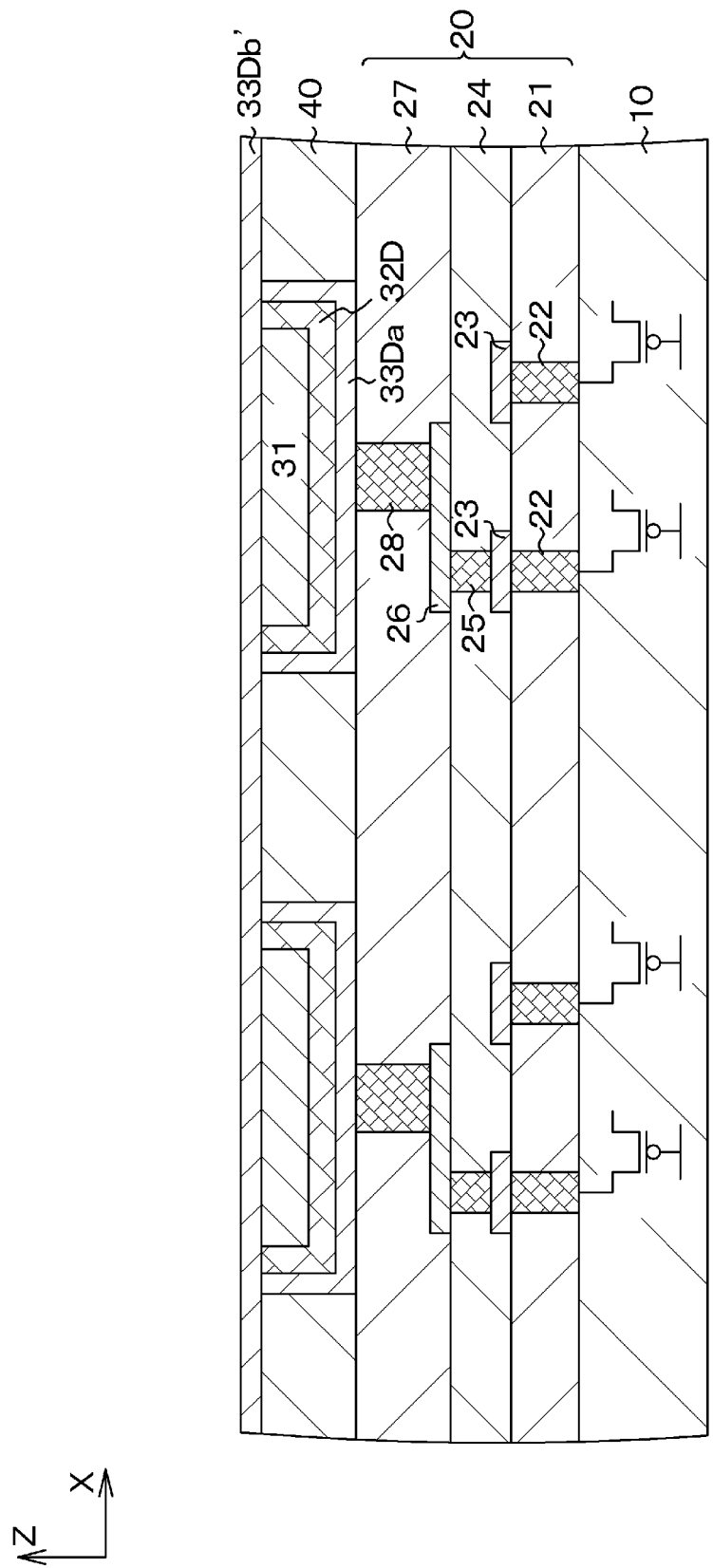
FIG. 24 is a schematic partial end view for explaining a method for manufacturing the display device according to the fourth modification example of the first embodiment, following FIG. 23.

After that, a transparent conductive material layer 33Db' composed of, for example, ITO is formed on the entire surface (see FIG. 24). Subsequently, the transparent electrodes 33Db provided on the light reflecting films 31 are formed using a well-known patterning technique such as lithography and etching (see FIG. 25).

[Step-140D]

After that, the display device 1D can be obtained by performing the above-mentioned [Step-150] to [Step-160].

In the fourth modification example, conduction with the transparent electrode can be ensured not only on the side wall portion of the light reflecting film 31 but also on the bottom surface thereof. Therefore, stable contact resistance can be ensured.

The fourth modification example has been described above. Subsequently, the fifth modification example will be described.

Figure 26:
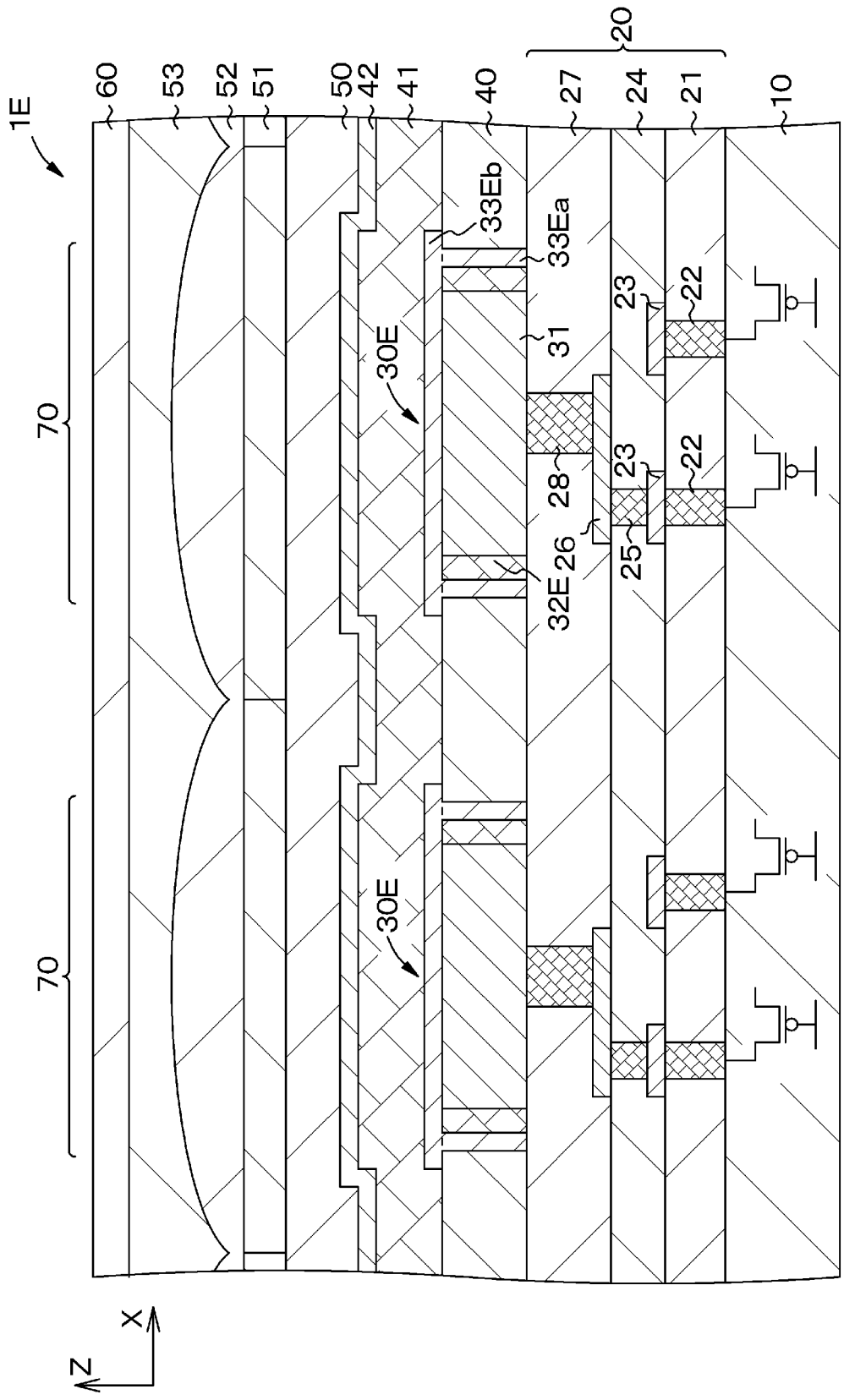
FIG. 26 is a schematic partial cross-sectional view of a portion including pixels in the pixel array section of the display device according to a fifth modification example.

FIG. 26 is a schematic partial cross-sectional view of a portion including pixels in the pixel array section of the display device according to the fifth modification example.

In a display device 1E of the fifth modification, the first electrodes 30E have a damascene structure selectively embedded in the insulating layer 40 in a predetermined pattern. However, the vias 28 and the light reflecting films 31 are in direct contact with each other.

Hereinafter, a method for manufacturing the display device 1E will be described with reference to the figures.

[Step-100E]

Figure 21:
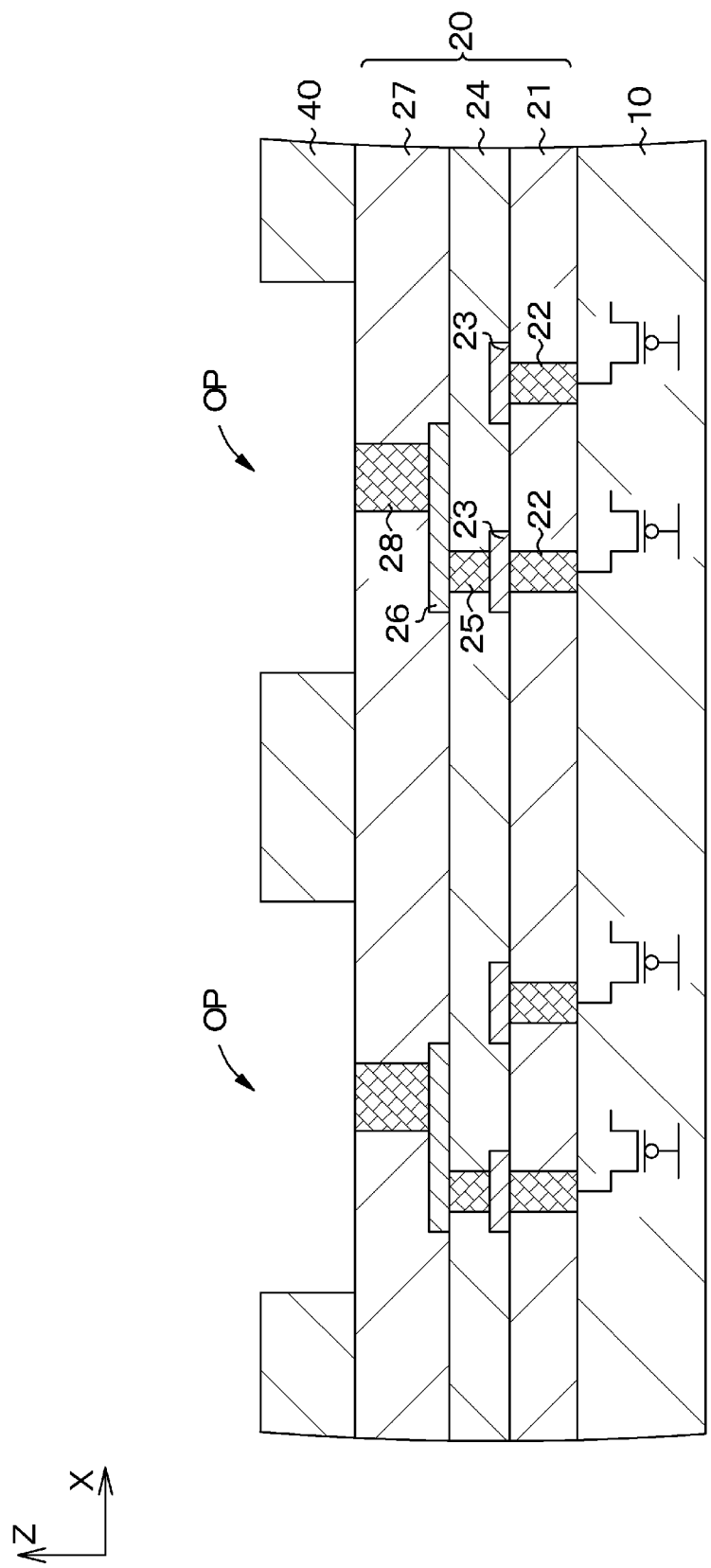
FIG. 21 is a schematic partial end view for explaining a method for manufacturing the display device according to the fourth modification example of the first embodiment.

The above-mentioned [Step-100D] and [Step-110D] are performed to form an insulating layer 40 on the entire surface of the insulating layer 27 including the vias 28, and the openings OP are formed so that the vias 28 are exposed at the bottom (see FIG. 21).

[Step-110E]

Figure 27:
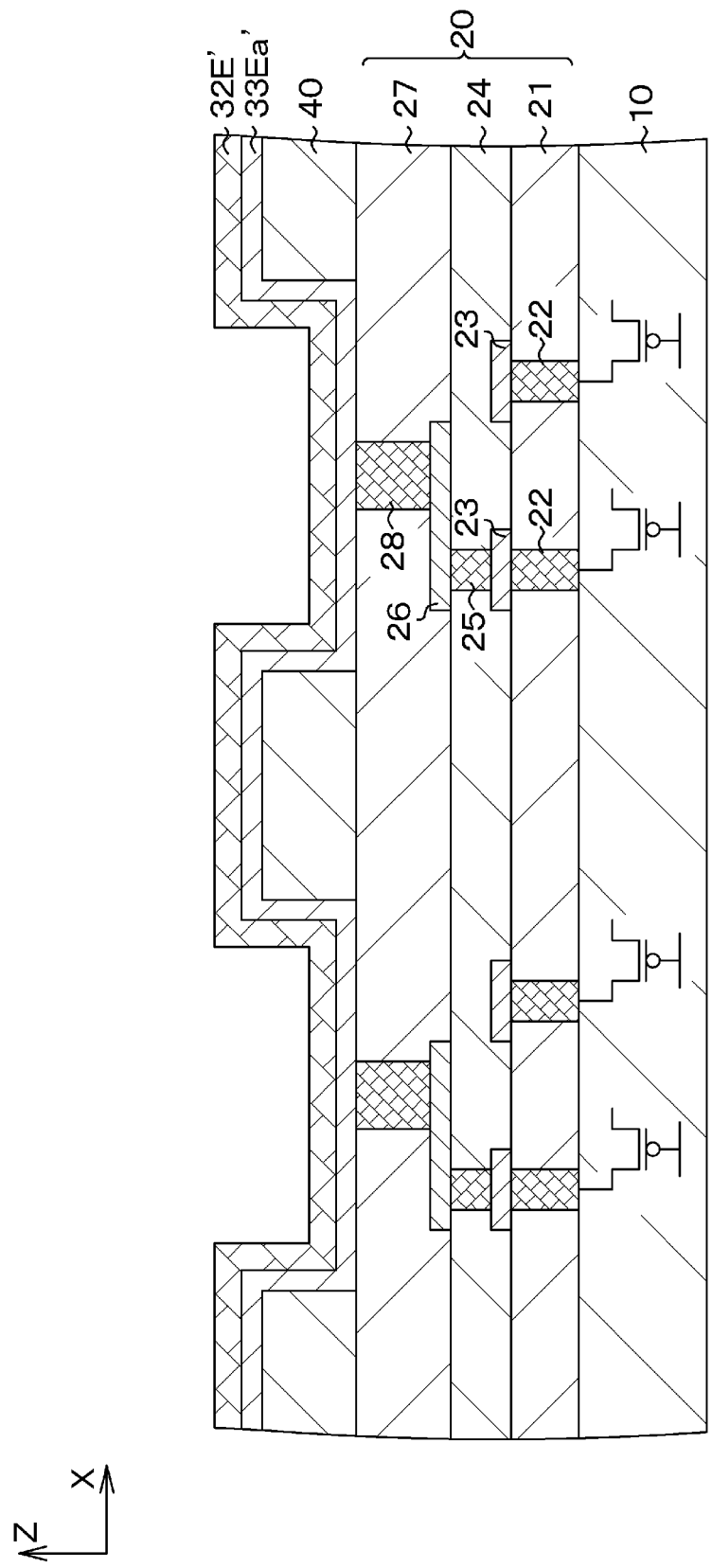
FIG. 27 is a schematic partial end view for explaining a method for manufacturing the display device according to the fifth modification example of the first embodiment.
Figure 28:
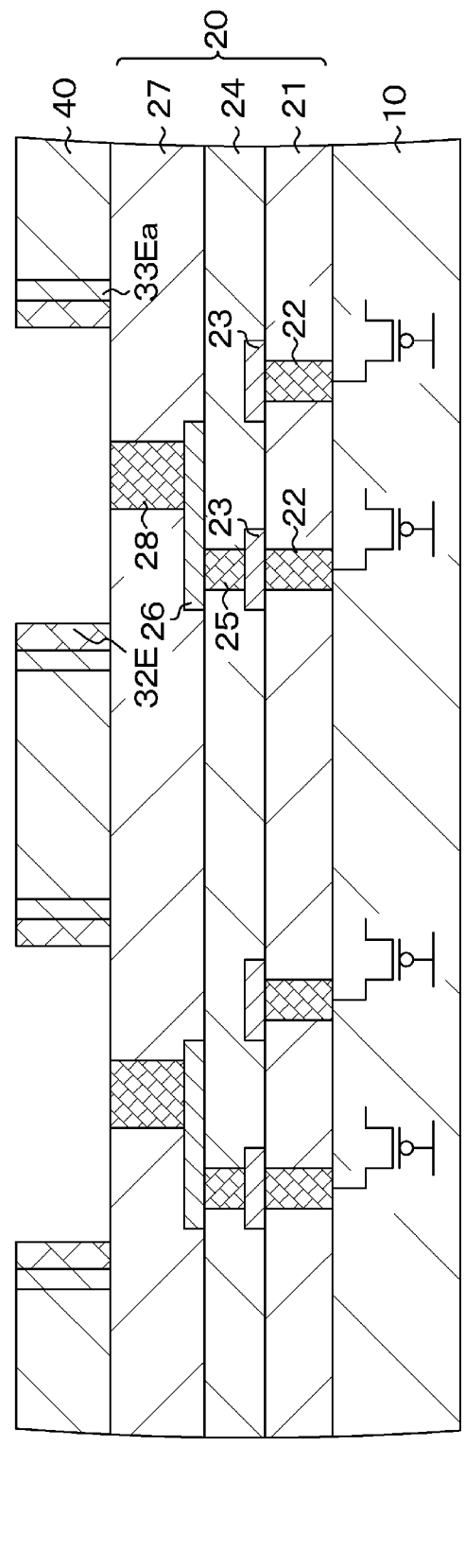
FIG. 28 is a schematic partial end view for explaining a method for manufacturing the display device according to the fifth modification example of the first embodiment, following FIG. 27.

After that, a transparent conductive material layer 33Ea' composed of, for example, ITO and a conductive material layer 32E' composed of titanium nitride are sequentially layered (FIG. 27). Next, etch-back is performed using a well-known patterning technique such as lithography and etching to leave a transparent conductive material layer 33Ea' and the conductive material layer 32E' composed of titanium nitride only on the side wall portion of the openings OP (see FIG. 28).

[Step-120E]

Figure 29:
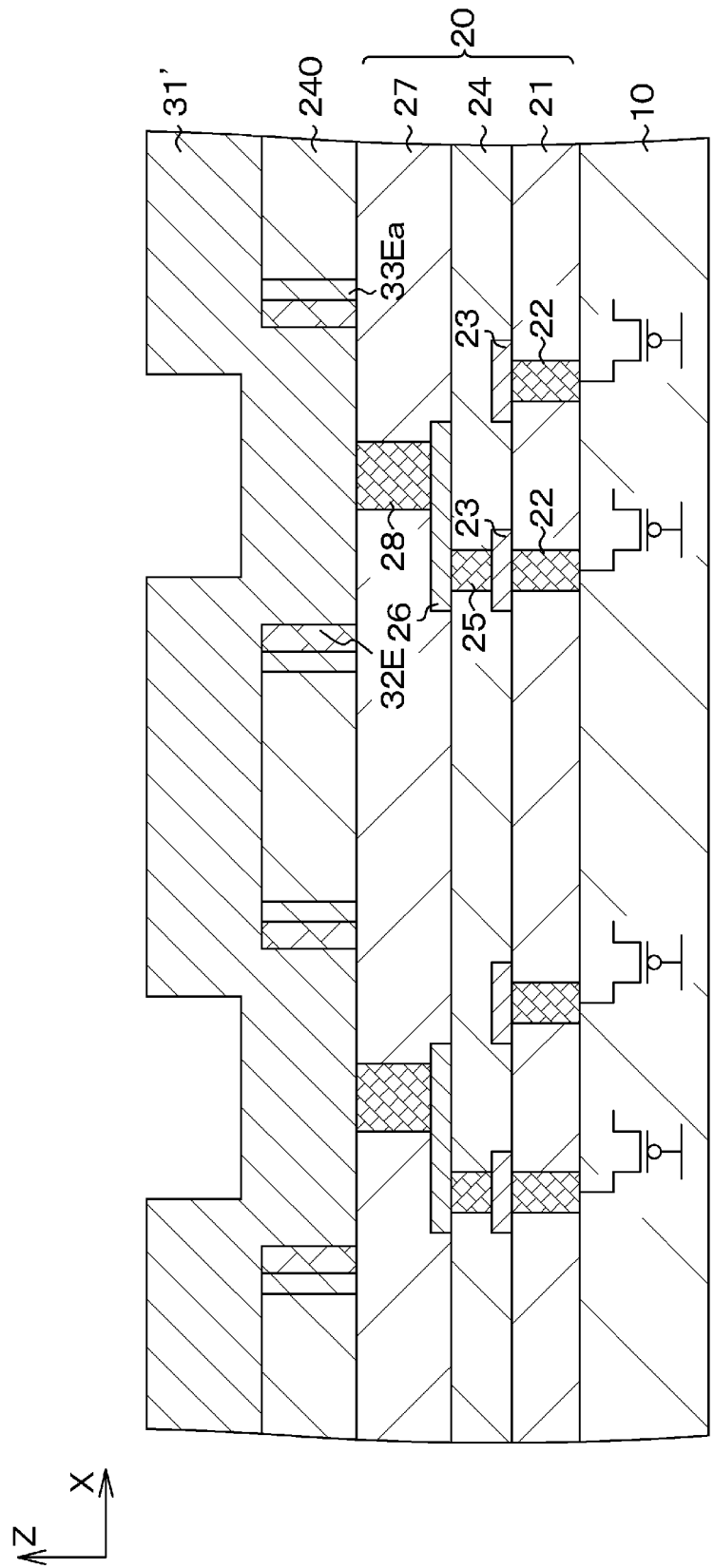
FIG. 29 is a schematic partial end view for explaining a method for manufacturing the display device according to the fifth modification example of the first embodiment, following FIG. 28.
Figure 30:
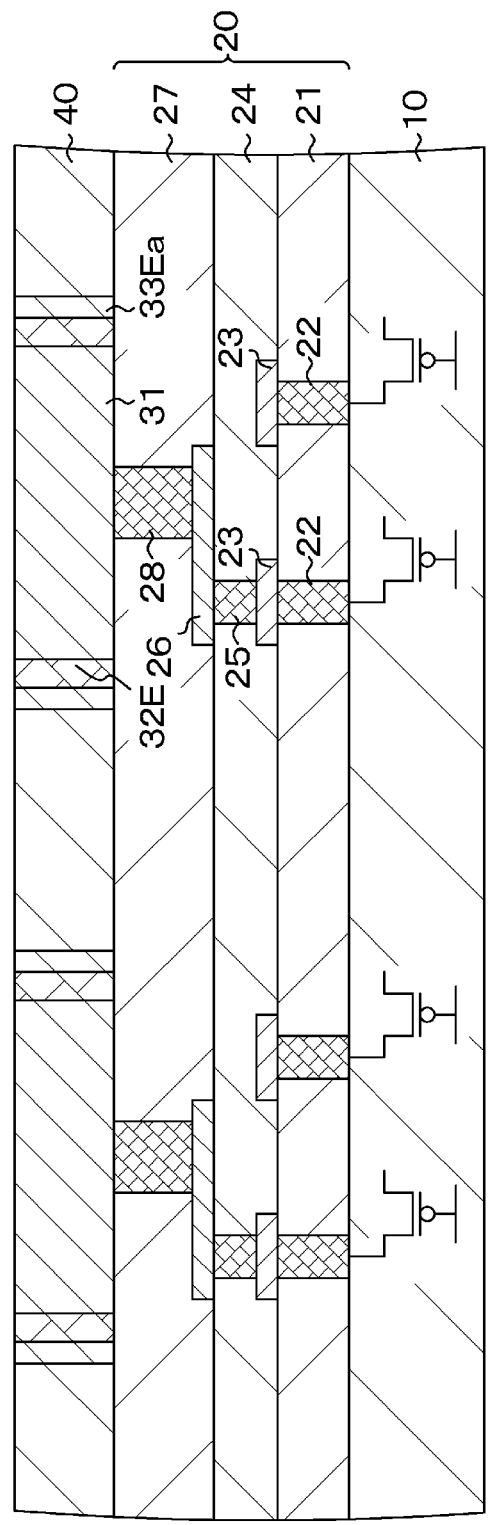
FIG. 30 is a schematic partial end view for explaining a method for manufacturing the display device according to the fifth modification example of the first embodiment, following FIG. 29.

After that, the metal material layer 31' composed of aluminum is layered (see FIG. 29). Then, the unnecessary metal material layer 31' on the insulating layer 40 is removed using, for example, CMP (see FIG. 30).

[Step-130E]

Figure 25:
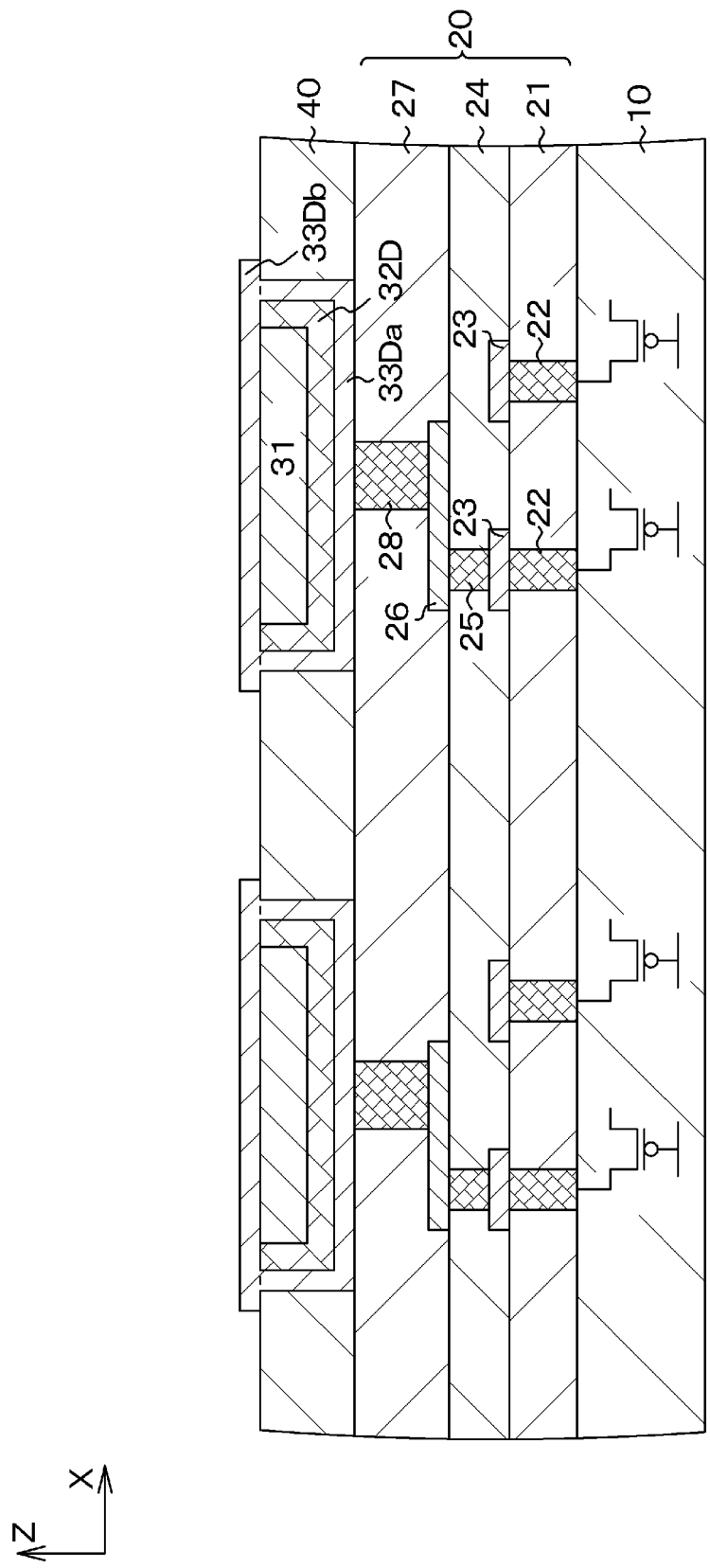
FIG. 25 is a schematic partial end view for explaining a method for manufacturing the display device according to the fourth modification example of the first embodiment, following FIG. 24.

After that, a transparent conductive material layer 33Eb' composed of, for example, ITO is formed on the entire surface. Subsequently, transparent electrodes 33Eb provided on the light reflecting films 31 are formed using a well-known patterning technique such as lithography and etching. This process is essentially the same as illustrated by FIGS. 24 and 25, so the figures are omitted.

[Step-140E]

After that, the display device 1E can be obtained by performing the above-mentioned [Step-150] to [Step-160].

The fifth modification example has been described above. Subsequently, the sixth modification example will be described.

Figure 31:
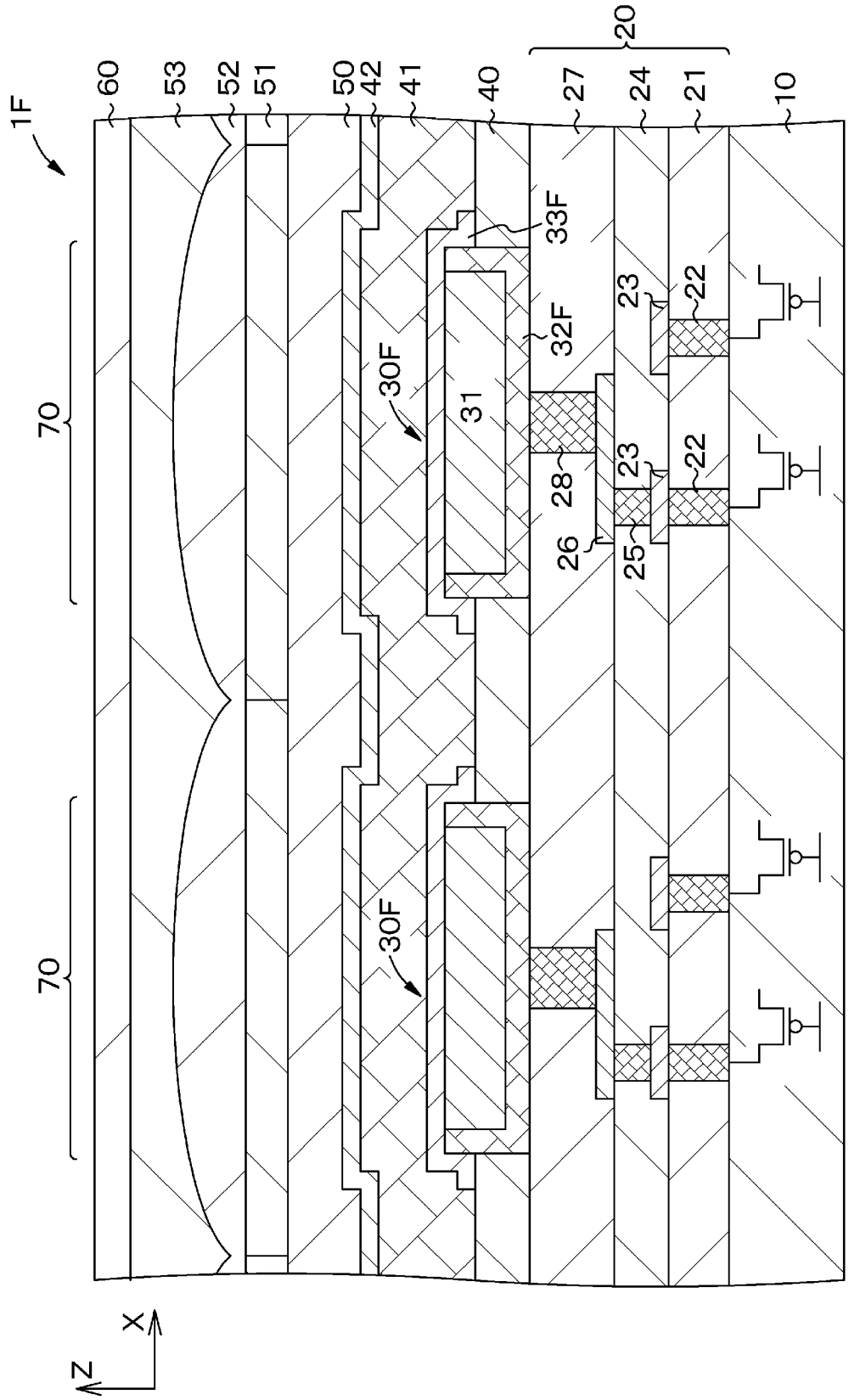
FIG. 31 is a schematic partial cross-sectional view of a portion including pixels in the pixel array section of the display device according to a sixth modification example.

FIG. 31 is a schematic partial cross-sectional view of a portion including pixels in the pixel array section of the display device according to the sixth modification example.

In the display device 1F of the sixth modification example, the first electrodes 30F have a damascene structure selectively embedded in the insulating layer 40 in a predetermined pattern. By thinning the insulating layer 40, a structure is obtained in which the light reflecting film 31 and the transparent electrode 33F are well connected on the side wall of the first electrode 30F.

Hereinafter, a method for manufacturing the display device 1F will be described with reference to the figures.

[Step-100F]

The above-mentioned [Step-100D] and [Step-110D] are performed to form an insulating layer 40 on the entire surface of the insulating layer 27 including the vias 28, and the openings OP are formed so that the vias 28 are exposed at the bottom (see FIG. 21).

[Step-110F]

Figure 32:
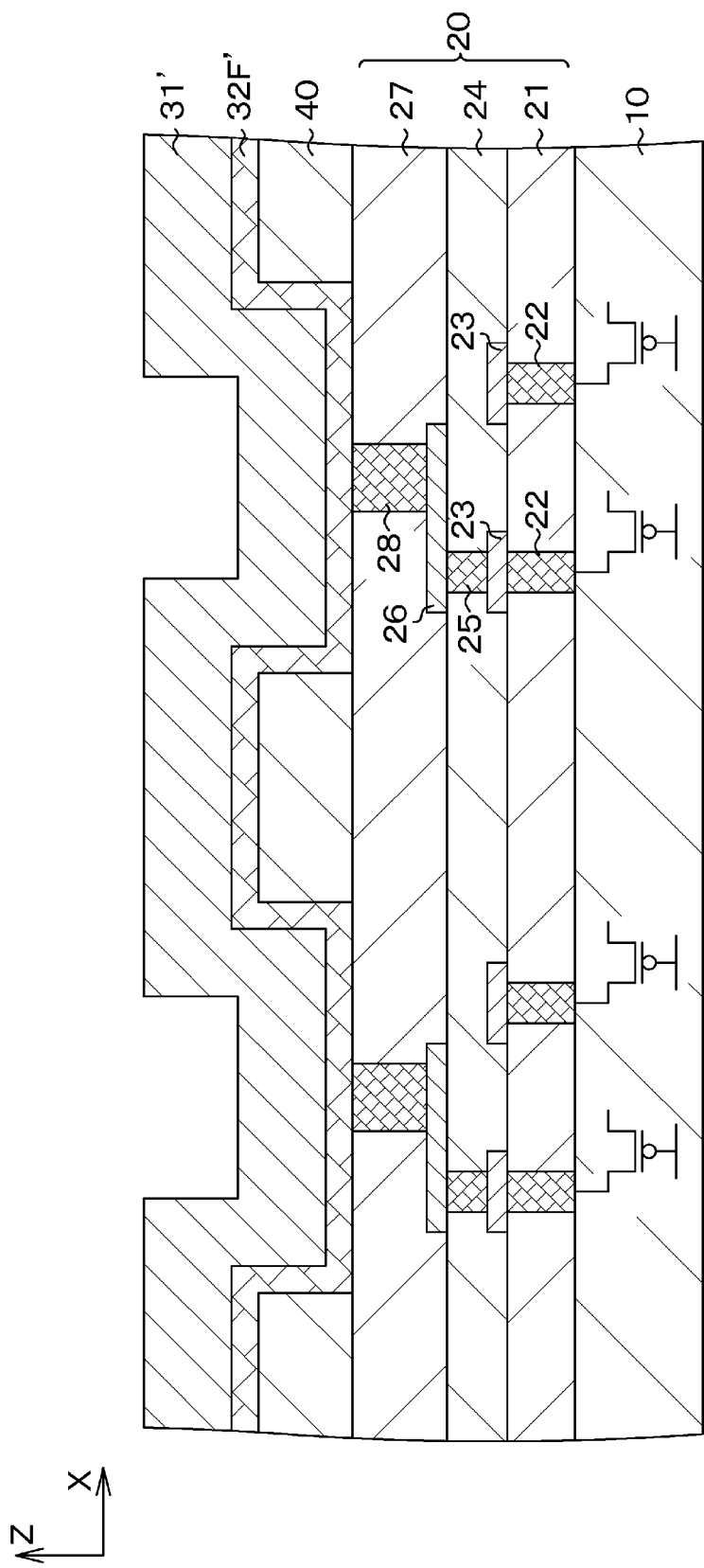
FIG. 32 is a schematic partial end view for explaining a method for manufacturing the display device according to the sixth modification example of the first embodiment.
Figure 33:
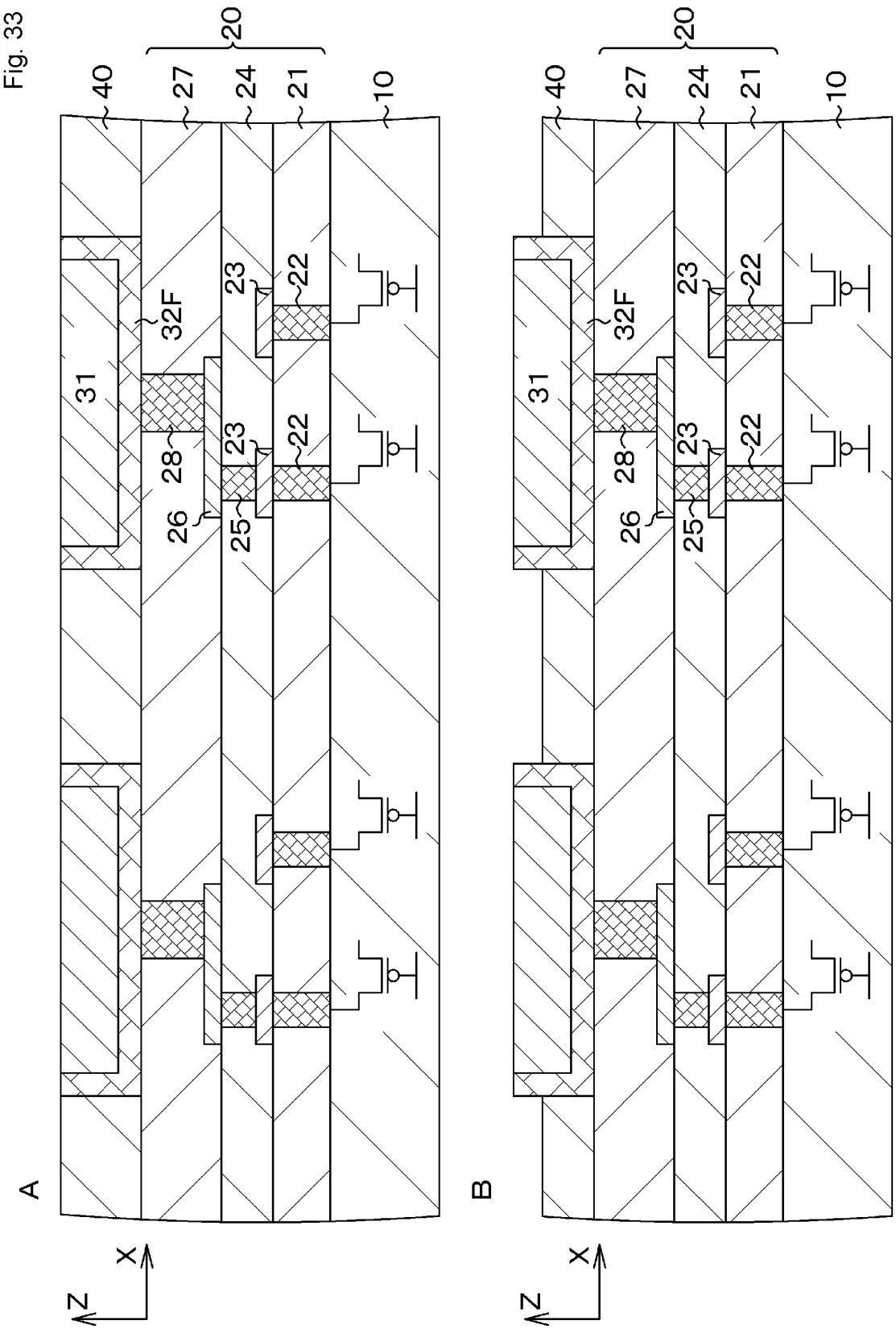
FIGS. 33A and 33B are schematic partial end views for explaining a method for manufacturing the display device according to the sixth modification example of the first embodiment, following FIG. 32.

Then, a conductive material layer 32F made of, for example, titanium nitride and the metal material layer 31' made of aluminum are sequentially layered (see FIG. 32). Then, the unnecessary metal material layer 31' on the insulating layer 40 is removed using, for example, CMP (see FIG. 33A).

[Step-120F]

After that, a dry etching process is performed to thin the insulating layer 40. As a result, the conductive portions 32F are exposed on the side wall of the light reflecting films 31 (see FIG. 33B). The degree of thinning may be set, as appropriate, according to the thickness of the light reflecting films 31 and the like.

[Step-130F]

Figure 34:
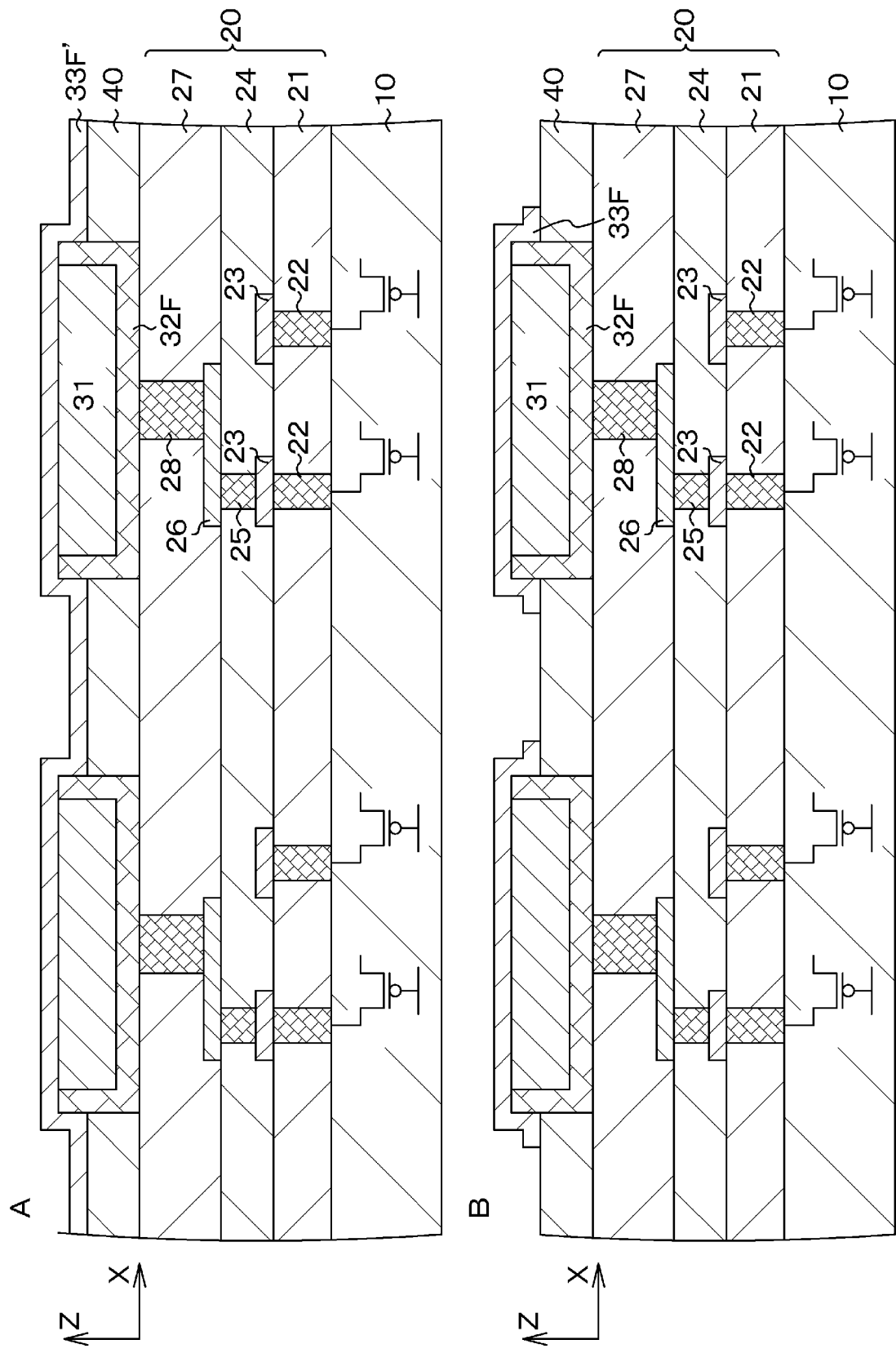
FIGS. 34A and 34B are schematic partial end views for explaining a method for manufacturing the display device according to the sixth modification example of the first embodiment, following FIG. 33B.

Next, a transparent conductive material layer 33F' composed of, for example, ITO is formed (see FIG. 34A). Subsequently, transparent electrodes 33F provided on the light reflecting films 31 are formed using a well-known patterning technique such as lithography and etching (see FIG. 34B).

[Step-140F]

After that, the display device 1F can be obtained by performing the above-mentioned [Step-150] to [Step-160].

The sixth modification example has been described above. In the first embodiment including various modification examples described above, the conductive portions that are conductive with the transparent electrodes are provided on the side wall surface side of the light reflecting films. As a result, good conduction can be ensured between the light reflecting films and the transparent electrodes. Also, a voltage can be satisfactorily supplied to the first electrodes through the vias connected to the light reflecting films.

Second Embodiment

The second embodiment also relates to a display device and a method for manufacturing the display device, and an electronic device according to the present disclosure.

Figure 35:
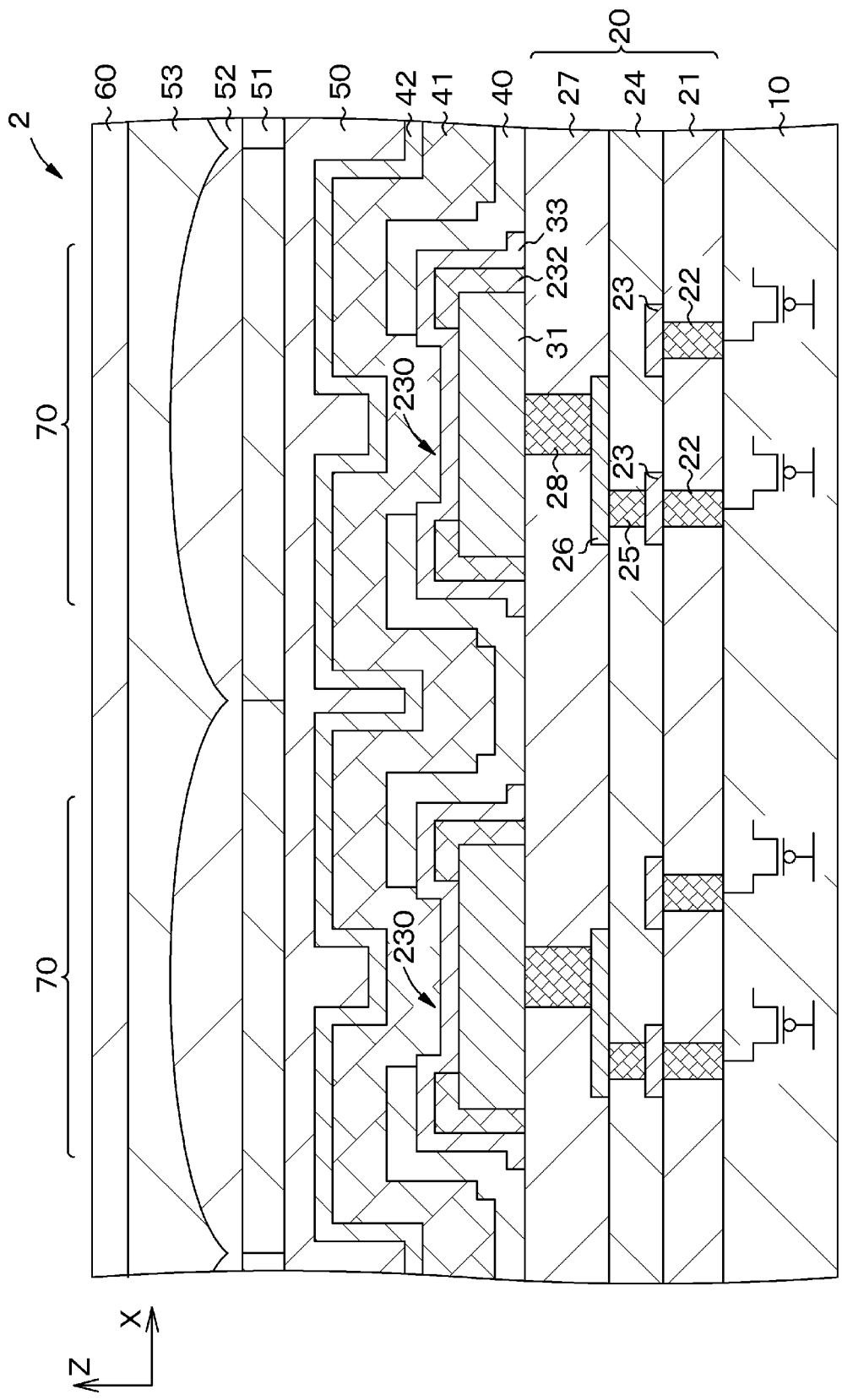
FIG. 35 is a schematic partial cross-sectional view of a portion including pixels in the pixel array section of the display device according to a second embodiment.

FIG. 35 is a schematic partial cross-sectional view of a portion including pixels in the pixel array section of the display device according to the second embodiment.

In the first embodiment, conductive portions that are conductive with the transparent electrodes are provided on the side wall surface side of the light reflecting films. By contrast, in the display device 2A according to the second embodiment, conductive portions 232 that are conductive with the transparent electrodes 33 are provided on the upper surface of the light reflecting films 31 located on the transparent electrode 33 side. Further, as will be described hereinbelow, the partition wall portion 40 is formed between adjacent first electrodes 233, and a part of the upper surface of the transparent electrode 33 constituting the first electrode 233 is covered with the partition wall portion 40. The conductive portion 232 is arranged so as to overlap the region where the transparent electrode 33 is covered by the partition wall portion 40.

A method for manufacturing a display device 2 includes a step of forming vias in portions of an insulating layer in which pixels are to be arranged, a step of forming conductive light reflecting films on the insulating layer including the vias, and a step of forming transparent electrodes on the light reflecting films, and further includes a step of providing conductive portions conductive with the transparent electrodes on the surface of the light reflecting films on the transparent electrode side.

Hereinafter, the method for manufacturing the display device 2 will be described with reference to the figures.

[Step-200]

Figure 36:
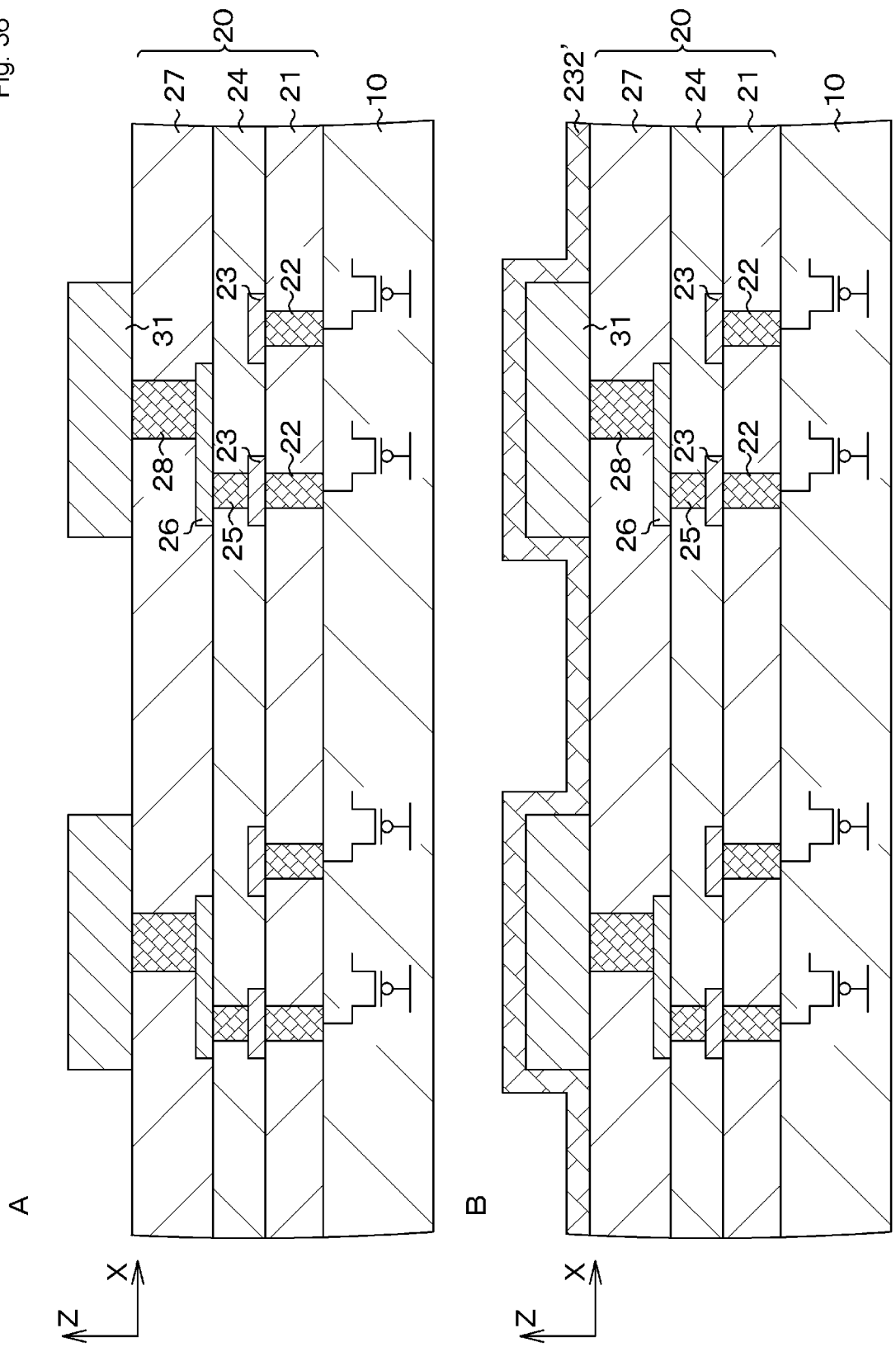
FIGS. 36A and 36B are schematic partial end views for explaining a method for manufacturing the display device according to the second embodiment.

The above-mentioned [Step-100] and [Step-110] are performed to form the light reflecting films 31 at the portions where the pixels should be arranged (see FIG. 36A).

[Step-210]

Next, the conductive portions 232 are provided on the upper surface of the light reflecting films 31 located on the transparent electrode side. First, a conductive material layer 232' constituting the conductive portions 232 is formed on the entire surface including the light reflecting films 31 (see FIG. 36B). Here, titanium nitride having a film thickness of 50 nanometers was formed as the conductive material layer 232'.

[Step-220]

Figure 37:
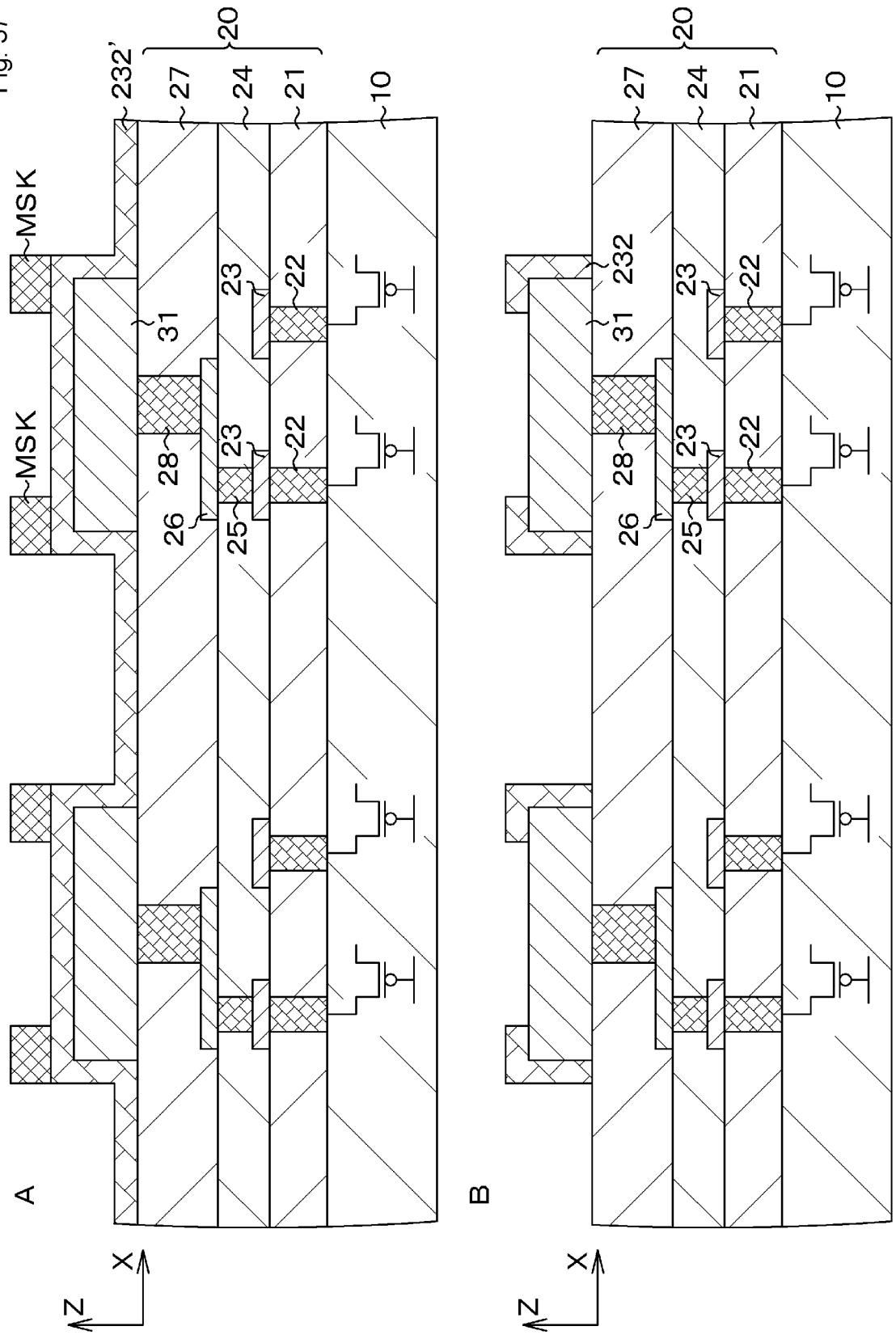
FIGS. 37A and 37B are schematic partial end views for explaining a method for manufacturing the display device according to the second embodiment, following FIG. 36B.

Next, a mask MSK is formed on a predetermined portion on the conductive material layer 232' (see FIG. 37A). The mask MSK is formed so as to leave the conductive material layer 232' positioned on the upper surface and the side wall portion of the light reflecting films 31. Then, well-known patterning by etching or the like is performed to form the conductive portions 232 (see FIG. 37B). Here, the conductive portions 232 are formed so as to remain with a width of 100 nanometers from the edge of the upper surface of the light reflecting films 31.

[Step-230]

Figure 38:
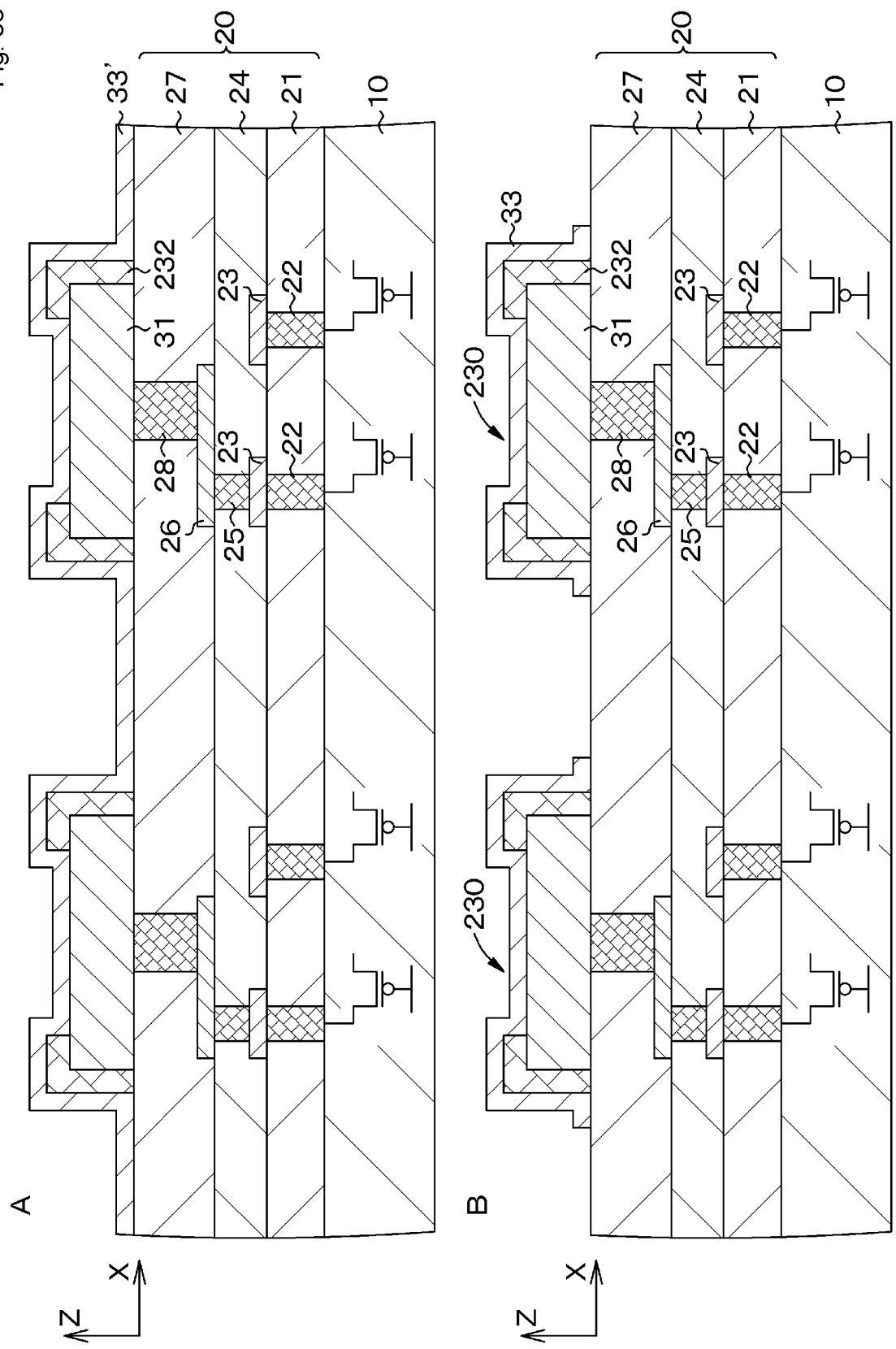
FIGS. 38A and 38B are schematic partial end views for explaining a method for manufacturing the display device according to the second embodiment, following FIG. 37B.

After that, the transparent conductive material layer 33' composed of, for example, ITO is formed on the entire surface (see FIG. 37A). Subsequently, the first electrodes 230 are obtained by forming the transparent electrodes 33 provided on the light reflecting films 31 by using a well-known patterning technique such as lithography and etching (see FIG. 38B). By forming the transparent electrodes 33 so as to cover the conductive portions 232 and the light reflecting films 31, the light reflecting films 31 and the transparent electrodes 33 are advantageously electrically connected through the conductive portions 232.

[Step-240]

Figure 39:
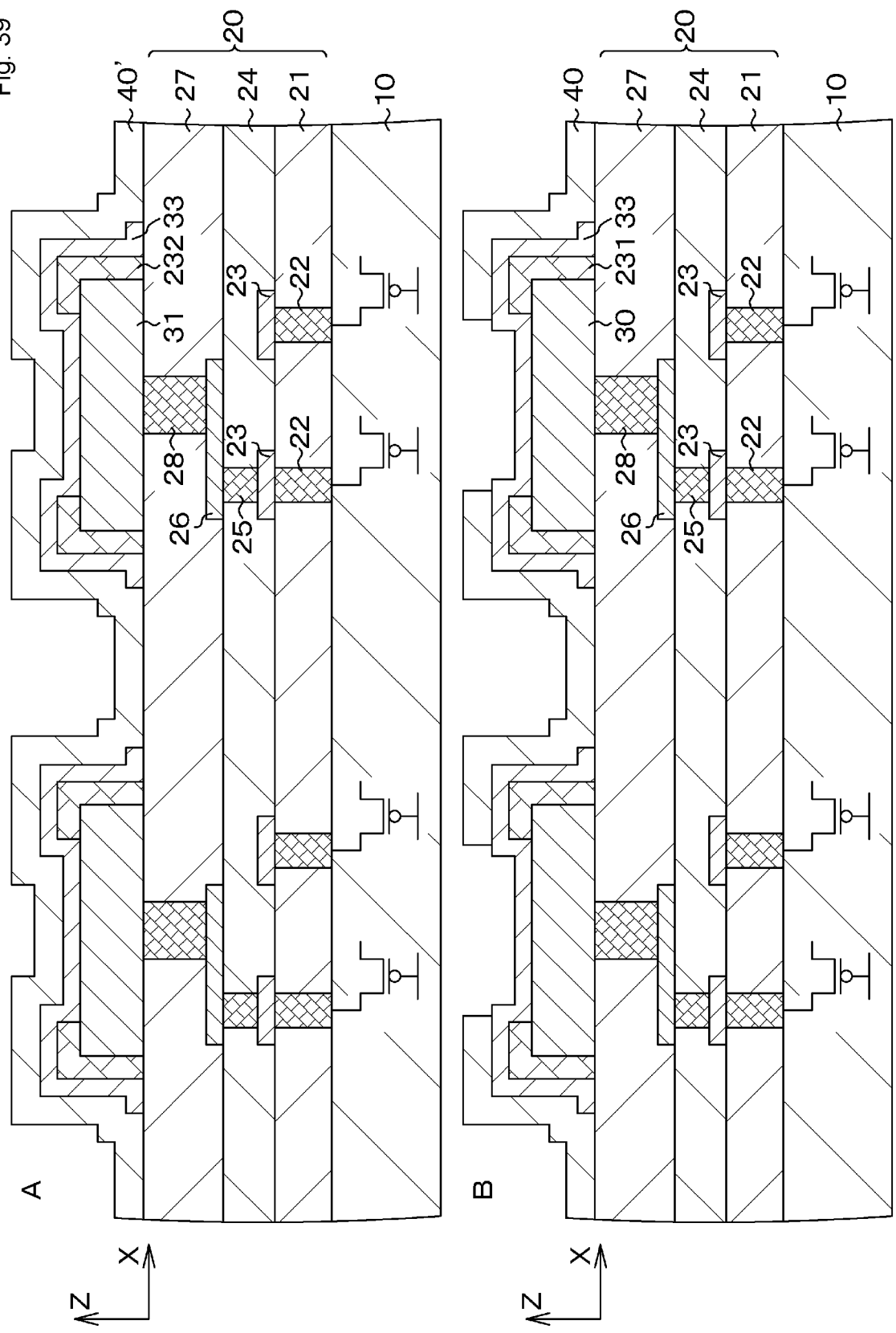
FIGS. 39A and 39B are schematic partial end views for explaining a method for manufacturing the display device according to the second embodiment, following FIG. 38B.

Next, partition wall portions 40 are formed between the adjacent first electrodes 230. First, the insulating material layer 40' constituting the partition wall portions 40 is formed on the entire surface including the first electrodes 230 (see FIG. 39A). Here, a $SiN_x$ film having a film thickness of 100 nanometers was formed as the insulating material layer 40'. Subsequently, the partition wall portions 40 can be formed by patterning the insulating material layer 40' by using a well-known patterning technique such as lithography and etching to expose the upper surface of the first electrodes 230 (see FIG. 39B).

The opening portion of the partition wall portion 40 was set to be 100 nanometers inside from the end portion of the light reflecting film 31. That is, the partition wall portion 40 overlaps by 100 nanometers on the light reflecting film 31. Therefore, the conductive portion 232 is covered with the partition wall portion 40.

FIGS. 40A, 40B, and 40C are schematic plan views for explaining the arrangement relationship of the partition wall portion arranged between the adjacent first electrodes, the light reflecting film included in the first electrode, and the conductive portion. As shown in the figures, the peripheral portion of the upper surface of the transparent electrode 33 is annularly covered by the partition wall portion 40. The conductive portion 232 is arranged in a continuous annular shape so as to surround the peripheral portion on the upper surface of the transparent electrode 33.

The organic layer emits light at a portion where the partition wall portion 40 is open. Therefore, even if the conductive portion 232 is present under the partition wall portion 40, the light emitting characteristics of the organic layer and the function of the light reflecting layer are not particularly adversely affected.

[Step-250]

After that, the display device 2 can be obtained by performing the above-mentioned [Step-150] to [Step-160].

The second embodiment can also be modified in various ways. Hereinafter, modification examples of the second embodiment will be described.

Figure 41:
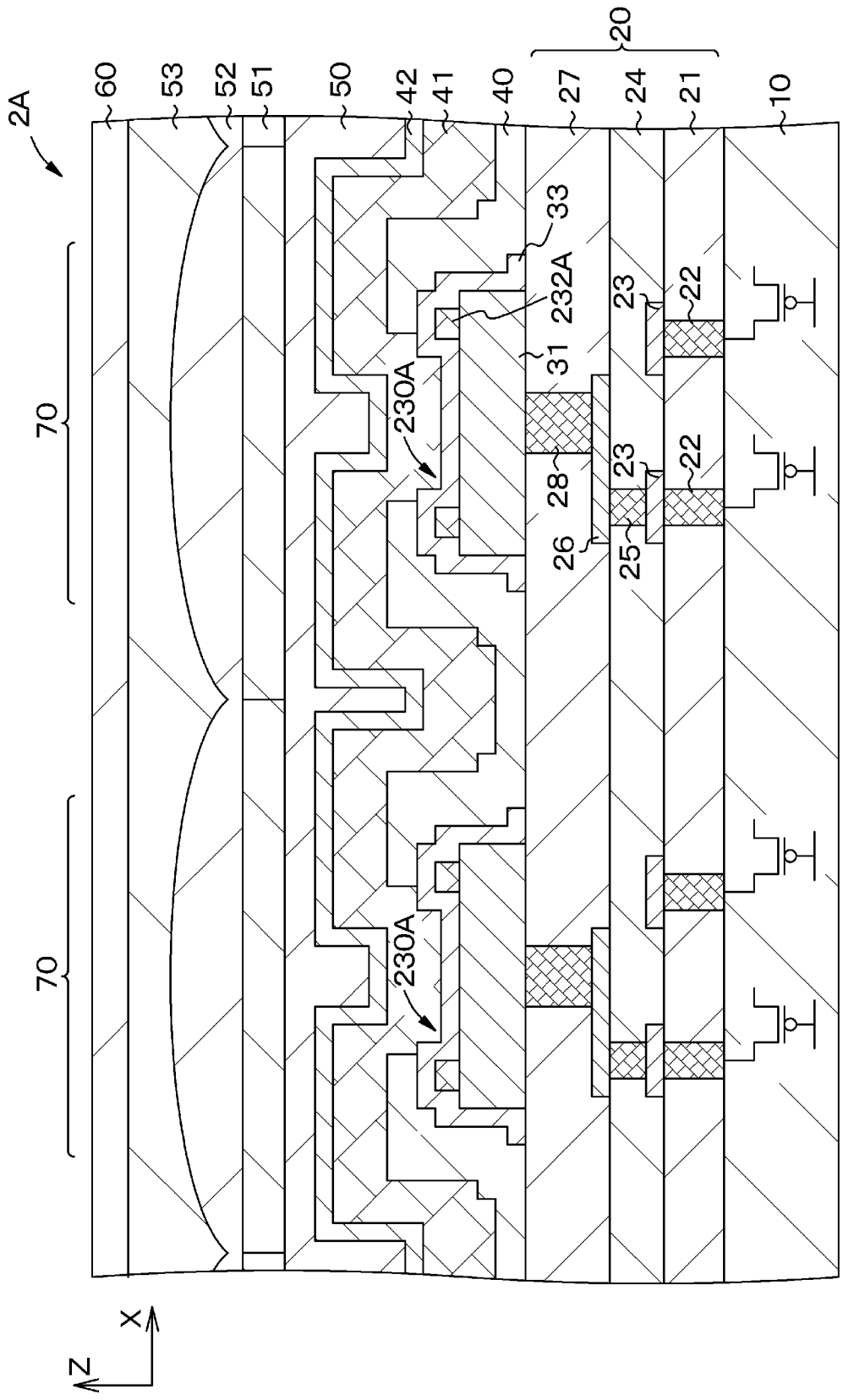
FIG. 41 is a schematic partial cross-sectional view of a portion including pixels in the pixel array section of the display device according to a first modification example.

FIG. 41 is a schematic partial cross-sectional view of a portion including pixels in the pixel array section of the display device according to the first modification example.

In the display device 2 described above, the conductive portion 232 was formed so as to leave the conductive material layer 232' of the upper surface and the side wall portion of the light reflecting film 31. The display device 2A according to the first modification example is mainly different in that the conductive portion 232A is formed only on the upper surface of the light reflecting film 31.

Hereinafter, a method for manufacturing the display device 2A will be described with reference to the figures.

[Step-200A]

First, similarly to the above-mentioned [Step-200], the light reflecting films 31 are formed at the portions where the pixels should be arranged (see FIG. 36A).

[Step-210A]

Figure 42:
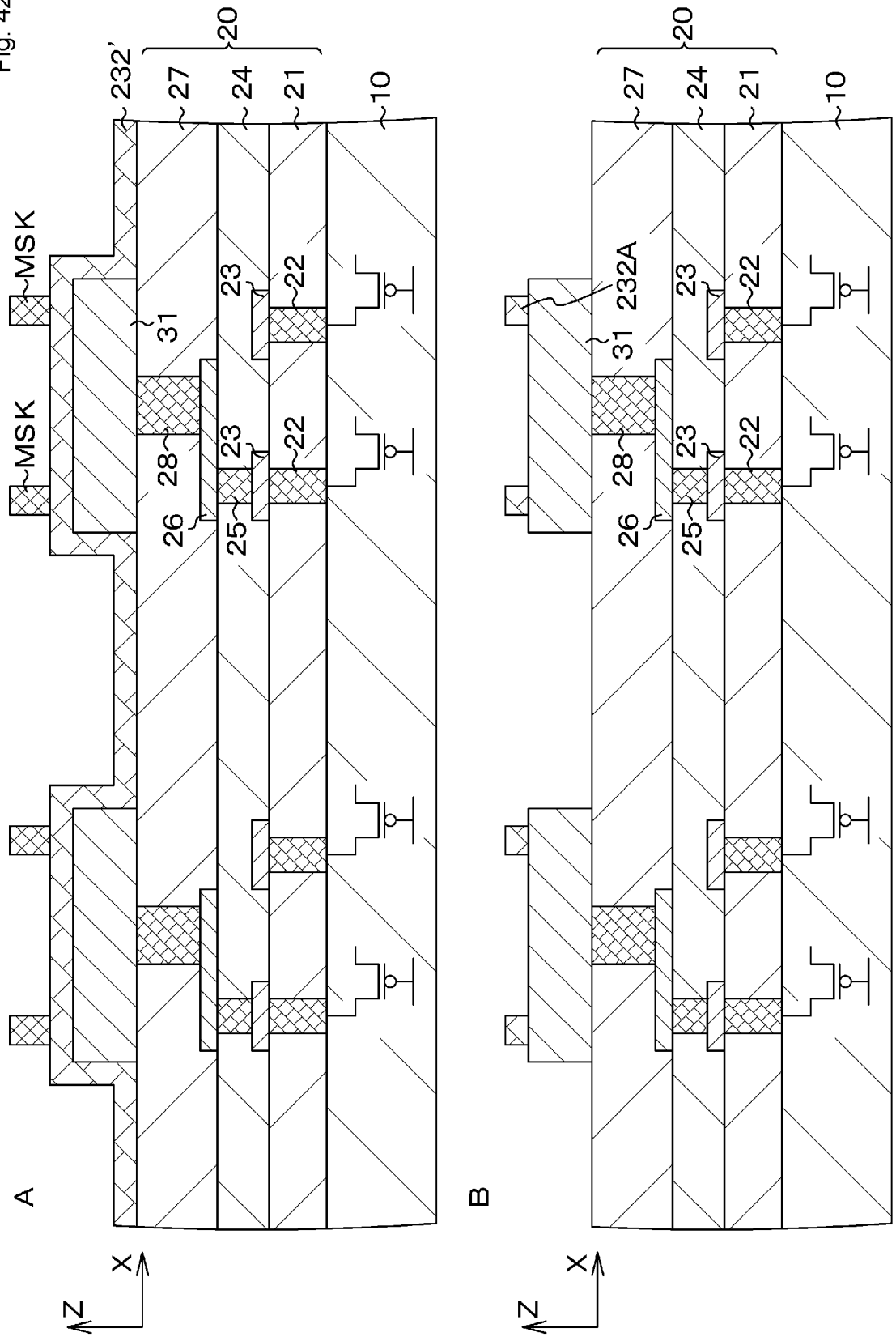
FIGS. 42A and 42B are schematic partial end views for explaining a method for manufacturing the display device according to the first modification example of the second embodiment.

Next, conductive portions 232A are provided on the upper surface of the light reflecting films 31 located on the transparent electrode side. First, the conductive material layer 232' constituting the conductive portion 232A is formed on the entire surface including the light reflecting films 31. This process is basically the same as in FIG. 36B, so the figure is omitted. Next, a mask MSK is formed on predetermined portions on the conductive material layer 232' (see FIG. 42A). The mask MSK is formed so as to leave the conductive material layer 232' on the upper surface of the light reflecting films 31. Then, a well-known patterning by etching or the like is performed to form the conductive portions 232A (see FIG. 42B).

[Step-220A]

After that, the display device 2A can be obtained by performing the above-mentioned [Step-230] to [Step-250].

In the display device 2A, the conductive portion 232A is also configured to be covered by the partition wall portion 40.

FIGS. 43A, 43B, and 43C are schematic plan views for explaining the arrangement relationship of the partition wall portion arranged between the adjacent first electrodes, the light reflecting film included in the first electrode, and the conductive portion. As shown in the figures, the peripheral portion of the upper surface of the transparent electrode 33 is annularly covered by the partition wall portion 40. The conductive portion 232A is arranged in a continuous annular shape along the peripheral portion of the upper surface of the transparent electrode 33. The conductive portion 232A may be arranged discretely. The arrangement relationship in such a case is shown in FIGS. 44A, 44B, and 44C.

Third Embodiment

The third embodiment also relates to a display device, a method for manufacturing the display device, and an electronic device according to the present disclosure.

Figure 45:
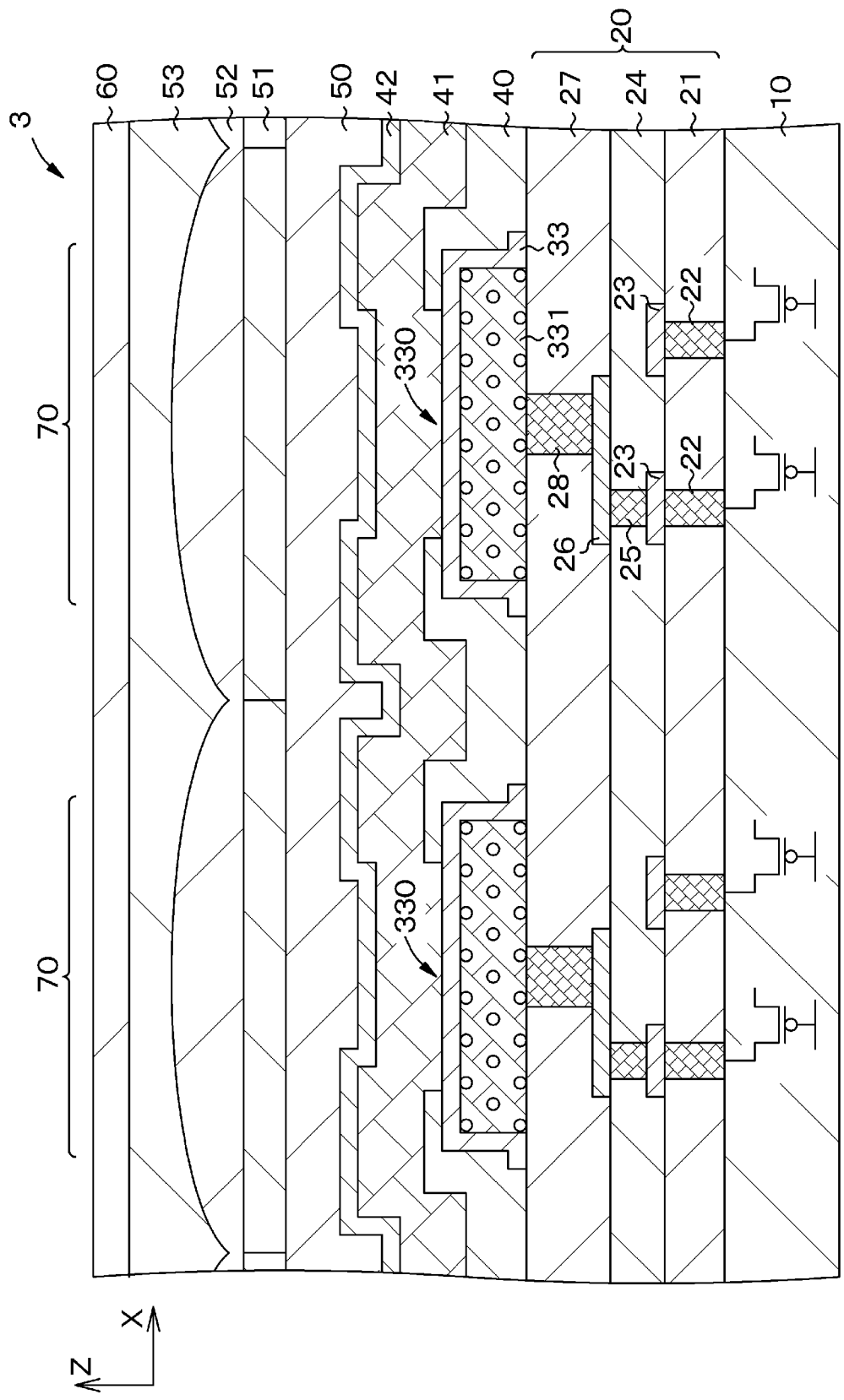
FIG. 45 is a schematic partial cross-sectional view of a portion including pixels in the pixel array section of the display device according to a third embodiment.

FIG. 45 is a schematic partial cross-sectional view of a portion including pixels in the pixel array section of the display device according to the third embodiment.

In the first embodiment and the second embodiment, the conductive portion that was conductive with the transparent electrode was provided on the light reflecting film. By contrast, in a display device 3 according to the third embodiment, the light reflecting film 331 forming the first electrode 330 is configured of an aluminum-based metal material doped with at least nickel. As a result, insulating aluminum oxide ($Al_2O_3$) is unlikely to be formed on the surface of the light reflecting film. Therefore, good conduction can be ensured between the light reflecting film 331 and the transparent electrode 33 formed on the light reflecting film 331.

A method for manufacturing the display device 2 includes
a step of forming vias in portions of an insulating layer in which pixels are to be arranged,
a step of forming conductive light reflecting films on the insulating layer including the vias, and
a step of forming transparent electrodes on the light reflecting films, and further
the light reflecting films are formed using an aluminum-based metal material doped with at least nickel.

Hereinafter, a method for manufacturing the display device 3 will be described with reference to the figures.

[Step-300]

The above-mentioned [Step-100] is performed to form transistors used for the pixels 70 on the substrate 10, and then forming a wiring layer 20 necessary for driving the pixels (see FIG. 5B).

[Step-310]

Figure 46:
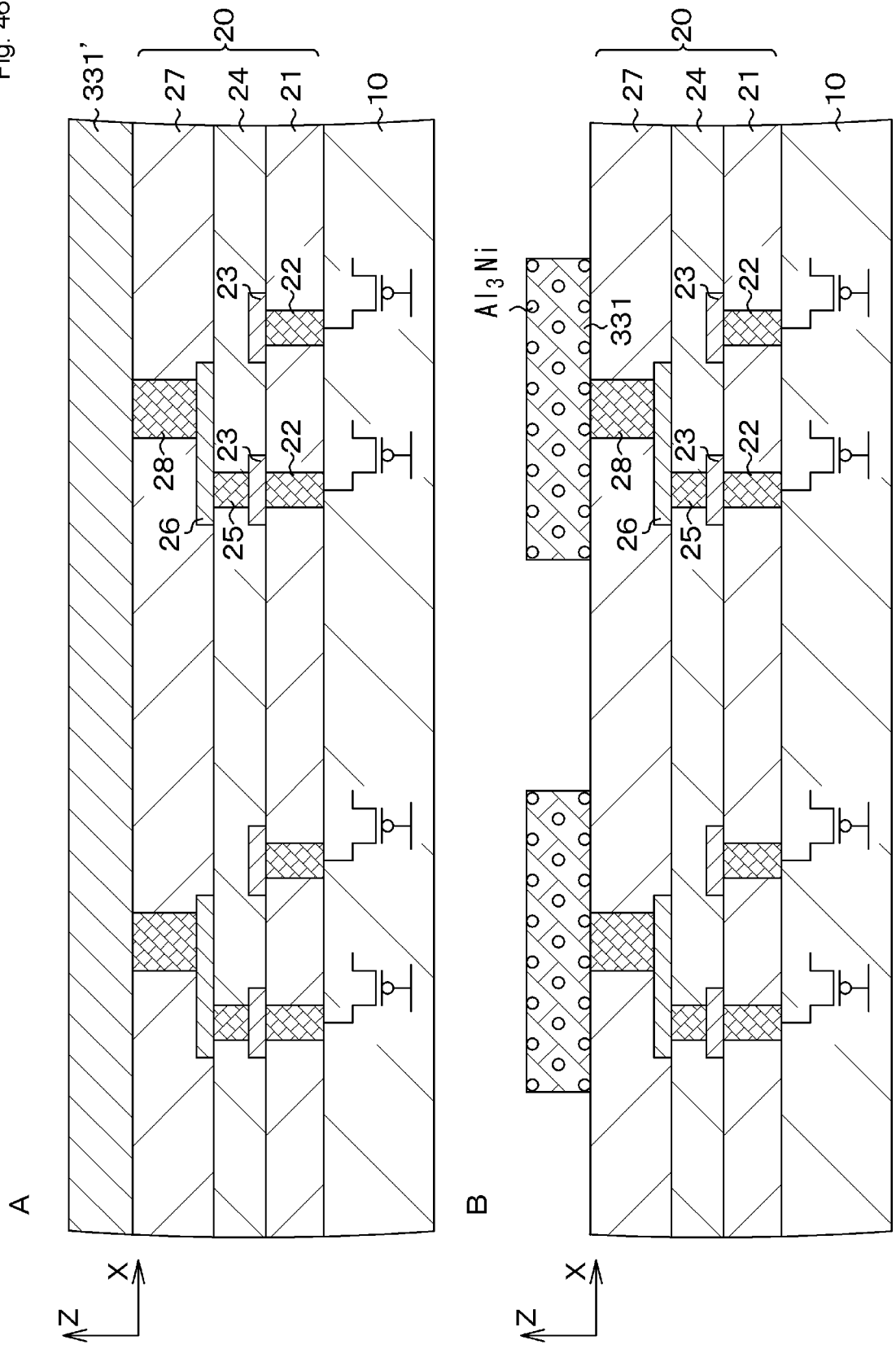
FIGS. 46A and 46B are schematic partial end views for explaining a method for manufacturing the display device according to the third embodiment.

Next, the light reflecting films 331 are formed on the insulating layer 27 including the vias 28. First, the metal material layer 331? constituting the light reflecting films 331 is formed on the entire surface of the insulating layer 27 including the vias 28. Here, as the metal material layer 31', for example, an aluminum-based metal material doped with nickel and boron was used to form a layer having a film thickness of 100 nanometers (see FIG. 46A). Then, the metal material layer 331' is patterned using a well-known patterning technique such as lithography and etching to form the light reflecting films 331 at portions where the pixels should be arranged (see FIG. 46B).

In this series of steps, for example, a thermal history of over 200° C. is added. As an example, an annealing treatment may be performed at 300° C. for 10 min or an ashing treatment at the time of patterning may be performed at 300° C. or higher. By these heat treatments, $Al_3Ni$ is generated in the light reflecting films 331. Since $Al_3Ni$ is not easily oxidized, insulating aluminum oxide ($Al_2O_3$) is unlikely to be formed on the surface of the light reflecting film 331.

[Step-320]

Figure 47:
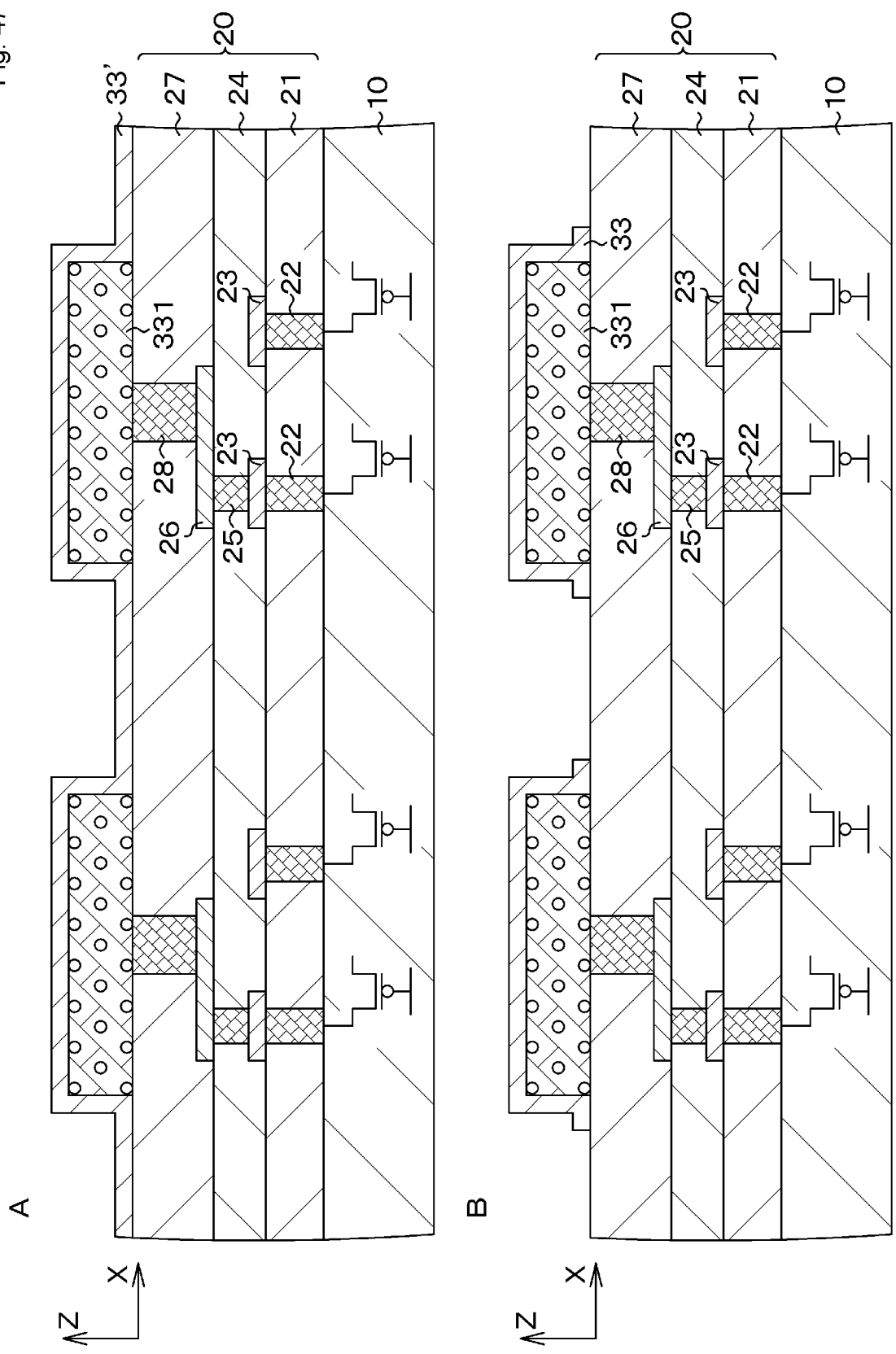
FIGS. 47A and 47B are schematic partial end views for explaining a method for manufacturing the display device according to the third embodiment, following FIG. 46B.

After that, the transparent electrodes 33 are formed on the light reflecting films 331. First, the transparent conductive material layer 33' constituting the transparent electrodes 33 is formed on the entire surface including the light reflecting film 331 (see FIG. 47A). Here, an ITO film having a film thickness of 20 nanometers was formed as the transparent conductive material layer 33'. Subsequently, the transparent conductive material layer 33' is patterned using a well-known patterning technique such as lithography and etching to form transparent electrodes 33 covering the light reflecting films 331 (see FIG. 47B). By the above steps, the first electrodes 330 can be formed.

[Step-330]

After that, the display device 3 can be obtained by performing the above-mentioned [Step-140] to [Step-160].

The third embodiment can also be modified in various ways. Hereinafter, modification examples of the third embodiment will be described.

Figure 48:
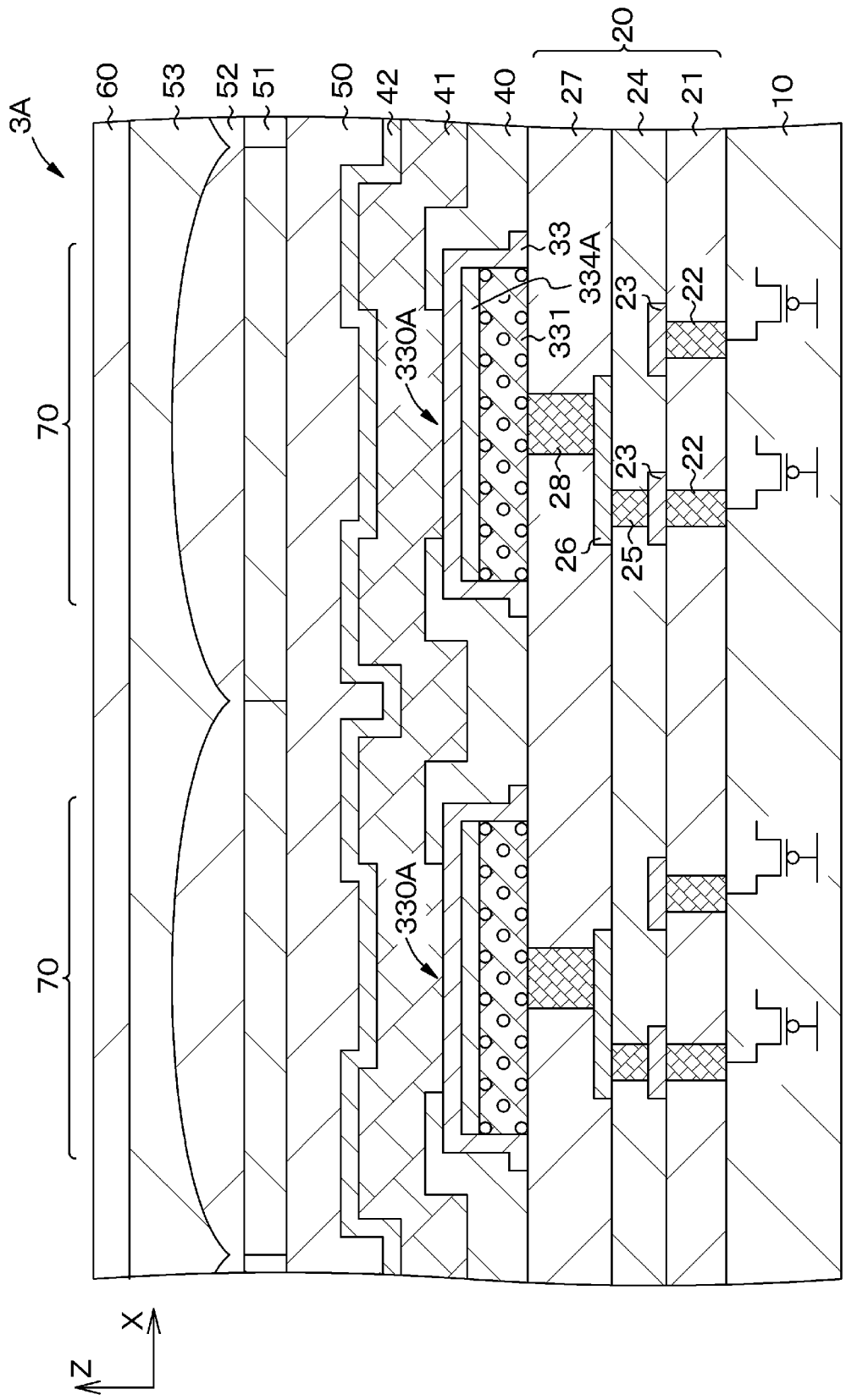
FIG. 48 is a schematic partial cross-sectional view of a portion including pixels in the pixel array section of the display device according to a first modification example.

FIG. 48 is a schematic partial cross-sectional view of a portion including pixels in the pixel array section of the display device according to the first modification.

In the display device 3, the transparent electrodes were formed directly on the light reflecting films. Although it depends on the type of conductive material that constitutes the light reflecting film, the surface of the insulating film is usually excellent in flatness with respect to the surface of the conductive material. In a display device 3A according to the first modification, in the first electrode 330A, the transparent electrode 33 is formed on the insulating film 334A provided on the light reflecting film 331. As a result, the transmittance of the pixel can be further improved.

Hereinafter, a method for manufacturing the display device 3A will be described with reference to the figures.

[Step-300A]

The above-mentioned [Step-100] is performed to form transistors to be used for the pixels 70 on the substrate 10, and then a wiring layer 20 necessary for driving the pixels is formed (see FIG. 5B).

[Step-310A]

Next, the light reflecting films 331 are formed on the insulating layer 27 including the vias 28. First, the metal material layer 331? constituting the light reflecting films 331 is formed on the entire surface of the insulating layer 27 including the vias 28. Here, as the metal material layer 31', for example, an aluminum-based metal material doped with nickel and boron was used to form a layer having a film thickness of 100 nanometers. Subsequently, the insulating material layer 334A' is formed on the entire surface of the metal material layer 331'. Here, a silicon oxide layer having a film thickness of 20 nanometers was formed as the insulating material layer 334A' (FIG. 49A). Then, using a well-known patterning technique such as lithography and etching, the metal material layer 331' and the insulating material layer 334A' are patterned to form the first electrodes 330A at the portions where the pixels should be arranged (see FIG. 46B). In this series of steps, for example, a thermal history of over 200° C. is added. $Al_3Ni$ is produced on the light reflecting films 331.

[Step-320A]

Next, the display device 3A can be obtained by performing the above-mentioned [Step-320] and the above-mentioned [Step-140] to [Step-160].

The first modification example has been described above. Next, the second modification example will be described.

Figure 50:
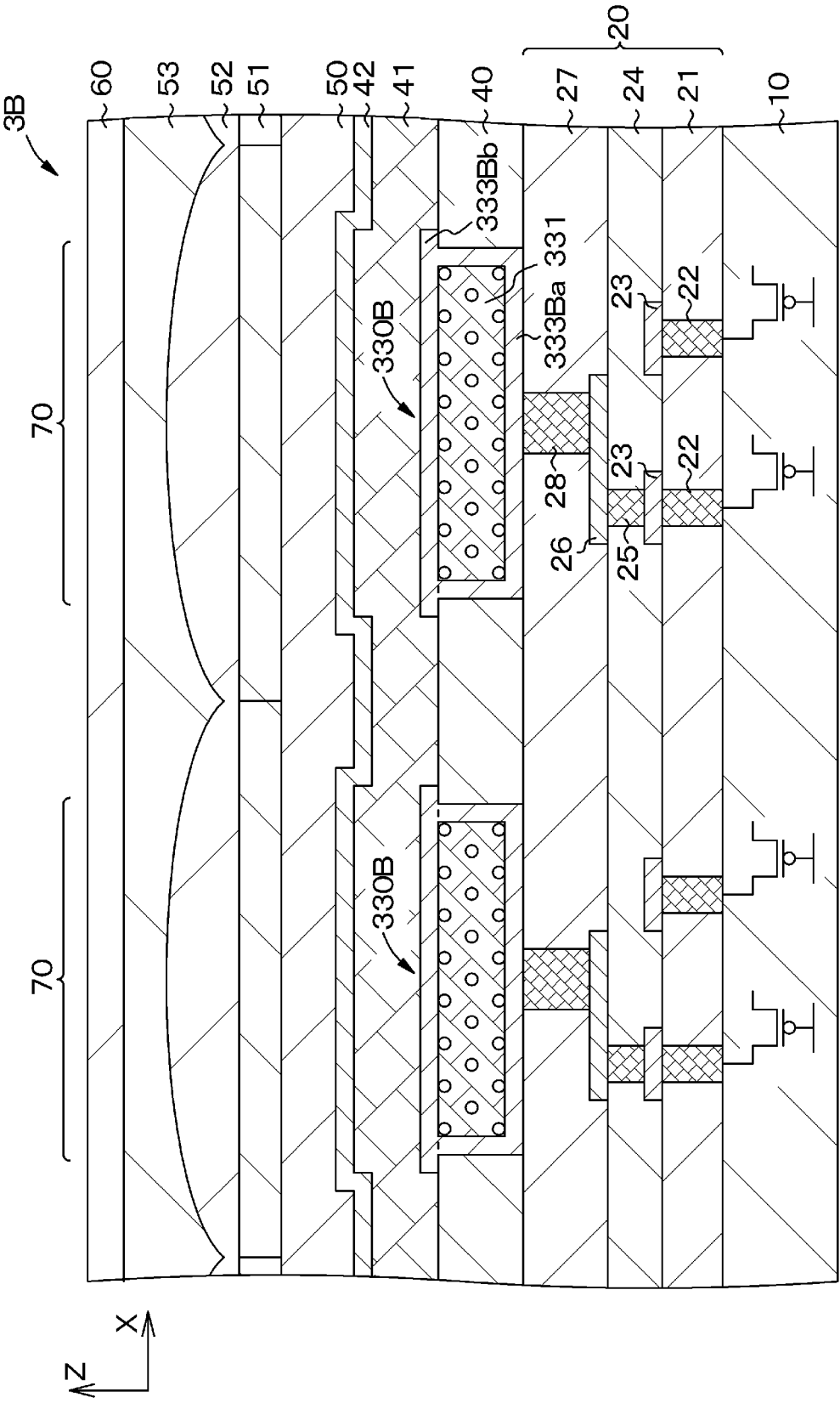
FIG. 50 is a schematic partial cross-sectional view of a portion including pixels in the pixel array section of the display device according to a second modification example.

FIG. 50 is a schematic partial cross-sectional view of a portion including pixels in the pixel array section of the display device according to the second modification example.

In the display device 3, the first electrodes are formed on the flat insulating layer 27. By contrast, in a display device 3B of the second modification example, the first electrodes 330B have a damascene structure selectively embedded in the insulating layer 40 in a predetermined pattern.

Hereinafter, a method for manufacturing the display device 3B will be described with reference to the figures.

[Step-300B]

The above-mentioned [Step-100] is performed to form transistors to be used for the pixels 70, and a wiring layer 20 necessary for driving the pixels on the substrate 10 (see FIG. 5B).

[Step-310B]

Next, the insulating layer 40 is formed on the entire surface of the insulating layer 27 including the vias 28. The thickness of the insulating layer 40 was 120 nanometers. Subsequently, a well-known patterning technique such as lithography and etching is used to form openings OP so that the vias 28 are exposed at the bottom (see FIG. 21).

[Step-320B]

Figure 51:
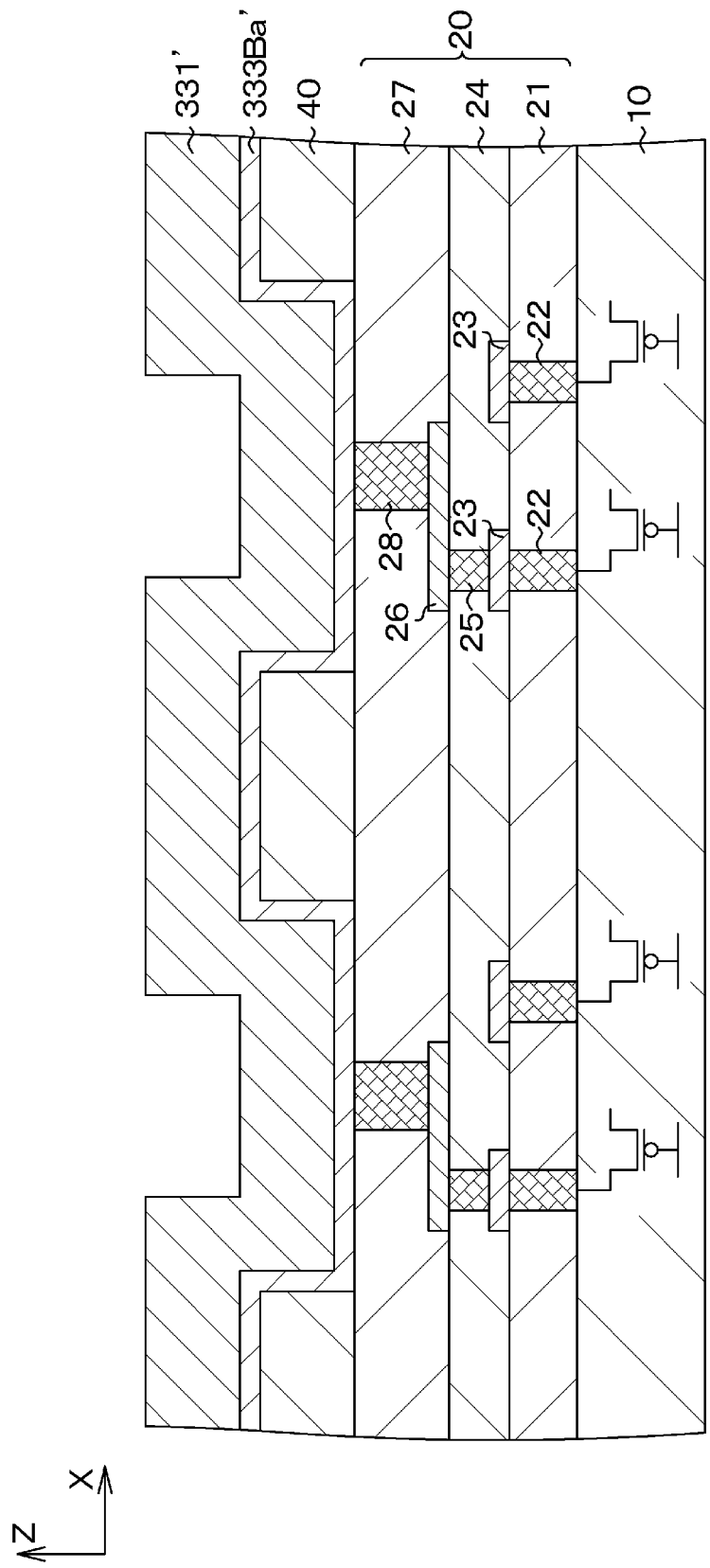
FIG. 51 is a schematic partial end view for explaining a method for manufacturing the display device according to the second modification example of the third embodiment.
Figure 52:
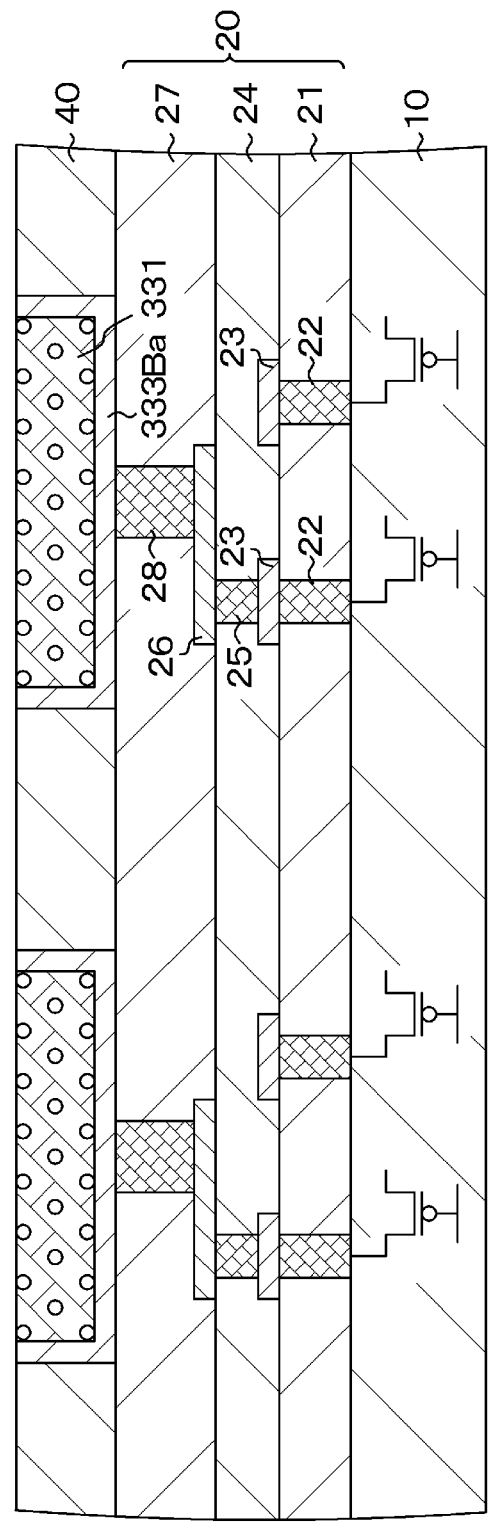
FIG. 52 is a schematic partial end view for explaining a method for manufacturing the display device according to the second modification example of the third embodiment, following FIG. 51.

After that, a transparent conductive material layer 333Ba' composed of, for example, ITO and the metal material layer 331' constituting the light reflecting films 331 are sequentially layered (see FIG. 51). Then, the unnecessary transparent conductive material layer 333Ba' and metal material layer 331' on the insulating layer 40 are removed using, for example, CMP (Chemical Mechanical Polish). Subsequently, an annealing treatment is performed at 300° C. for 10 min to form $Al_3Ni$ on the light reflecting films 331 (see FIG. 52).

[Step-330B]

Figure 53:
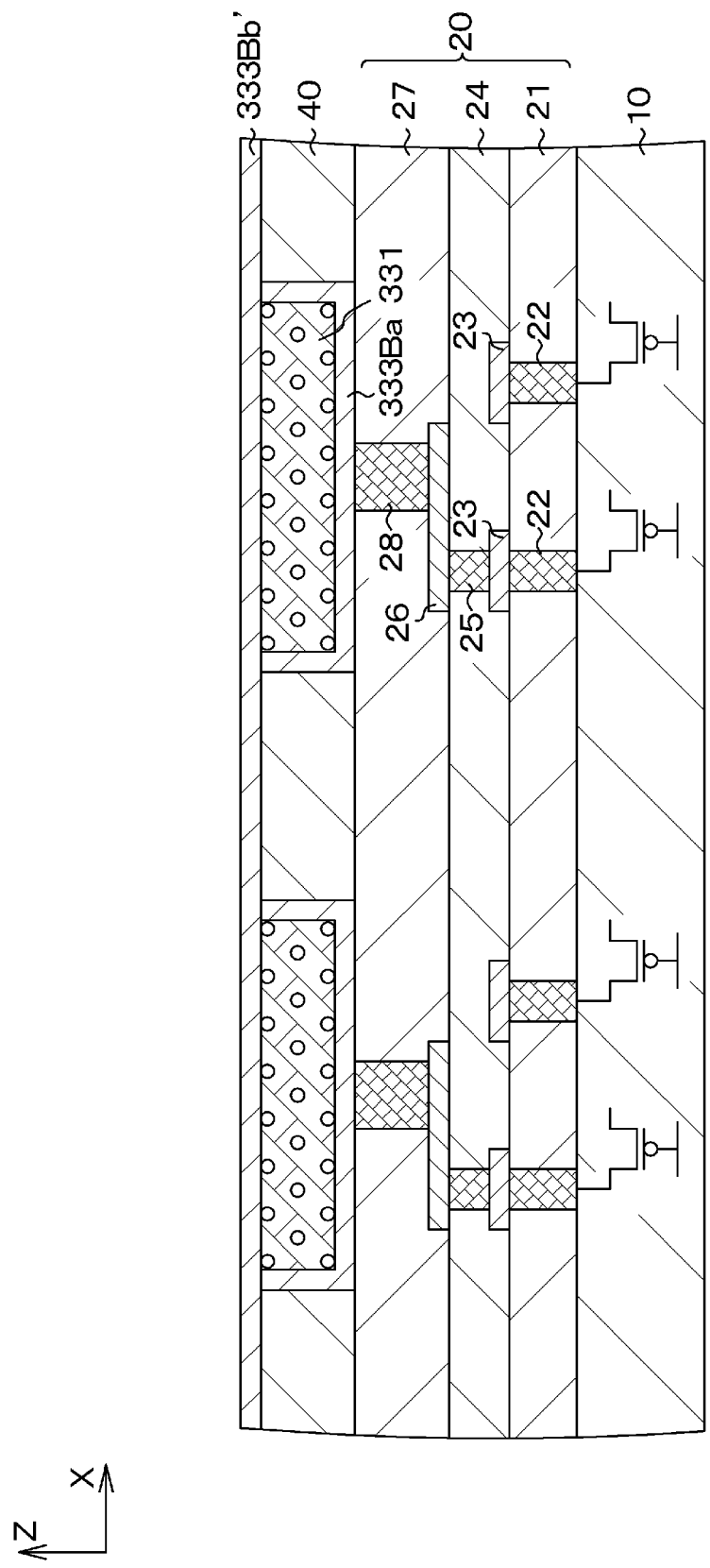
FIG. 53 is a schematic partial end view for explaining a method for manufacturing the display device according to the second modification example of the third embodiment, following FIG. 52.
Figure 54:
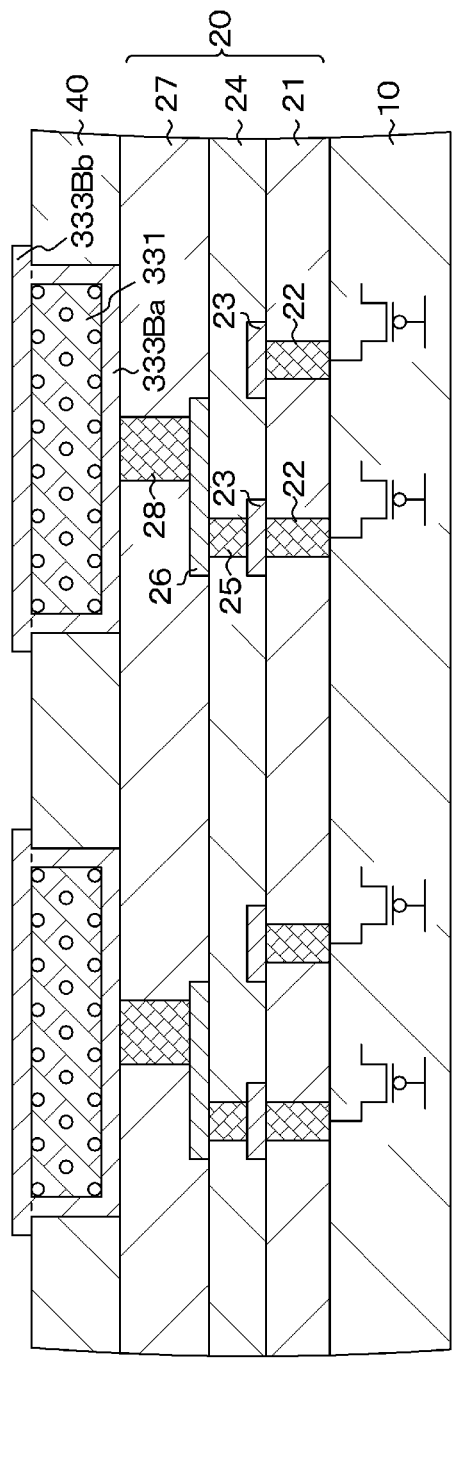
FIG. 54 is a schematic partial end view for explaining a method for manufacturing the display device according to the second modification example of the third embodiment, following FIG. 53.

After that, a transparent conductive material layer 333Bb' made of, for example, ITO is formed on the entire surface (see FIG. 53). Subsequently, a transparent electrode 333Bb provided on the light reflecting film 331 is formed using a well-known patterning technique such as lithography and etching (see FIG. 54).

[Step-340B]

After that, the display device 3B can be obtained by performing the above-mentioned [Step-150] to [Step-160].

The second modification example has been described above. Next, a third modification example will be described.

Figure 55:
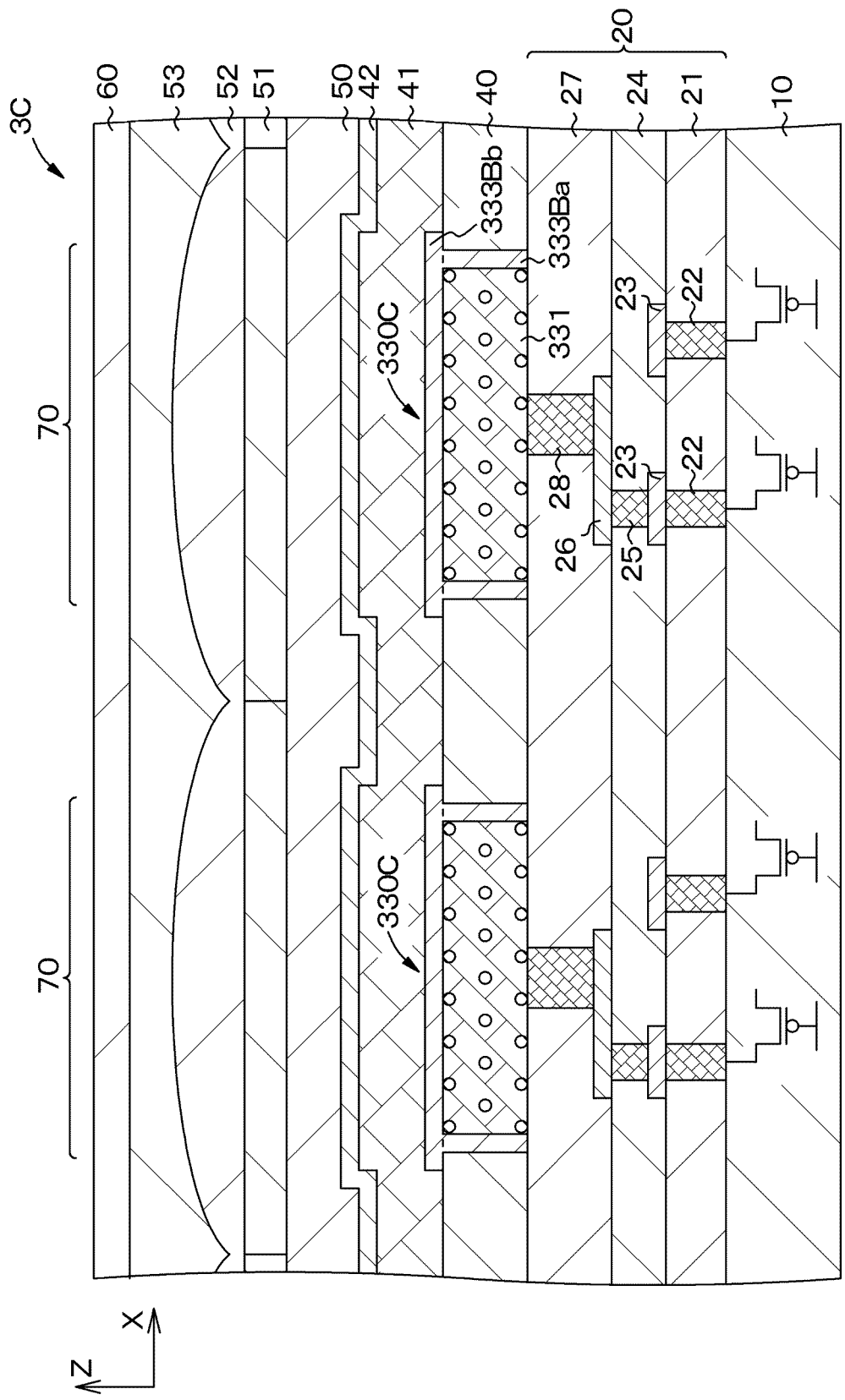
FIG. 55 is a schematic partial cross-sectional view of a portion including pixels in the pixel array section of the display device according to a third modification example.

FIG. 55 is a schematic partial cross-sectional view of a portion including pixels in the pixel array section of the display device according to the third modification example.

In a display device 3B of the second modification example, the transparent electrode 333Ba was also formed on the lower surface of the first electrode 330. The display device 3C of the third modification example is configured such that the transparent conductive film on the lower surface of the first electrode 330 in the display device 3B is omitted. As a manufacturing method, a step of removing the portions of the transparent conductive material layer 333Ba' located under the first electrodes when the transparent conductive material layer 333Ba' is formed in FIG. 51 may be added.

[Explanation of Electronic Device]

The display device of the present disclosure described above can be used as a display unit (display device) of an electronic device in a variety of fields where a video signal inputted to the electronic device or a video signal generated in the electronic device is displayed as an image or a video. As an example, the display device can be used as a display unit such as a television set, a digital still camera, a notebook personal computer, a mobile terminal device such as a mobile phone, a video camera, or a head-mounted display (head mounted type display).

The display device of the present disclosure is also inclusive of a modular device in a sealed configuration. A suitable example is a display module formed by attaching a facing portion such as transparent glass to the pixel array section. The display module may be provided with a circuit unit, a flexible printed circuit unit (FPC), or the like for inputting signals or the like from the outside to the pixel array section and outputting signals. Hereinafter, a digital still camera and a head-mounted display will be illustrated as specific examples of the electronic device using the display device of the present disclosure. However, the specific examples illustrated here are only exemplary and are not limiting.

Specific Example 1

FIG. 56 is an external view of an interchangeable lens type single-lens reflex type digital still camera, the front view of which is shown in FIG. 56A, and the rear view of which is shown in FIG. 56B. An interchangeable lens single-lens reflex type digital still camera has, for example, an interchangeable imaging lens unit (interchangeable lens) 412 on the front right side of a camera main body (camera body) 411, and a grip portion 413 to be held by a photographer is provided for on the front left side.

A monitor 414 is provided at substantially the center of the back surface of the camera body 411. A viewfinder (eyepiece window) 415 is provided above the monitor 414. By looking into the viewfinder 415, the photographer can visually recognize the light image of the subject guided by the imaging lens unit 412 and determine the composition.

In the interchangeable lens single-lens reflex type digital still camera having the above configuration, the display device of the present disclosure can be used as the viewfinder 415 thereof. That is, the interchangeable lens type single-lens reflex type digital still camera according to this example is fabricated by using the display device of the present disclosure as the viewfinder 415 thereof.

Specific Example 2

Figure 57:
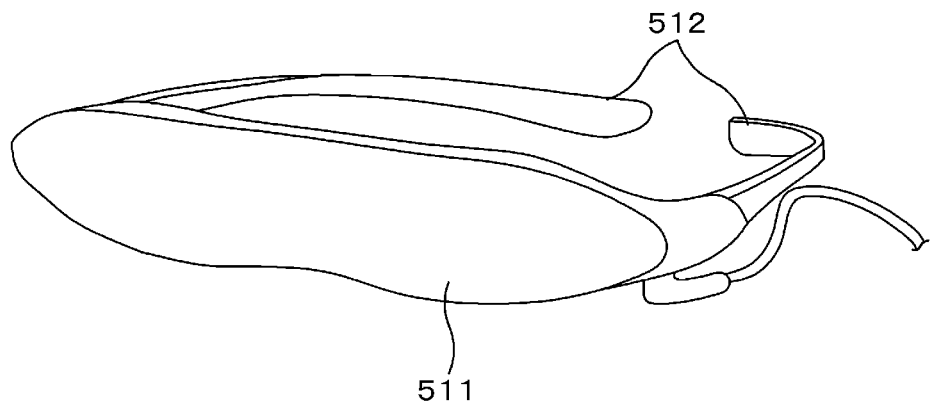
FIG. 57 is an external view of a head-mounted display.

FIG. 57 is an external view of a head-mounted display. The head-mounted display has, for example, ear hook portions 512 for being worn on the user's head on both sides of an eyeglass-shaped display unit 511. In this head-mounted display, the display device of the present disclosure can be used as the display unit 511 thereof. That is, the head-mounted display according to this example is fabricated by using the display device of the present disclosure as the display unit 511 thereof.

Specific Example 3

Figure 58:
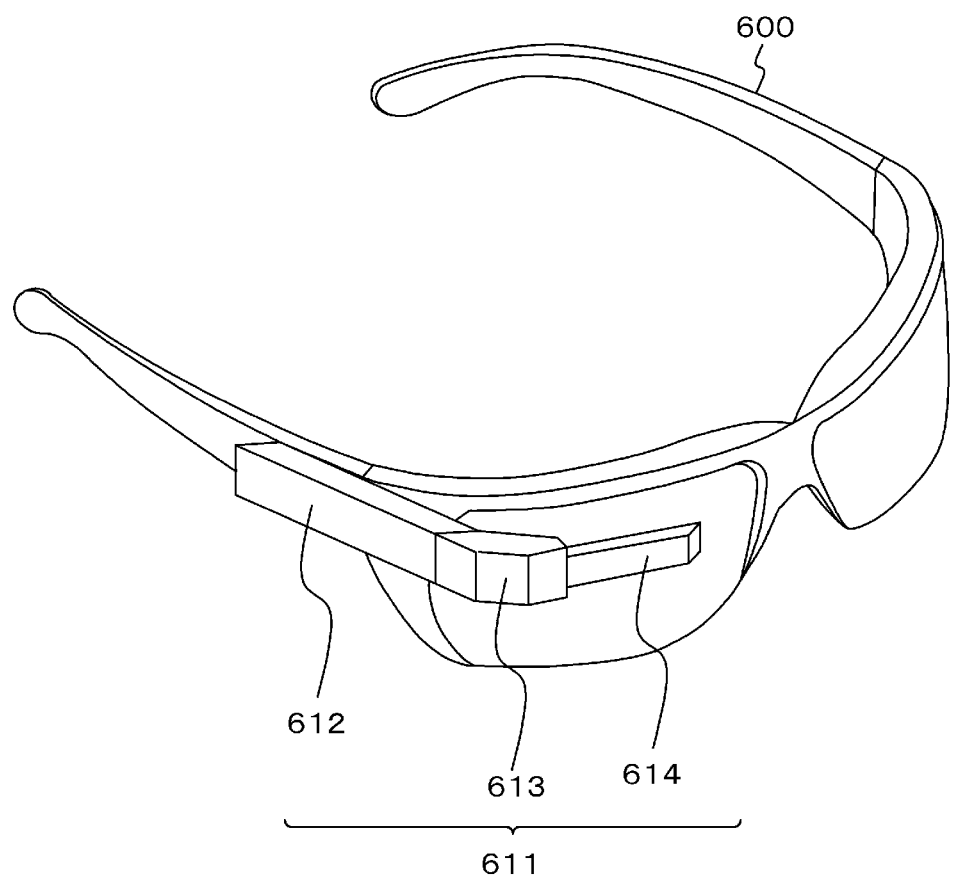
FIG. 58 is an external view of a see-through head-mounted display.

FIG. 58 is an external view of a see-through head-mounted display. The see-through head-mounted display 611 is configured of a main body 612, an arm 613, and a lens barrel 614.

The main body 612 is connected to the arm 613 and eyeglasses 600. Specifically, the end portion of the main body 612 in the long side direction is joined to the arm 613, and one side of the side surface of the main body 612 is connected to the eyeglasses 600 by a connecting member. The main body 612 may be directly attached to the head of a human body.

The main body 612 incorporates a control board for controlling the operation of the see-through head-mounted display 611, and a display unit. The arm 613 connects the main body 612 and the lens barrel 614, and supports the lens barrel 614. Specifically, the arm 613 is joined to the end portion of the main body 612 and the end portion of the lens barrel 614 to fix the lens barrel 614. Further, the arm 613 has a built-in signal line for communicating data related to the image provided from the main body 612 to the lens barrel 614.

The lens barrel 614 projects the image light provided from the main body 612 via the arm 613 toward the eyes of the user wearing the see-through head-mounted display 611 through the eyepiece. In this see-through head-mounted display 611, the display device of the present disclosure can be used for the display unit of the main body 612.

[Others]

The technique of the present disclosure can also have the following features.

[A1]

A display device in which
pixels each configured by layering a first electrode, an organic layer, and a second electrode are formed in a two-dimensional matrix arrangement on a substrate;
the first electrode is arranged for each pixel and includes a conductive light reflecting film formed on an insulating layer provided on the substrate, and a transparent electrode formed on the light reflecting film;
vias conductive with the light reflecting films are formed in portions of the insulating layer positioned under the light reflecting films; and
a voltage is applied to the first electrodes through the vias.

[A2]

The display device as described in [A1], wherein
a conductive portion conductive with the transparent electrode is provided on the side wall surface side of the light reflecting film.

[A3]

The display device as described in [A2], wherein
the conductive portion is provided so as to cover at least a part of the side wall surface of the light reflecting film.

[A4]

The display device as described in [A2], wherein
the conductive portion is composed of a conductive material layer provided between the light reflecting film and the insulating layer.

[A5]

The display device as described in [A2], wherein
the transparent electrode is formed on the insulating film provided on the light reflecting film.

[A6]

The display device as described in [A1], wherein
a conductive portion conductive with the transparent electrode is provided on the upper surface of the light reflecting film located on the transparent electrode side.

[A7]

The display device as described in [A6], wherein
a partition wall portion is formed between the adjacent first electrodes, and a part of the upper surface of the transparent electrode constituting the first electrode is covered with the partition wall portion; and
the conductive portion is arranged to overlap a region where the transparent electrode is covered by the partition wall portion.

[A8]

The display device as described in [A7], wherein
a peripheral portion of the upper surface of the transparent electrode is annularly covered by the partition wall portion, and the conductive portion is arranged so as to surround the peripheral portion of the upper surface of the transparent electrode.

[A9]

The display device as described in any one of [A1] to [A8], wherein
the conductive portion is composed of a conductive material different from the material constituting the light reflecting film.

[A10]

The display device as described in [A9], wherein
the conductive portion is composed of titanium, titanium nitride, or tungsten.

[A11]

The display device as described in any one of [A1] to [A10], wherein
the light reflecting film is composed of an aluminum-based metal material doped with at least nickel.

[A12]

The display device as described in [A11], wherein
the light reflecting film is composed of an aluminum-based metal material doped with nickel and boron.

[A13]

The display device as described in [A11] or [A12], wherein
the light reflecting film has been subjected to annealing treatment.

[A14]

The display device as described in any one of [A11] to [A13], wherein
the transparent electrode is formed on the insulating film provided on the light reflecting film.

[A15]

The display device as described in any one of [A1] to [A14], wherein
the first electrodes have a damascene structure selectively embedded in the insulating layer in a predetermined pattern.

[B1]

An electronic device comprising a display device in which
pixels each configured by layering a first electrode, an organic layer, and a second electrode are formed in a two-dimensional matrix arrangement on a substrate;
the first electrode is arranged for each pixel and includes a conductive light reflecting film formed on an insulating layer provided on the substrate, and a transparent electrode formed on the light reflecting film;
vias conductive with the light reflecting films are formed in portions of the insulating layer positioned under the light reflecting films; and
a voltage is applied to the first electrodes through the vias.

[B2]

The electronic device as described in [B1], wherein
a conductive portion conductive with the transparent electrode is provided on the side wall surface side of the light reflecting film.

[B3]

The electronic device as described in [B2], wherein
the conductive portion is provided so as to cover at least a part of the side wall surface of the light reflecting film.

[B4]

The electronic device as described in [B2], wherein
the conductive portion is composed of a conductive material layer provided between the light reflecting film and the insulating layer.

[B5]

The electronic device as described in [B2], wherein
the transparent electrode is formed on the insulating film provided on the light reflecting film.

[B6]

The electronic device as described in [B1], wherein
a conductive portion conductive with the transparent electrode is provided on the upper surface of the light reflecting film located on the transparent electrode side.

[B7]
The electronic device as described in [B6], wherein
a partition wall portion is formed between the adjacent first electrodes, and a part of the upper surface of the transparent electrode constituting the first electrode is covered with the partition wall portion; and
the conductive portion is arranged to overlap a region where the transparent electrode is covered by the partition wall portion.

[B8]
The electronic device as described in [B7], wherein
a peripheral portion of the upper surface of the transparent electrode is annularly covered by the partition wall portion, and the conductive portion is arranged so as to surround the peripheral portion of the upper surface of the transparent electrode.

[B9]
The electronic device as described in any one of [B1] to [B8], wherein
the conductive portion is composed of a conductive material different from the material constituting the light reflecting film.

[B10]
The electronic device as described in [B9], wherein
the conductive portion is composed of titanium, titanium nitride, or tungsten.

[B11]
The electronic device as described in any one of [B1] to [B10], wherein
the light reflecting film is composed of an aluminum-based metal material doped with at least nickel.

[B12]
The electronic device as described in [B11], wherein
the light reflecting film is composed of an aluminum-based metal material doped with nickel and boron.

[B13]
The electronic device as described in [B11] or [B12], wherein
the light reflecting film has been subjected to annealing treatment.

[B14]
The electronic device as described in any one of [B11] to [B13], wherein
the transparent electrode is formed on the insulating film provided on the light reflecting film.

[B15]
The electronic device as described in any one of [B1] to [B14], wherein
the first electrodes have a damascene structure selectively embedded in the insulating layer in a predetermined pattern.

[C1]
A method for manufacturing a display device in which
pixels each configured by layering a first electrode, an organic layer, and a second electrode are formed in a two-dimensional matrix arrangement on a substrate;
the first electrode is arranged for each pixel and includes a conductive light reflecting film formed on an insulating layer provided on the substrate, and a transparent electrode formed on the light reflecting film,
the method comprising:
a step of forming vias in portions of the insulating layer where the pixels are to be arranged;
a step of forming the conductive light reflecting films on the insulating layer including the vias; and
a step of forming the transparent electrodes on the light reflecting films.

[C2]
The method for manufacturing a display device as described in [C1], further including
a step of providing conductive portions that are conductive with the transparent electrodes on the side wall surface side of the light reflecting films.

[C3]
The method for manufacturing a display device as described in [C2], wherein
the conductive portion is provided so as to cover at least a part of the side wall surface of the light reflecting film.

[C4]
The method for manufacturing a display device as described in [C2], wherein
the conductive portion is composed of a conductive material layer provided between the light reflecting film and the insulating layer.

[C5]
The method for manufacturing a display device as described in [C2], wherein
the transparent electrode is formed on the insulating film provided on the light reflecting film.

[C6]
The method for manufacturing a display device as described in [C1], further including
a step of providing a conductive portion that is conductive with the transparent electrode on the surface of the light reflecting film located on the transparent electrode side.

[C7]
The method for manufacturing a display device as described in [C6], wherein
a partition wall portion is formed between the adjacent first electrodes, and a part of the upper surface of the transparent electrode constituting the first electrode is covered with the partition wall portion; and
the conductive portion is arranged to overlap a region where the transparent electrode is covered by the partition wall portion.

[C8]
The method for manufacturing a display device as described in [C7], wherein
a peripheral portion of the upper surface of the transparent electrode is annularly covered by the partition wall portion, and the conductive portion is arranged so as to surround the peripheral portion of the upper surface of the transparent electrode.

[C9]
The method for manufacturing a display device as described in any one of [C1] to [C8], wherein
the conductive portion is composed of a conductive material different from the material constituting the light reflecting film.

[C10]
The method for manufacturing a display device as described in [C9], wherein
the conductive portion is composed of titanium, titanium nitride, or tungsten.

[C11]
The method for manufacturing a display device as described in any one of [C1] to [C10], wherein
the light reflecting film is composed of an aluminum-based metal material doped with at least nickel.

[C12]
The method for manufacturing a display device as described in [C11], wherein
the light reflecting film is composed of an aluminum-based metal material doped with nickel and boron.

[C13]

The method for manufacturing a display device as described in [C11] or [C12], wherein the light reflecting film has been subjected to annealing treatment.

REFERENCE SIGNS LIST 1, 1A, 1B, 1C, 1D, 1E, 1F, 2, 2A, 3, 3A, 3B Display device
10 Substrate
20 Wiring layer
21 Insulating layer
22 Via
23 Wiring and electrode
24 Insulating layer
25 Via
26 Wiring and electrode
27 Insulating layer
28 Via
30, 30A, 30B, 30C, 30D, 30E, 30F, 230, 230A, 330, 330A, 330B First electrode (anode electrode)
31 Light reflecting film
32, 32A, 32C, 32D, 32E, 32F, 232, 232A Conductive portion
33, 33Da, 33Db, 33Ea, 33Eb, 33F, 333Ba, 333Bb Transparent electrode
34, 334A Insulating film
40 Partition wall portion (insulating layer)
41 Organic layer
42 Second electrode (cathode electrode)
50 Protective film
51 Color filter
52 Lens
53 Sealing resin
60 Opposing substrate
110 Source driver
120 Vertical scanner
130 Power supply unit
WS Scanning line
DTL Data line
PS1 Power supply line
$TR_W$ Write transistor
$TR_D$ Drive transistor
$C_S$ Capacitance unit
ELP Organic electroluminescence light emitting unit
$C_{EL}$ Capacitance of light emitting unit ELP
411 Camera body
412 Imaging lens unit
413 Grip part
414 Monitor
415 Viewfinder
511 Eyeglass-type display
512 Ear hook part
600 Eyeglasses
611 See-through head mount display
612 Main body
613 Arm
614 Lens barrel

The invention claimed is:

1. A display device comprising:
pixels formed in a two-dimensional matrix arrangement on a substrate, each pixel configured by layering a first electrode, an organic layer and a second electrode along a first direction in a cross-sectional view, the first electrode including a conductive light reflecting film directly formed on an insulating layer provided on the substrate and a transparent electrode directly formed on the conductive light reflecting film, the transparent electrode including a first surface extending along the first direction, and a second surface extending along a side wall surface side of the conductive light reflecting film, with a conductive portion arranged between the second surface of the transparent electrode and the side wall surface side of the conductive light reflecting film, and the conductive portion being composed of a conductive material different from a material constituting the transparent electrode; and
vias respectively corresponding to the pixels, each via being formed in a portion of the insulating layer positioned under the conductive light reflecting film such that the conductive light reflecting film is located between the via and the transparent electrode along the first direction in the cross-sectional view, and each via including electrically conductive material and being electrically connected to the conductive light reflective film and to a wiring configured for connection to a voltage.

2. The display device according to claim 1, wherein the conductive portion is provided so as to cover at least a part of the side wall surface of the conductive light reflecting film.

3. The display device according to claim 1, wherein the conductive material of the conductive portion is different from a material constituting the conductive light reflecting film.

4. The display device according to claim 3, wherein the conductive portion is composed of titanium, titanium nitride, or tungsten.

5. An electronic device comprising:
a display device including:
pixels formed in a two-dimensional matrix arrangement on a substrate, each pixel configured by layering a first electrode, an organic layer and a second electrode along a first direction in a cross-sectional view, the first electrode including a conductive light reflecting film directly formed on an insulating layer provided on the substrate and a transparent electrode directly formed on the conductive light reflecting film, the transparent electrode including a first surface extending along the first direction, and a second surface extending along a side wall surface side of the conductive light reflecting film, with a conductive portion arranged between the second surface of the transparent electrode and the side wall surface side of the conductive light reflecting film, and the conductive portion being composed of a conductive material different from a material constituting the transparent electrode; and
vias respectively corresponding to the pixels, each via being formed in a portion of the insulating layer positioned under the conductive light reflecting film such that the conductive light reflecting film is located between the via and the transparent electrode along the first direction in the cross-sectional view, and each via including electrically conductive material and being electrically connected to the conductive light reflective film and to a wiring configured for connection to a voltage.

6. The electronic device according to claim 5, wherein the conductive portion is provided so as to cover at least a part of the side wall surface of the conductive light reflecting film.

7. The electronic device according to claim 5, wherein the conductive material of the conductive portion is different from a material constituting the conductive light reflecting film.

8. The electronic device according to claim 7, wherein the conductive portion is composed of titanium, titanium nitride, or tungsten.

* * * * *